United States Patent [19]

Ihara

[11] Patent Number: 5,689,468

[45] Date of Patent: Nov. 18, 1997

[54] SEMICONDUCTOR MEMORY DEVICE AND METHOD FOR DRIVING THE SAME

[75] Inventor: Makoto Ihara, Nara, Japan

[73] Assignee: Sharp Kabushiki Kaisha

[21] Appl. No.: 571,544

[22] Filed: Dec. 13, 1995

[30] Foreign Application Priority Data

Dec. 21, 1994 [JP] Japan ................................. 6-318717
Oct. 26, 1995 [JP] Japan ................................. 7-279485

[51] Int. Cl.$^6$ .................................................. G11C 7/00
[52] U.S. Cl. ........................................ 365/203; 365/149
[58] Field of Search .......................... 365/203, 203.03, 365/149

[56] References Cited

U.S. PATENT DOCUMENTS

| | | | |
|---|---|---|---|
| 4,873,664 | 10/1989 | Eaton, Jr. ........................... | 365/145 |
| 5,202,854 | 4/1993 | Koike ................................. | 365/203 |
| 5,444,662 | 8/1995 | Tanaka et al. ..................... | 365/203 |
| 5,455,786 | 10/1995 | Takeuchi et al. .................. | 365/145 |

FOREIGN PATENT DOCUMENTS

| | | |
|---|---|---|
| 5-75072 | 3/1994 | Japan . |
| 6-243690 | 9/1994 | Japan . |

*Primary Examiner*—David C. Nelms
*Assistant Examiner*—Hien Nguyen
*Attorney, Agent, or Firm*—Morrison & Forester

[57] ABSTRACT

A semiconductor memory device includes at least one memory block comprising: a plurality of word lines; a plurality of bit lines; and a plurality of memory cells each including a first switching element and a capacitor which is connected to the bit line via the first switching element, a node comprising a capacitance member having a predetermined capacitance, a second switching element for connecting the bit line to the node, a bit line precharge circuit, a capacitance member precharge circuit, and a control circuit for controlling the first switching element so as to connect electrically the memory cell which is coupled to the selected word line of a read operation to the corresponding bit line, and for controlling the second switching element so as to connect electrically the selected bit line of the read operation to the node comprising the precharged capacitance member, whereby changing the electric potential of the selected bit line so as to apply a predetermined voltage signal to the capacitor of the selected memory cell, whereby reading a data stored in the capacitor of the selected memory cell onto the selected bit line and the node.

21 Claims, 41 Drawing Sheets

"1" read

FIG.10     "0" read
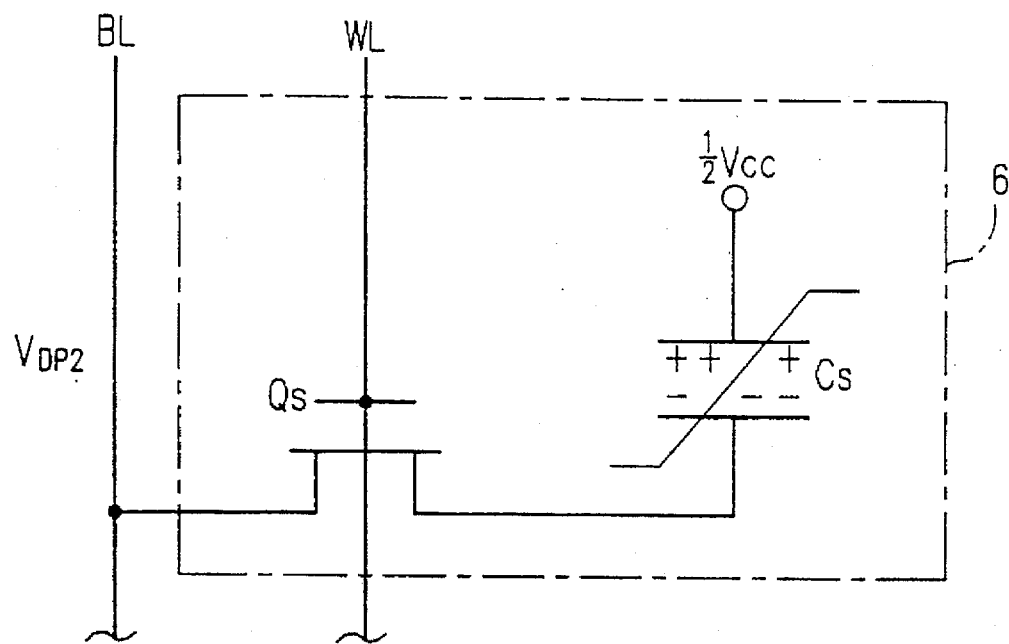
FIG.11
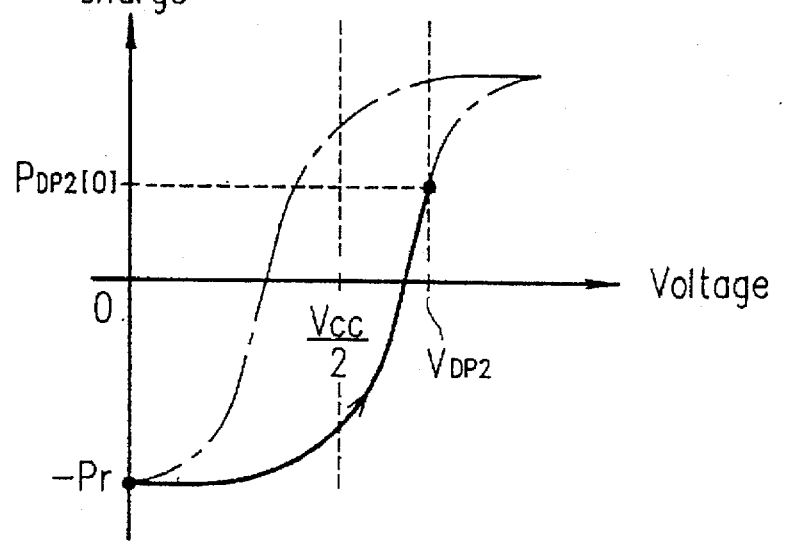

FIG.12     "1" store
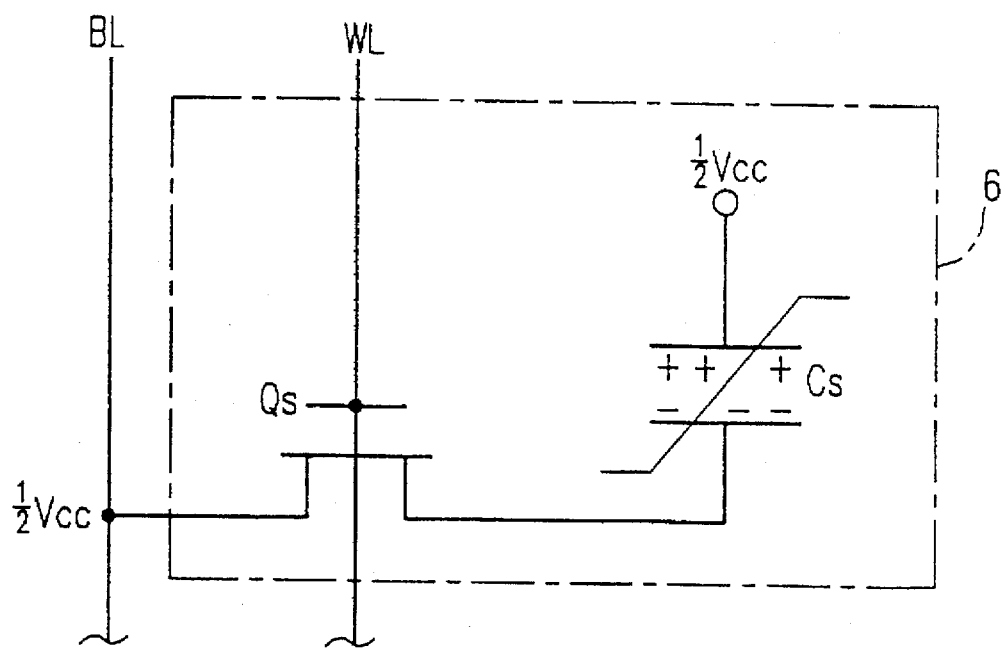
FIG.13     "1" store
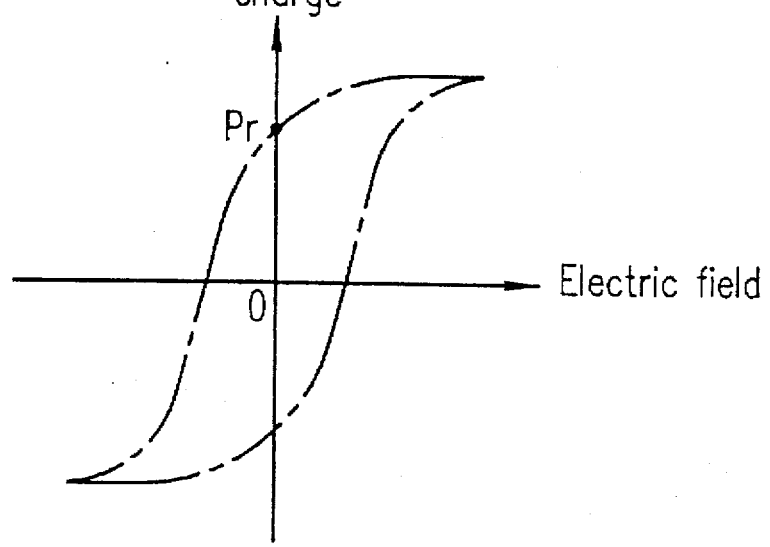

FIG.35 "1" write (PRIOR ART)
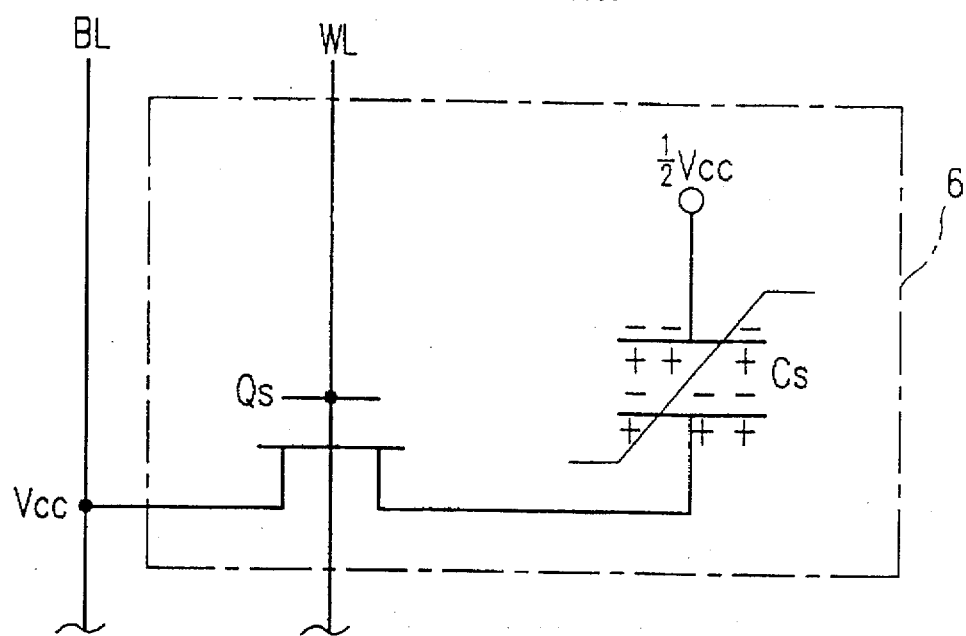
FIG.36 "1" write (PRIOR ART)
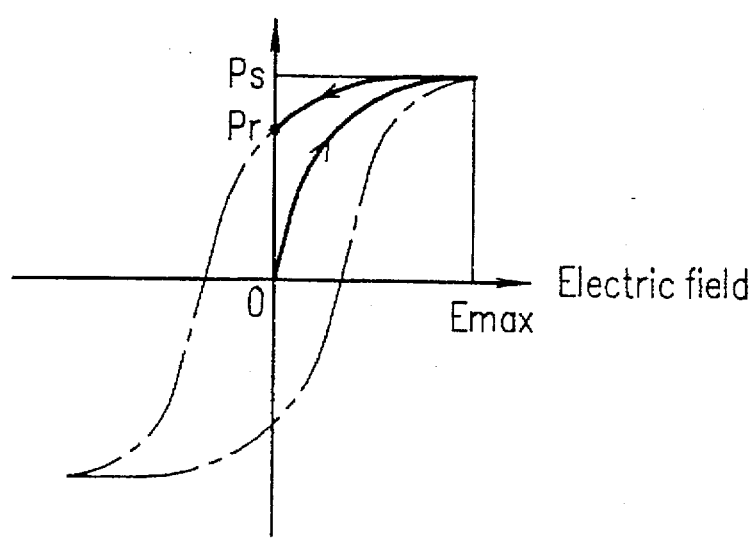

FIG. 37 (PRIOR ART) "0" write
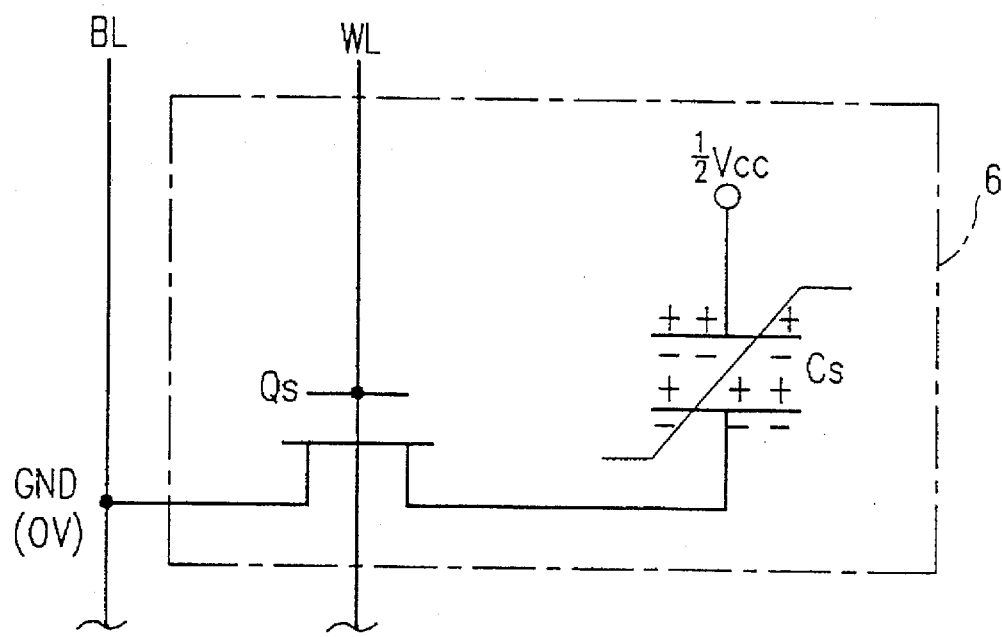

FIG.38  "0" write  (PRIOR ART)
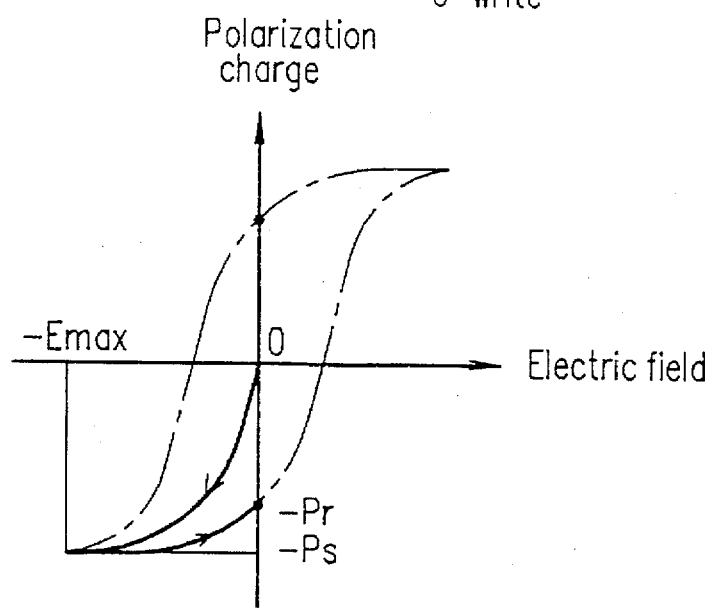
FIG.39  "1" read  (PRIOR ART)
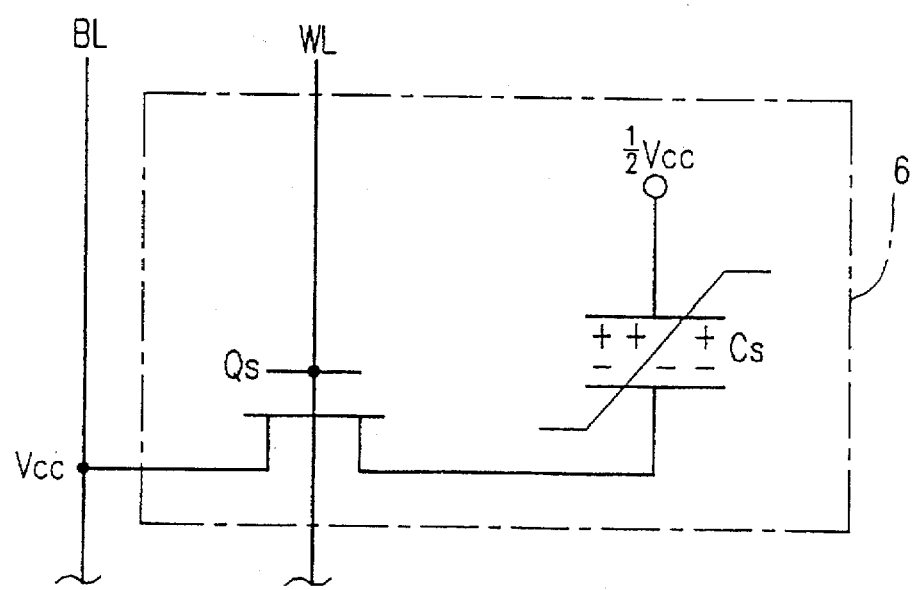

FIG. 40  "1" read  (PRIOR ART)
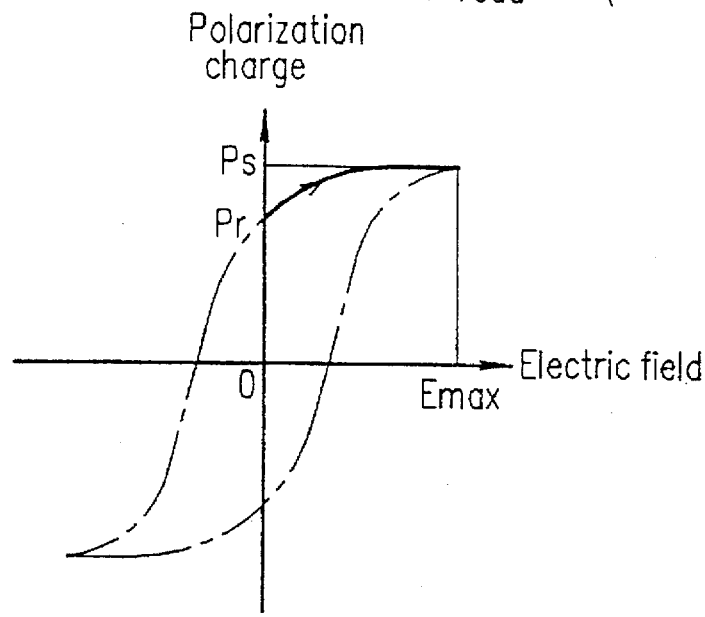
FIG. 41  "0" read  (PRIOR ART)
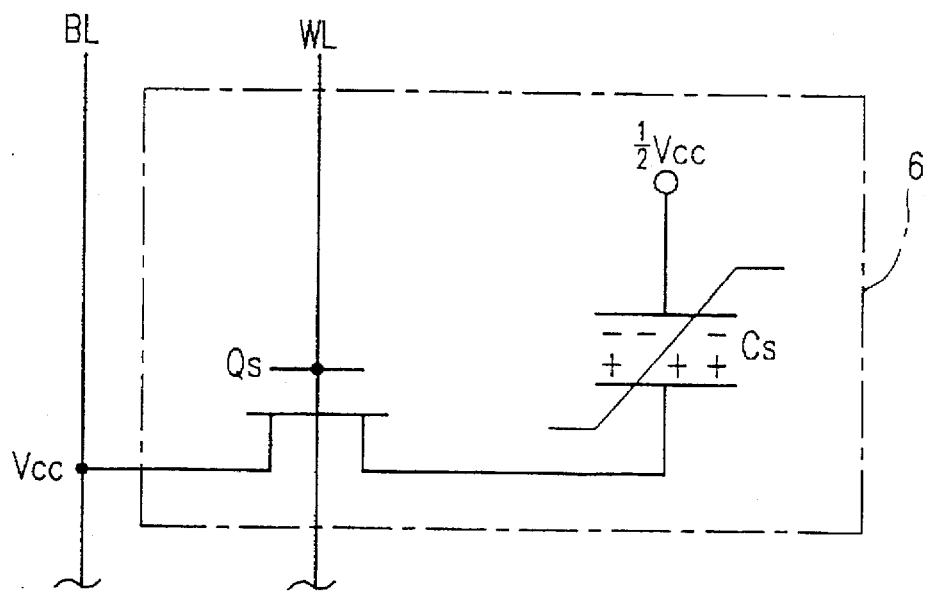

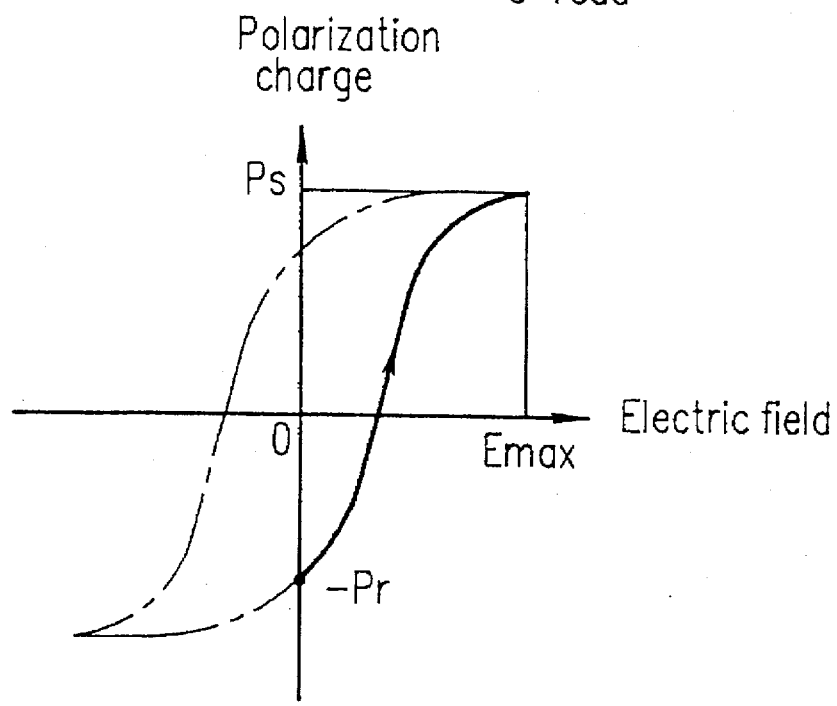
FIG.42 "0" read (PRIOR ART)

SEMICONDUCTOR MEMORY DEVICE AND METHOD FOR DRIVING THE SAME

BACKGROUND OF THE INVENTION

1. Field of the Invention

The present invention relates to a nonvolatile semiconductor memory device and a method for driving the nonvolatile semiconductor memory device, and more particularly, to a nonvolatile semiconductor memory device in which a memory cell for storing information has a capacitor insulating film of a ferroelectric material, and a method for driving the nonvolatile semiconductor memory device.

2. Description of the Related Art

Ferroelectric material such as PZT ($PbZrTiO_3$) exhibits hysteresis characteristics, i.e., polarization caused by an external electric field is maintained as remanent polarization after the electric field is removed. Nonvolatile semiconductor memory devices have been available in which the hysteresis characteristics of ferroelectric material is utilized in order to store the information in a nonvolatile manner. The ferroelectric material is used as an insulating film of a capacitor in each memory sell so as to store the information by the remanent polarization of the ferroelectric insulating film.

In such a nonvolatile semiconductor memory device, a memory cell for storing one bit of information usually includes two capacitors with ferroelectric films and two switching elements (transistors). In order to reduce the chip area and to increase the density of integrated circuits, a nonvolatile semiconductor memory device using a memory cell having one capacitor and one transistor (1C-1Tr memory cell) has been proposed (Japanese Laid-Open Patent Publication No. 5-75072).

A conventional nonvolatile semiconductor memory device in which a memory cell for storing one bit of data has one capacitor will be described. FIG. 32 shows a part of the circuitry of a conventional nonvolatile semiconductor memory device 500 using the 1C-1Tr memory cell.

As shown in FIG. 31, in the nonvolatile semi-conductor memory device 500, a number of bit lines extending along a column direction are arranged in parallel. A number of word lines $WL_0$–$WL_n$ extend perpendicular to the bit lines (i.e., along the row direction) and are arranged in parallel. In a read operation, one of the word lines $WL_0$–$WL_n$ is selected in accordance with a row address, so that a logic level thereof goes high.

In addition, two dummy word lines $DWL_0$ and $DWL_1$ are disposed in parallel with respect to the word lines $WL_0$–$WL_n$. The dummy word line $DWL_0$ goes high when one of the even-numbered word lines $WL_0$, $WL_2$, . . . is selected. The dummy word line $DWL_1$ goes high when one of the remaining word lines (odd-numbered word lines) $WL_1$, $WL_3$, . . . is selected.

Adjacent bit lines $BL_i$, and $BL_i$ bar are referred to herein as a bit-line pair (FIG. 31 shows the bit-line pairs of i=1 to 4). To each bit-line pair $BL_i$ and $BL_i$ bar, a sense amplifier 13, a bit-line equalizing circuit 11, a number of memory cells 6, and four dummy cells 7–10 are connected.

For each bit-line pair, respective memory cells 6 are disposed at crossings of one bit line $BL_i$, and the even-numbered word lines $WL_0$, $WL_2$, . . . , and at crossings of the other bit line $BL_i$ bar and the odd-numbered word lines $WL_1$, $WL_3$, . . . Two dummy cells 7 and 8 are disposed correspondingly to the bit line $BL_i$ and the dummy word line $DWL_1$, and two dummy cells 9 and 10 are disposed correspondingly to the bit line $BL_i$ bar and the dummy word line $DWL_0$.

Next, the detailed circuitry of the nonvolatile semiconductor memory device 500 is described. FIG. 32 shows the circuitry of the sense amplifier 13 and the bit-line equalizing circuit 11.

As shown in FIG. 32, the sense amplifier 13 differentially amplifies a small potential difference between bit lines $BL_i$ and $BL_i$ bar by using four transistors $Q_{31}$–$Q_{34}$, so as to make the signal level valid. Among the four transistors, $Q_{31}$ and $Q_{32}$ are N-channel MOSFETs (Metal Oxide Semiconductor Field Effect Transistors), and $Q_{33}$ and $Q_{34}$ are P-channel MOSFETs. The transistors $Q_{31}$ and $Q_{34}$ are connected to a ground GND via an N-channel MOSFET $Q_{35}$ of which the gate is connected to a sense-amplifier driving signal line S. The transistors $Q_{33}$ and $Q_{34}$ are connected to a $V_{cc}$ power supply via a P-channel MOSFET $Q_{36}$ of which the gate is connected to a sense-amplifier driving signal line S bar.

The sense amplifier 13 performs its differential amplification only when the sense-amplifier driving signal lines S and S bar go high ($V_{cc}$ level) and low (GND level), respectively. As described later, in a read operation, after a small potential difference is read out from a memory cell 6 and the dummy cells 7–10 to the bit lines $BL_i$ and $BL_i$ bar, the sense-amplifier driving signal lines S and S bar go high and low, respectively, by the operation of a control circuit (not shown).

The bit-line equalizing circuit 11 includes three P-channel MOSFETs $Q_{111}$–$Q_{113}$, as shown in FIG. 32. The source of the transistor $Q_{111}$ is connected to the $V_{cc}$ power supply, and the drain thereof is connected to the bit line $BL_i$. The source of the transistor $Q_{112}$ is connected to the $V_{cc}$ power supply, and the drain thereof is connected to the bit line $BL_i$ bar. The drain of the transistor $Q_{113}$ is connected to the bit line $BL_i$, and the source thereof is connected to the other bit line $BL_i$ bar. The respective gates of the transistors $Q_{111}$–$Q_{113}$ are connected to a bit-line equalizing signal line BEQ bar. The bit-line equalizing circuit 11 precharges the bit lines $BL_i$ and $BL_i$ bar to the supply voltage $V_{cc}$ by the transistors $Q_{111}$ and $Q_{112}$, and equalizes the potentials of the bit lines $BL_i$ and $BL_i$ bar by the transistor $Q_{113}$, when the bit-line equalizing signal line BEQ bar goes low (in the ON or active state). Then, the bit-line equalizing signal line BEQ bar goes temporarily low immediately before the read operation by the operation of the control circuit (not shown).

As shown in FIG. 33, each memory cell 6 includes a capacitor $C_s$ having a ferroelectric film between the electrodes and also including an N-channel MOSFET $Q_s$. of the electrodes of the capacitor $C_s$ is connected to the bit line $BL_i$ or $BL_i$ bar via the source-drain of the transistor $Q_s$. The other electrode of the capacitor $C_s$ is connected to a common cell plate to which one half of the supply voltage $V_{cc}$ is supplied. The gate of the transistor $Q_s$ is connected to the corresponding one of the word lines $WL_0$–$WL_n$.

As shown in FIG. 34, each of the dummy cells 7–10 includes a dummy capacitor $C_D$ having a ferroelectric film between the electrodes and also including an N-channel MOSFET $Q_D$, similar to the memory cell 6. The dummy capacitor $C_D$ is formed so as to have a capacitance which is a half of that of the capacitor $C_s$ of the memory cell 6. One of the electrodes of the dummy capacitor $C_D$. is connected to one of the bit lines $BL_i$ and $BL_i$ bar corresponding to the respective dummy cells 7–10, via the source-drain of the transistor $Q_D$. The other electrode of the dummy capacitor $C_D$ is connected to the common cell plate to which one half of the supply voltage $V_{cc}$ is supplied. The gate of the transistor $Q_D$ is connected to one of the electrodes of the dummy word lines $DWL_0$ and $DWL_1$ corresponding to the dummy cells 7–10.

In each of the dummy cells 8 and 9, the connection node at which one of the electrodes of the dummy capacitor $C_D$ and the source of the transistor $Q_D$ are connected is grounded to the GND level via an N-channel MOSFET $Q_{DN}$. The gate of the transistor $Q_{DN}$ is connected to a common dummy-cell precharge line PDUM. In each of the dummy cells 8 and 9, when the dummy-cell precharge line PDUM goes high, the ground voltage GND (0 V) is applied to one of the electrodes of the dummy capacitor $C_D$.

In each of the dummy cells 7 and 10, the connection node at which one of the electrodes of the dummy capacitor $C_D$ and the source of the transistor $Q_D$ are connected is connected to the $V_{cc}$ power supply via a P-channel MOSFET $Q_{DP}$. The gate of the transistor $Q_{DP}$ is connected to a dummy-cell precharge line PDUM bar. In each of the dummy cells 7 and 10, when the dummy-cell precharge line PDUM bar goes low, the supply voltage $V_{cc}$ is applied to one of the electrodes of the dummy capacitor $C_D$. The dummy-cell precharge lines PDUM and PDUM bar go high and low, respectively by the operation of the control circuit (not shown), at the same time when the bit-line equalizing signal line BEQ bar goes low.

Next, the write operation and the read operation for the memory cells in the nonvolatile semiconductor memory device 500 are described. In the following explanation, a word line WL indicates any one of the word lines $WL_0$–$WL_n$ selected in the write or read operation. A bit line BL indicates one of a pair of bit lines $BL_i$ and $BL_i$ bar selected at that time, and corresponding to the memory cell 6 connected to the selected word line WL.

When a data "1" is to be written into the memory cell 6, as shown in FIG. 35, the word line WL is set high, while a supply voltage $V_{cc}$ is applied to the bit line BL. Accordingly, the transistor $Q_s$ is turned ON, and the supply voltage $V_{cc}$ of the bit line BL is applied to one of the electrodes of the capacitor $C_s$. Since a half voltage of the supply voltage $V_{cc}$ is applied to the other electrode of the capacitor $C_s$, a half voltage of the supply voltage $V_{cc}$ is applied across the electrodes of the capacitor $C_s$ (hereinafter, the polarity of the voltage in this state is assumed to be positive). To the ferroelectric film between the electrodes of the capacitor $C_s$, a positive electric field $E_{max}$ corresponding to a positive half voltage of the supply voltage $V_{cc}$ is applied. Polarization charge $P_s$ is accumulated in the capacitor $C_s$, as shown in FIG. 36.

Thereafter, the word line WL returns to a low level, and the transistor $Q_s$ is turned OFF. Then, due to a leakage current of the ferroelectric film in the capacitor, the electric potential levels of the two electrodes of the capacitor $C_s$ gradually become equal to each other. At this time, no electric field is applied to the ferroelectric film, nevertheless the ferroelectric film holds the remanent polarization charge $P_r$. The remanent polarization charge $P_r$ can be held even when the supply voltage to the nonvolatile semiconductor memory device is cut off and ½ $V_{cc}$ is not applied to the other electrode of the capacitor $C_s$. Therefore, the memory cell 6 stores the data "1" in a nonvolatile manner by the remanent polarization charge $P_r$.

When a data "0" is to be written into the memory cell 6, as shown in FIG. 37, the word line WL is set high, while a ground voltage GND (0 V) is applied to the bit line BL. Accordingly, the transistor $Q_s$ is turned ON, and 0 V is applied to one of the electrodes of the capacitor $C_s$. A half voltage of the supply voltage $V_{cc}$ of the polarity opposite to that of the above-mentioned case is applied consequently across the electrodes of the capacitor $C_s$ (hereinafter, the polarity of the voltage is assumed to be negative). To the ferroelectric film between the electrodes of the capacitor $C_s$, a negative electric field $-E_{max}$ corresponding to a negative half voltage of the supply voltage $V_{cc}$ is applied. Polarization charge $-P_s$ is accumulated in the capacitor $C_s$, as shown in FIG. 38.

Thereafter, the word line WL returns to a low level, and the transistor $Q_s$ is turned OFF. Then, due to a leakage current of the ferroelectric film in the capacitor, the electric potential levels of the two electrodes of the capacitor $C_s$ gradually become equal to each other. At this time, no electric field is applied to the ferroelectric film, nevertheless the ferroelectric film holds remanent polarization charge $-P_r$. The remanent polarization charge $-P_r$ can be held even when the supply voltage is cut off and ½ $V_{cc}$ is not applied to the other electrode of the capacitor $C_s$. Therefore, the memory cell 6 stores the data "0" in a nonvolatile manner by the remanent polarization charge $-P_r$.

When the data stored in the memory cell 6 is to be read, the bit line BL is precharged to the supply voltage $V_{cc}$ prior to the read operation. After the supply voltage is applied and charge is sufficiently accumulated, the bit line is disconnected from the power supply, so as to complete the precharge.

The read operation when the data "1" is stored in the memory cell 6 is shown in FIG. 39. The word line WL is set high in the precharged state, and then the transistor $Q_s$ is turned ON. Accordingly, the charge of the bit line BL and the remanent polarization charge $P_r$ held in the ferroelectric film of the capacitor $C_s$ are charge-shared. In general, the capacitance $C_B$ of the bit line BL is sufficiently larger than the capacitance $C_s$ of the capacitor $C_s$, so that a voltage substantially equal to the supply voltage $V_{cc}$ is applied to one of the electrodes of the capacitor $C_s$. Therefore, a positive voltage substantially equal to a half of the supply voltage $V_{cc}$ is applied across the electrodes of the capacitor $C_s$, so that, as shown in FIG. 40, an electric field $E_{max}$ corresponding to the positive voltage is applied to the ferroelectric film. Thus, polarization charge $P_s$ is accumulated in the ferroelectric film. As is seen from FIG. 40, polarization inversion is not caused in the ferroelectric film. The amount of charge moved from the bit line BL to the capacitor $C_s$ is $P_s-P_r$.

Accordingly, the potential variation $\Delta V_1$ of the bit line BL, i.e., the read voltage level of the bit line BL in the case where the data "1" is read out is given by Equation (1) below.

$$\Delta V_1 = -\frac{P_s - P_r}{C_B} \quad (1)$$

The read operation when the data "0" is stored in the memory cell 6 is shown in FIG. 41. The word line WL is set high in the state precharged to the supply voltage $V_{cc}$, and then the transistor $Q_s$ is turned ON. Accordingly, the charge of the bit line BL and the remanent polarization charge $-P_r$ held in the ferroelectric film of the capacitor $C_s$ are charge-shared. Supposing that the capacitance $C_B$ of the bit line BL is sufficiently larger than the capacitance $C_s$ of the capacitor $C_s$ (in general, it is the case), a voltage substantially equal to the supply voltage $V_{cc}$ is applied to one of the electrodes of the capacitor $C_s$. Therefore, a positive voltage substantially equal to a half of the supply voltage $V_{cc}$ is applied across the electrodes of the capacitor $C_s$, so that, as shown in FIG. 42, an electric field $E_{max}$ corresponding to the positive voltage is applied to the ferroelectric film. Thus, polarization charge $P_s$ is accumulated in the ferroelectric film. As is seen from FIG. 42, the polarization inversion is caused in the ferroelectric film. The amount of charge moved from the bit line BL to the capacitor $C_s$ is $P_s+P_r$.

Accordingly, the potential variation $\Delta V_0$ of the bit line BL, i.e., the read voltage level of the bit line BL in the case where the data "0" is read out is given by Equation (2) below.

$$\Delta V_0 = -\frac{P_s+P_r}{C_B} \quad (2)$$

As described above, in the read operation, the read voltage level (the potential variation of the bit line BL) is different depending on the data stored in the memory cell 6. By detecting and amplifying the difference, it is possible to identify the stored data. In the nonvolatile semiconductor memory device 500, as described below, the read voltage level (potential variation) of one of a pair of bit lines $BL_i$ and $BL_i$, bar is compared with the potential variation of the other bit line by the dummy cells 7–10, so that the stored data is detected.

Next, by referring to FIG. 43, the specific procedure of the read operation in the nonvolatile semiconductor memory device 500 will be described.

First, prior to the read operation, at time $t_{21}$, a low-pulse is input to the bit-line equalizing signal line BEQ bar (i.e., the line is kept at a low level for a predetermined time period), so that the bit-line equalizing circuit 11 is driven. That is, the P-channel transistors $Q_{111}$–$Q_{113}$ are turned ON, and all of the bit lines $BL_i$ and $BL_i$ bar are precharged to the supply voltage $V_{cc}$. In a synchronizing manner, at the time $t_{21}$, a high-pulse is input into the dummy-cell precharge line PDUM (i.e., the line is kept at a high level for a predetermined time period), so that a ground voltage GND (0 V) is applied to one of the electrodes of the dummy capacitor $C_D$ in each of the dummy cells 8 and 9. Similarly, a low-pulse is input into the dummy-cell precharge line PDUM bar, so that the supply voltage $V_{cc}$ is applied to one of the electrodes of the dummy capacitor $C_D$ in each of the dummy cells 7 and 10.

When 0 V is applied to one of the electrodes of the dummy capacitor $C_D$, a negative half voltage of the supply voltage $V_{cc}$ is applied across the electrodes of the dummy capacitor $C_D$. Accordingly, similar to the case where the data "0" is written into the memory cell 6, the ferroelectric film is polarized in a negative direction. When the supply voltage $V_{cc}$ is supplied to one of the electrodes of the dummy capacitor $C_D$, a positive half voltage of the supply voltage $V_{cc}$ is applied across the electrodes of the dummy capacitor $C_D$. Accordingly, similar to the case where the data "1" is written into the memory cell 6, the ferroelectric film is polarized in a positive direction. Therefore, the ferroelectric films of the dummy capacitors $C_D$ in the two dummy cells (7 and 8, or 9 and 10) connected to one bit line ($BL_i$ or $BL_i$ bar) are polarized in directions opposite to each other. Since the capacitance of the capacitor $C_D$ in each of the dummy cells 7–10 is half of the capacitance of the capacitor $C_s$ in the memory cell 6, in the case where an identical voltage is applied, the charge held in the dummy capacitor $C_D$ is a half of the charge held in the capacitor $C_s$.

Next, at time $t_{22}$ at which the read operation starts, any one word line WL of the word lines $WL_0$–$WL_n$ is selected to be set high, and the transistor $Q_s$ of the memory cell 6 connected to the word line WL is turned ON. When data "1" is stored in the memory cell 6, as shown in FIG. 40, the charge corresponding to $(P_s-P_r)$ moves from the bit line BL to the capacitor $C_s$. As a result, the electric potential of the bit line BL is lowered from the supply voltage $V_{cc}$ by the potential variation $\Delta V_1$ expressed by Equation (1). When data "0" is stored in the memory cell 6, as shown in FIG. 42, the charge corresponding to $(P_s+P_r)$ moves, so that the electric potential of the bit line BL which is connected to the memory cell 6 is lowered from the supply voltage $V_{cc}$ by the potential variation $\Delta V_0$ expressed by Equation (2). As is apparent from FIGS. 40 and 42, the potential variation $\Delta V_1$ is relatively small and the potential variation $\Delta V_0$ is significantly large in relation thereto.

At time $t_{22}$, any one dummy word line DWL corresponding to the selected word line WL is also set high. That is, when the memory cell 6 connected to the selected word line WL is connected to one bit line $BL_i$, the dummy word line $DWL_0$ of the dummy cells 9 and 10 connected to the other bit line $BL_i$ bar is set high. When the memory cell 6 is connected to the other bit line $BL_i$ bar, the dummy word line $DWL_1$ of the dummy cells 7 and 8 connected to the bit line $BL_i$ is set high.

In the above-described manner, when one dummy word line DWL goes high, transistors $Q_D$ in either pair of dummy cells 7 and 8 or dummy cells 9 and 10 are turned on. As to the dummy cells 7 and 10, the charge movement which is identical with the case where the data "1" is stored in the memory cell 6 occurs. As to the dummy cells 8 and 9, the charge movement which is identical with the case where the data "0" is stored in the memory cell 6 occurs. However, the capacitance of the dummy capacitor $C_D$ is set to be a half of the capacitance of the capacitor $C_s$ of the memory cell 6, so that the amount of charge moving from the bit line BL to the dummy capacitor $C_D$ of the dummy cell 7 or 10 is $(P_s-P_r)/2$, and the amount of charge moving from the bit line BL to the dummy capacitor $C_D$ of the dummy cell 8 or 9 is $(P_s+P_r)/2$. Accordingly, the total amount of charge moving from the bit line BL to the pair of dummy cells 7 and 8 or 9 and 10 is $P_s$ in any case. Thus, the potential variation $\Delta V_D$ of the bit line BL by a pair of dummy cells is constant as expressed by Equation (3) below.

$$\Delta V_D = -\frac{P_s}{C_B} \quad (3)$$

The potential variation is indicated by two-dot chain line in FIG. 43.

Therefore, in the case where the data "1" is stored in the memory cell 6, at the time shortly after time $t_{22}$, there occurs a potential difference $\Delta V_{dif1}$ expressed by Equation (4) below between the pair of bit lines $BL_i$ and $BL_i$ bar as a difference between Equation (1) and Equation (3). The potential difference $\Delta V_{dif1}$ is input into and amplified by the sense amplifier 13 (which is described later).

$$\Delta V_{dif1} = -\frac{P_s-P_r}{C_B} - \left(-\frac{P_s}{C_B}\right) = \frac{P_r}{C_B} \quad (4)$$

In the case where the data "0" is stored in the memory cell 6, there occurs a potential difference $\Delta V_{dif0}$ expressed by Equation (5) below as a difference between Equation (2) and Equation (3). The potential difference $\Delta V_{dif0}$ is input into and amplified by the sense amplifier 13 (which is described later).

$$\Delta V_{di/0} = -\frac{P_s + P_r}{C_B} - \left(-\frac{P_s}{C_B}\right) = \frac{P_r}{C_B} \quad (5)$$

As described above, between the pair of bit lines $BL_i$ and $BL_i$ bar, either one of potential differences having opposite polarities and the same absolute values occurs depending on the data stored in the memory cell 6 is "1" or "0". By amplifying the potential difference to a predetermined level by the sense amplifier 13 in the following manner, the data "1" and "0" can be identified.

At time $t_{23}$, the sense-amplifier driving signal lines S and S bar go high and low, respectively. As a result, the sense amplifier 13 is driven so as to differentially amplify the potential difference. Then, the electric potential levels of the pair of bit lines $BL_i$ and $BL_i$ bar are changed to the supply voltage $V_{cc}$ and the ground voltage GND, respectively, based on the polarity of the potential difference, so as to make the signal level valid. By reading the signal levels of the pair of bit lines $BL_i$ and $BL_i$ bar, the data stored in the selected memory cell 6 can be identified and output. That is, the digital value which is stored in a nonvolatile manner can be read without fail.

As shown in FIG. 43, the high-level voltage applied to the word line WL and the dummy word line DWL is set higher than the supply voltage $V_{cc}$ by a threshold voltage $V_{th}$ of the transistor $Q_s$ and the transistor $Q_D$. This setting makes it sure to apply a supply voltage $V_{cc}$ of the bit line BL to one of the electrodes of each of the capacitor $C_s$ and the dummy capacitor $C_D$.

Another type of conventional nonvolatile semiconductor memory device is described in Japanese Laid-Open Patent Publication No. 6-243690, in which 1 bit data is stored in a 1C-1Tr memory cell. FIG. 44 shows a part of the circuitry of a conventional nonvolatile semiconductor memory device 600 which is disclosed in the Japanese Laid-Open Patent Publication No. 6-243690. As shown in FIG. 44, in the semiconductor memory device 600, data line selection means (not shown) selects a single data line $DLF_j$ (j=1, 2, . . . , n), then precharge means $PCf_0$ sets the selected data line $DLF_j$ at a first electric potential, and then word line selection means (not shown) activates a single word line $WLf_i$ (i 32 1, 2, . . . , m). Prior to the selection of the single data line $DLF_j$ by the data line selection means, the precharge means sets a plurality of the data lines $DLF_j$ at a third electric potential which is equal to an electric potential of a plate electrode of a capacitor of a memory cell.

A data line $DLF_j$ of the nonvolatile semiconductor memory device 600 is a line to which memory cells are connected at intersections with a word line, so as to correspond to a bit line $BL_i$ of the semiconductor memory device 500. Hereinafter, this line will be referred to a "bit line" throughout the specification.

As described above, in the conventional nonvolatile semiconductor memory device 500, the data read from the memory cell 6 is a so-called "destructive read" in which the remanent polarization charge of the ferroelectric film is charge-shared with the charge on the bit line BL. That is, in the read of data, the electric field $E_{max}$ is applied to the ferroelectric film of the capacitor $C_s$. Therefore, the polarization charge $P_s$ is accumulated in the capacitor $C_s$, so that the held remanent polarization charge $P_r$ or $-P_r$ corresponding to the data "1" or "0" is lost (see FIGS. 40 and 42).

Therefore, after the read operation, it is necessary to perform a rewrite operation to write the read-out data into the memory cell again by utilizing the valid signal levels of the bit lines $BL_i$ and $BL_i$ bar.

In general, a semiconductor memory device includes a row decoder for selecting a word line having a specific row address and a column decoder for selecting a bit-line pair having a specific column address. A memory cell which is disposed at the crossing of the selected word line and the bit-line pair is specified (i.e., the row address and the column address are specified), and the write and read operations are performed for the specified memory cell.

In the conventional nonvolatile semiconductor memory device 500, when any one word line WL is selected and set high, the data of all memory cells 6 connected to the selected word line WL are destructively read out onto the respective bit lines BL and BL bar. In other words, the data which is not required to be read from the memory cell is also destroyed as the result of a read operation.

Accordingly, in order to hold the data stored in the memory cells, it is necessary to perform the rewrite operation for the data read out on the bit lines for all of the memory cells connected to the selected word lines WL. In order to perform the rewrite operation, it is necessary to drive the sense amplifiers 13 connected to all of the bit lines BL and BL bar. This results in wasteful power consumption because the amplification and rewrite are performed for the bit-line pairs for which the data read is not required. Thus, the consumed power is disadvantageously increased.

In addition, in the conventional nonvolatile semiconductor memory device 500, every bit line pair BL and BL bar requires a sense amplifier 13 for the above-mentioned read and rewrite operations. The number of sense amplifiers 13 not only increase the power consumption but also increase an area for the memory device.

In the conventional nonvolatile semiconductor memory device 600 of the Japanese Laid-Open Patent Publication No. 6-243690, a single data line is selected by the data line selection means, the selected data line is set at the first electric potential by the precharge means, and then a word line is activated by the word line selection means. Prior to the selection of the single data line by the data line selection means, the precharge means sets a plurality of the data lines at a third electric potential which is equal to an electric potential of a plate electrode of a capacitor of a memory cell.

Accordingly, in the nonvolatile semiconductor memory device 600, the data stored in the memory cells which are not selected is prevented from being destroyed in a read operation by setting the non-selected bit lines at the third electric potential which is equal to the electric potential of the plate electrode of the capacitor, resulting in an elimination of the problem of the conventional nonvolatile semiconductor memory device 500.

However, this introduces another problem into the nonvolatile semiconductor memory device 600. That is, the time required for a read operation becomes longer than that of the nonvolatile semiconductor memory device 500. Compared with the nonvolatile semiconductor memory device 500 which activates only the word line after starting a read operation, the nonvolatile semiconductor memory device 600 sets the selected bit line at the first electric potential by the precharge means after starting a read operation, and then activates the word line. Therefore, a read operation of the nonvolatile semiconductor memory device 600 requires a longer time than that of the nonvolatile semiconductor memory device 500 because of the time of precharging the selected bit line at the first electric potential by using the precharge means.

SUMMARY OF THE INVENTION

A semiconductor memory device of this invention includes at least one memory block comprising: a plurality of word lines; a plurality of bit lines; and a plurality of memory cells which are disposed at crossings of the word lines and the bit lines, each memory cell including a first switching element and a capacitor which is connected to the bit line via the first switching element, the first switching element being turned on and off in accordance with a signal level supplied from the corresponding word line, and data being written to and read from the capacitor by a voltage signal supplied from the bit line. The semiconductor memory device further includes: a node comprising a capacitance member having a predetermined capacitance; a second switching element for connecting the bit line to the node; a bit line precharge circuit for precharging the bit line; a circuit for precharging the capacitance member; and a control circuit for controlling the first switching element so as to connect electrically the memory cell which is coupled to the word line selected in a read operation to the corresponding bit line, and for controlling the second switching element so as to connect electrically the bit line which is selected in the read operation to the node comprising the precharged capacitance member, whereby changing the electric potential of the selected bit line so as to applying a predetermined voltage signal to the capacitor of the selected memory cell which is coupled to the selected word line and the selected bit line, whereby reading a data signal corresponding the data stored in the capacitor of the selected memory cell onto the selected bit line and the node.

In one embodiment of this invention, the node comprising the capacitance member is provided for each of the plurality of bit lines, and the second switching element connects the bit line which is selected from the plurality of bit lines to the corresponding node.

In another embodiment of this invention, the node comprising the capacitance member is provided commonly for the plurality of bit lines, and the second switching element connects the bit line which is selected from the plurality of bit lines to the node.

In still another embodiment of this invention, the plurality of memory cells are arranged in a matrix, the capacitor in each memory cell includes a pair of electrodes and a ferroelectric film provided therebetween and stores the data in a nonvolatile manner, one of the electrodes being connected to the corresponding bit line via the first switching element, the bit line precharge circuit precharges the plurality of bit lines to a first potential level which is the same as a potential level of the other electrode of the capacitor, the circuit for precharging the capacitance member precharges the capacitance member to a second potential level which is different from the first potential level, and the control circuit controls the first and second switching elements so as to change the potential level of the one electrode of the capacitor of the selected memory cell to a third potential level between the first and second potential levels, whereby reading a data signal corresponding to the data stored in the ferroelectric film of the capacitor onto the selected bit line and the node.

In still another embodiment of this invention, the circuit for precharging the capacitance means sets the second potential level so that a difference between the first and third potential levels is greater than a polarization inversion voltage of the ferroelectric film of the capacitor, the third potential level being obtained by charge-sharing between the one electrode of the capacitor of the selected memory cell, the selected bit line, and the capacitance means.

A semiconductor memory device of this invention includes at least one memory block comprising: a plurality of word lines; a plurality of bit lines; and a plurality of memory cells which are disposed at crossings of the word lines and the bit lines, each memory cell including a first switching element and a capacitor which is connected to the bit line via the first switching element, the first switching element being turned on and off in accordance with a signal level supplied from the corresponding word line, and data being written in and read from the capacitor by a voltage signal supplied from the bit line. The memory block is divided into a plurality of sub-matrices each including a predetermined number of the bit lines. The semiconductor memory device further includes: a first node provided for at least one sub-matrix of the at least one memory block, comprising a first capacitance member having a first predetermined capacitance; a second switching element for selectively connecting the predetermined number of the bit lines included in each sub-matrix to the corresponding the first node; a second node provided for the whole of the at least one memory block, comprising a second capacitance member having a second predetermined capacitance; third switching element for selectively connecting the first node to the second node; a bit line precharge circuit for precharging the plurality of bit lines; a first precharge circuit for precharging the first capacitance member; a second precharge circuit for precharging the second capacitance member; and a control circuit for controlling the first switching element so as to connect electrically the memory cell which is coupled to the word line selected in a read operation to the corresponding bit line, and for controlling the second switching element so as to connect electrically the bit line which is selected in the read operation to the first node comprising the precharged first capacitance member, whereby changing the electric potential of the selected bit line so as to apply a predetermined voltage signal to the capacitor of a selected memory cell which is coupled to the selected word line and the selected bit line. As a result, the control circuit reads a data signal corresponding the data stored in the capacitor of the selected memory cell onto the selected bit line and the first node, and then controls the third switching element so as to transfer the data signal which is read on the first node onto the second node.

According to another aspect of the invention, a method for driving a semiconductor memory device including at least one memory block comprising: a plurality of word lines; a plurality of bit lines; and a plurality of memory cells which are disposed at crossings of the word lines and the bit lines, each memory cell including a first switching element and a capacitor which is connected to the bit line via the first switching element, the first switching element being turned on and off in accordance with a signal level supplied from the corresponding word line, and data being written in and read from the capacitor by a voltage signal supplied from the bit line, a node comprising a capacitance member having a predetermined capacitance, and a second switching element for connecting the bit line to the node is provided. The method includes the steps of: precharging the plurality of bit line to a first potential level; precharging the capacitance member to a second potential level which is different from the first potential level; turning on the first switching element coupled to the word line which is selected in a read operation whereby electrically connecting the capacitor of the corresponding memory cell to the corresponding bit line; turning on the second switching element whereby electrically connecting the bit line which is selected in the read operation to the node comprising the precharged capacitance member; changing the electric potential of the selected bit line whereby applying a predetermined voltage signal to the capacitor of the selected memory cell which is coupled to the selected word line and the selected bit line, as a result of turning on the first and second switching means; and reading a data signal corresponding the data stored in the capacitor of the selected memory cell onto the selected bit line and the node.

In one embodiment of this invention, the node comprising the capacitance member is provided for each of the plurality of bit lines, and in the step of turning on the second switching element, the bit line which is selected from the plurality of bit lines is connected to the corresponding node.

In another embodiment of this invention, the node comprising the capacitance member is provided commonly for the plurality of bit lines, and in the step of turning on the second switching element, the bit line which is selected from the plurality of bit lines is connected to the node.

In still another embodiment of this invention, the plurality of memory cells are arranged in a matrix, the capacitor in each memory cell includes a pair of electrodes and a ferroelectric film provided therebetween and stores the data in a nonvolatile manner, one of the electrodes being connected to the corresponding bit line via the first switching element, and the node comprising the capacitance member is a common data line for carrying the data signal. In the step of precharging the bit line, the first potential level is the same as a potential level of the other electrode of the capacitor. In the step of changing the electric potential of the selected bit line, the potential level of the one electrode of the capacitor of the selected memory cell is changed to a third potential level between the first and second potential levels. And in the step of reading the data signal, the data signal corresponding to the data stored in the ferroelectric film of the capacitor is read onto the selected bit line and the common data line.

In still another embodiment of this invention, the method comprises a step of allowing the common data line and the precharged bit lines to be in a floating state, prior to the read operation.

In the step of precharging the bit lines, all of the bit lines included in the memory block may be precharged at the same time.

The step of turning on the second switching element may be performed based on the column-address.

In the step of precharging the common data line, the second potential level may be set so that a difference between the first and third potential levels is greater than a polarization inversion voltage of the ferroelectric film of the capacitor, the third potential level being obtained by charge-sharing between the one electrode of the capacitor of the selected memory cell, the selected bit line, and the common data line.

In one embodiment of this invention, the method further comprising a step of amplifying a signal level of the data which is read onto the common data line.

In another embodiment of this invention, the method further comprising the steps of supplying a write signal corresponding to the read data to the common data line at the same time as or after performing the step of amplifying the signal level, a high level of the write signal for a data "1" being a fourth potential level, and storing electric charge corresponding to the write signal in the capacitor of the selected memory cell.

In still another embodiment of this invention, in the step of turning on the first switching element, a signal of a predetermined potential level is applied to the first switching element via the selected word line, the predetermined potential level being higher than a fourth potential level by at least a threshold voltage of the first switching element, the fourth potential level being a high level of the write signal for a data "1".

In still another embodiment of this invention, in the step of turning on the second switching element, a signal of a predetermined potential level is applied to the second switching element via the selected bit line, the predetermined potential level being higher than a fourth potential level by at least a threshold voltage of the second switching element, the fourth potential level being a high level of the write signal for a data "1".

In one embodiment of this invention, the fourth potential level is set at a source supply voltage level, and the first potential level is set at a half of the source supply voltage level.

In another embodiment of this invention, the fourth potential level is set higher than a source supply voltage level, and the first potential level is set at a half of the fourth potential level.

A method for driving a semiconductor memory device of this invention drives a semiconductor memory device including: at least one memory block comprising: a plurality of word lines; a plurality of bit lines; and a plurality of memory cells which are disposed at crossings of the word lines and the bit lines, each memory cell including a first switching element and a capacitor which is connected to the bit line via the first switching means, the first switching element being turned on and off in accordance with a signal level supplied from the corresponding word line, and data being written in and read from the capacitor by a voltage signal supplied from the bit line, the memory block being divided into a plurality of sub-matrices each including a predetermined number of the bit lines; a first node provided for at least one sub-matrix of the at least one memory block, comprising a first capacitance member having a first predetermined capacitance; a second switching element for selectively connecting the predetermined number of the bit lines included in each sub-matrix to the corresponding the first node; a second node provided for the whole of the at least one memory block, comprising a second capacitance member having a second predetermined capacitance; and a third switching element for selectively connecting the first node to the second node. The method includes the steps of: precharging the bit lines to a first potential level; precharging the first capacitance member to a second potential level which is different from the first potential level; precharging the second capacitance member to a predetermined potential level; turning on the first switching element connected to the word line which is selected in a read operation, whereby electrically connecting the capacitor of the corresponding memory cell to the corresponding bit line; turning on the second switching element whereby electrically connecting the selected bit line to the first node comprising the precharged first capacitance member; changing the electric potential of the selected bit line whereby applying a predetermined voltage signal to the capacitor of the selected memory cell which is coupled to the selected word line and the selected bit line, as a result of turning on the first and second switching elements; reading a data signal corresponding the data stored in the capacitor of the selected memory cell onto the selected bit line and the first node; and turning on the third switching element whereby transferring the data which is read onto the first node to the second node line.

Thus, the invention described herein makes possible the advantages of providing a nonvolatile semiconductor memory device in which (1) data of a selected memory cell is read out without destroying the data of memory cells other than the selected memory cell, so that power consumption is reduced, (2) a sense amplifier is not necessarily provided for every bit line pair, so that the area of the device is reduced, and (3) time for a read operation is not increased in comparison with a conventional nonvolatile semiconductor memory device; and providing a method for driving the nonvolatile semiconductor memory device.

These and other advantages of the present invention will become apparent to those skilled in the art upon reading and understanding the following detailed description with reference to the accompanying figures.

BRIEF DESCRIPTION OF THE DRAWINGS

FIG. 10 is a diagram showing a memory cell from which a data "0" is read out in the nonvolatile semiconductor memory device in one embodiment of the present invention.

FIG. 11 is a diagram showing the polarization characteristics of a ferroelectric film when the data "0" is read out in the nonvolatile semiconductor memory device in one embodiment of the present invention.

FIG. 12 is a diagram showing a memory cell which retains a data "1" in the nonvolatile semiconductor memory device in one embodiment of the present invention.

FIG. 13 is a diagram showing the polarization state of a ferroelectric film when the data "1" is retained in the nonvolatile semiconductor memory device in one embodiment of the present invention.

FIG. 35 is a diagram showing a memory cell when the data "1" is written in the conventional nonvolatile semiconductor memory device.

FIG. 36 is a diagram showing the polarization state of a ferroelectric film when the data "1" is written in the conventional nonvolatile semiconductor memory device.

FIG. 37 is a diagram showing a memory cell when the data "0" is written in the conventional nonvolatile semiconductor memory device.

FIG. 38 is a diagram showing the polarization state of a ferroelectric film when the data "0" is written in the conventional nonvolatile semiconductor memory device.

FIG. 39 is a diagram showing a memory cell when the data "1" is read out in the conventional nonvolatile semiconductor memory device.

FIG. 40 is a diagram showing the polarization state of the ferroelectric film when the data "1" is read out in the conventional nonvolatile semiconductor memory device.

FIG. 41 is a diagram showing a memory cell when the data "0" is read out in the conventional nonvolatile semiconductor memory device.

FIG. 42 is a diagram showing the polarization state of the ferroelectric film when the data "0" is read out in the conventional nonvolatile semiconductor memory device.

DESCRIPTION OF THE PREFERRED EMBODIMENTS

Figure 1:
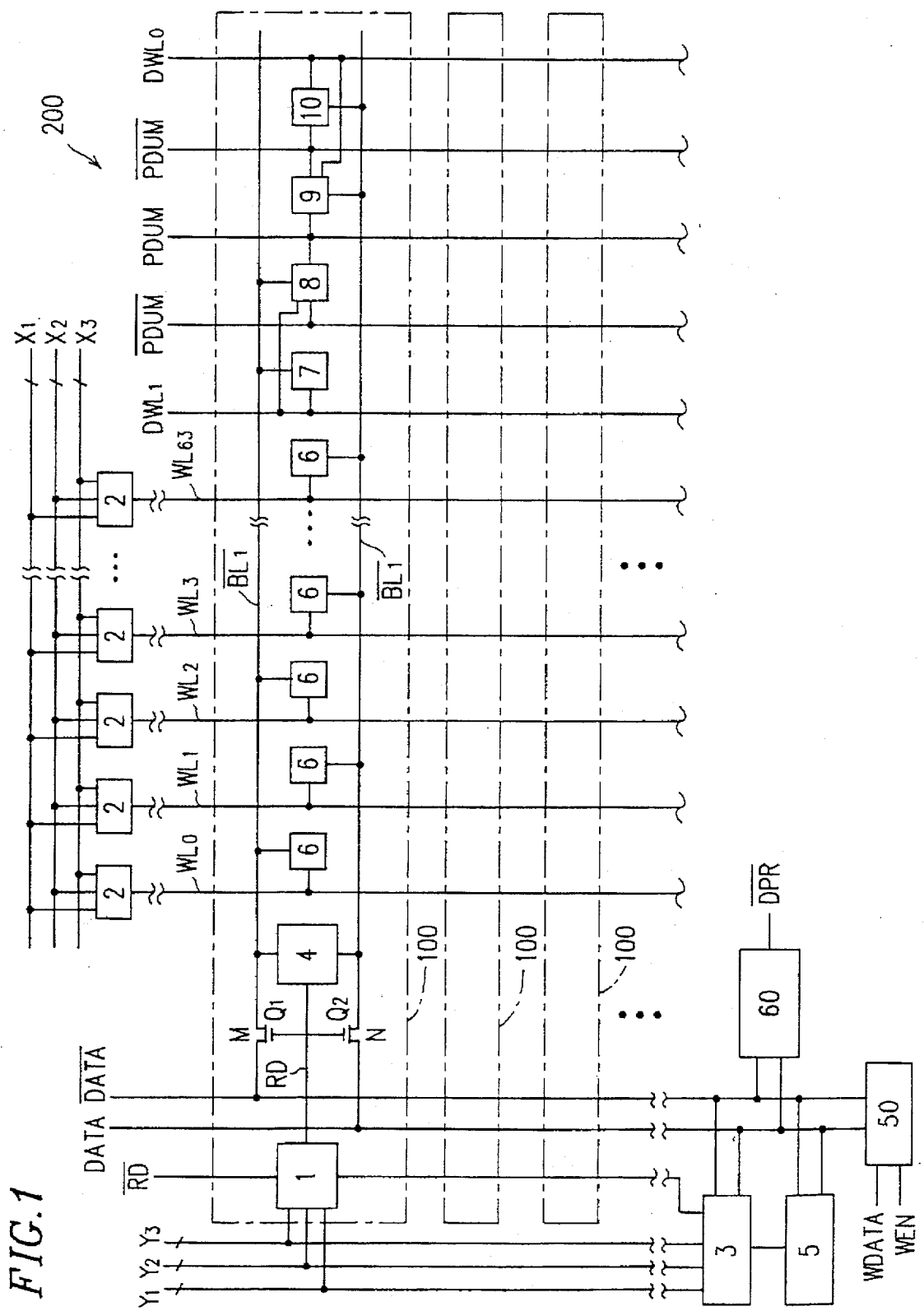
FIG. 1 is a block diagram showing a part of the circuitry of a nonvolatile semiconductor memory device in one embodiment of the present invention.

First, the construction and the operation principle of a semiconductor memory device according to the present invention are described below. In the semiconductor memory device of the present invention, by applying a voltage signal to a capacitor in each memory cell, data is written to and read from the capacitor. The present invention will be described by using a nonvolatile semiconductor memory device as one embodiment in which the positive or negative remanent polarization is held in the ferroelectric film of the capacitor in each memory cell, so that information (data) is stored in a nonvolatile manner. The capacitor having the ferroelectric film is referred to a ferroelectric capacitor in this specification. The present invention is not limited to the nonvolatile semiconductor memory device using the ferroelectric capacitors, but is also applicable to memory devices in which the data is written to and read from each memory cell by using a voltage signal supplied via a bit line.

In general, a memory cell is disposed at each of the intersections of a plurality of bit lines and a plurality of word lines, and the memory cells are arranged in a matrix. However, the memory cells are not necessarily provided at all of the intersections of the bit lines and the word lines. Each memory cell includes a ferroelectric capacitor and a first switching element. One electrode of the capacitor is connected to the bit line via the first switching element. The bit line is connected to a common data line via a second switching element.

The nonvolatile semiconductor memory device may include a plurality of memory blocks (memory cell matrixes) each including bit lines, word lines, and memory cells which are arranged as described above. One or more pairs of word lines are provided to each memory block. In this specification, one of such memory blocks is described.

In a read operation, a pair of bit lines and a word line are selected. By decoding a received address signal by a column decoder, a bit line is selected. By decoding a received address signal by a row decoder, a word line is selected. When the word line is selected, the signal level thereof assumes an active level. When the bit line is selected, a second switching element which is provided between the bit line and the common data line conducts (i.e., turns-ON), so that the selected bit line is electrically connected to the common data line.

First, prior to a read operation, bit lines in a memory block are precharged to a first electric potential (voltage level), which is equal to an electric potential of a common cell plate, by a bit line precharge circuit. Similarly, prior to the read operation, the common data line is precharged to a second electric potential, which is different from the first electric potential, by a common data line precharge circuit.

At a start of the read operation, the bit lines and the common data line are made to float. When a word line is selected and the signal level thereof becomes active, all of the first switching elements which are connected to the word line become conducting (i.e., turn-ON) so that capacitors of the corresponding memory cells are electrically connected to the respective bit lines. At the same time, a bit line is selected by allowing the second switching element to conduct, which is provided between the bit line to be selected and the common data line. An order of the timing of activating the word line (turning-ON of the first switching elements) and the timing of electrically connecting the bit line to the common data line (turning-ON of the second switching element) is arbitrary.

Then, an electric potential of the selected bit line goes from the first potential level to a third potential level between the first and second potential levels, due to a charge-sharing with the common data line which has been precharged to the second potential level. Accordingly, in a memory cell which corresponds to the selected word line and the selected bit line (i.e., a selected memory cell), the third electric potential different from the first electric potential is applied to one electrode of the ferroelectric capacitor. Since the other electrode of the ferroelectric capacitor is set at the first electric potential, a voltage according to the potential difference is applied between the electrodes, resulting in a polarization transfer of the ferroelectric film to a positive or negative polarization state.

The polarization transfer causes a charge transfer between the ferroelectric capacitor and the selected bit line, resulting in a small potential change on the selected bit line in accordance with a previous polarization state of the ferroelectric film before the polarization transfer. By using the potential change on the selected bit line, data stored in the selected memory cell can be read out in a conventional manner. The data stored in the selected memory cell is destroyed by the read operation, so a rewrite operation is performed.

In the above explanation, the potential level of the selected bit line is changed by electrically connecting the selected bit line to the precharged common data line. The common data line carries the data signal for read/write operation. Nevertheless, in the present invention, means for changing the potential level of the selected bit line is not limited to the common data line. For example, the potential level change of the selected bit line can be realized by electrically connecting the selected bit line to an node having predetermined capacitance or a capacitor.

FIGS. 45 to 48 show examples of the structure and operation of the semiconductor memory device in which nodes having capacitance or capacitors are used to change the potential level of the selected bit line. In particular, the nodes having capacitance or the capacitors are precharged prior to the read operation, and then the selected bit line is electrically connected to the corresponding node or capacitor.

Figure 45:
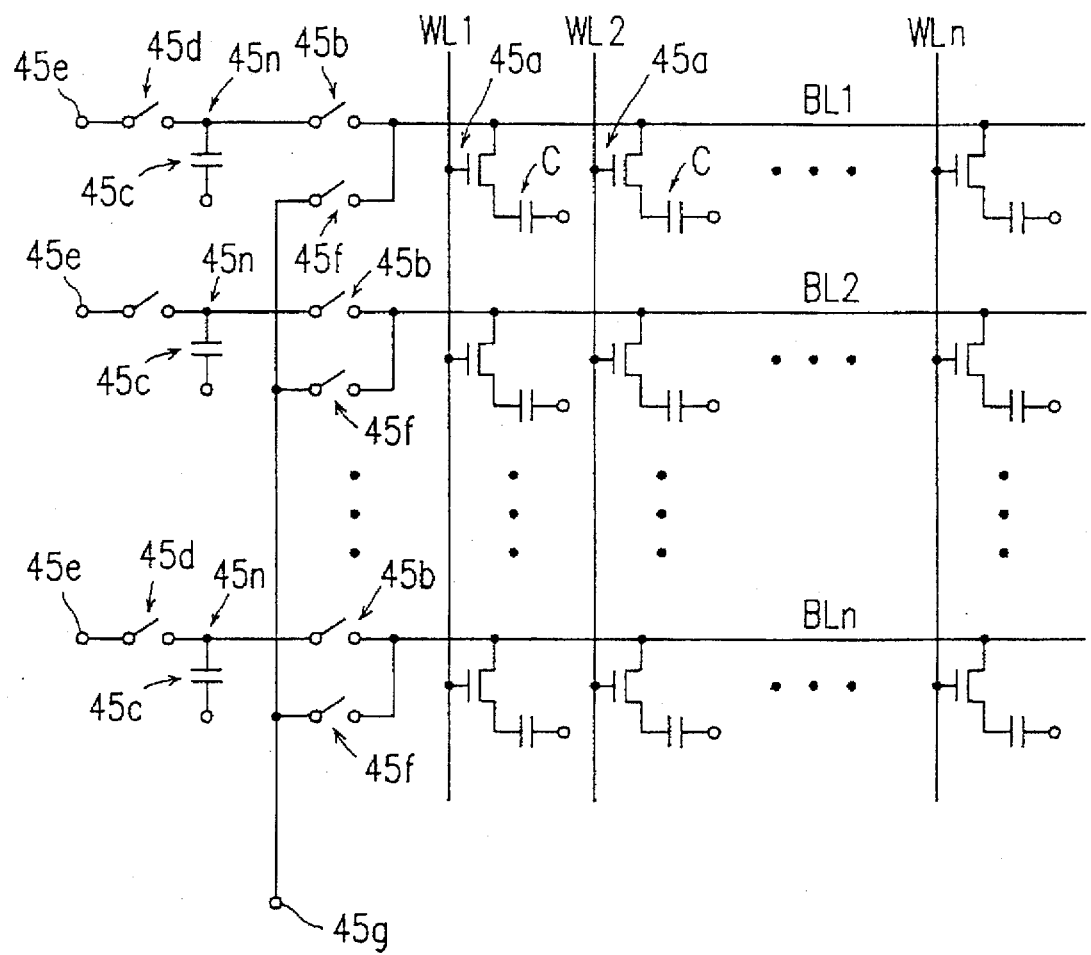
FIG. 45 is a schematic diagram showing a part of the circuitry of a semiconductor memory device in one embodiment of the present invention.

FIG. 45 shows schematically an example in which a node 45n comprising a capacitance member (capacitor) 45c is provided for each bit line BL. Each node 45n is connected to a corresponding bit line BL via a switching element 45b, and is coupled to a second potential level 45e which precharges the capacitor 45c via another switching element 45d. Each bit line BL is coupled to a first potential 45g which precharges the bit line BL via a switching element 45f. Capacitors C of each memory cell are connected to a respective bit line BL by a switching element 45a.

Figure 46:
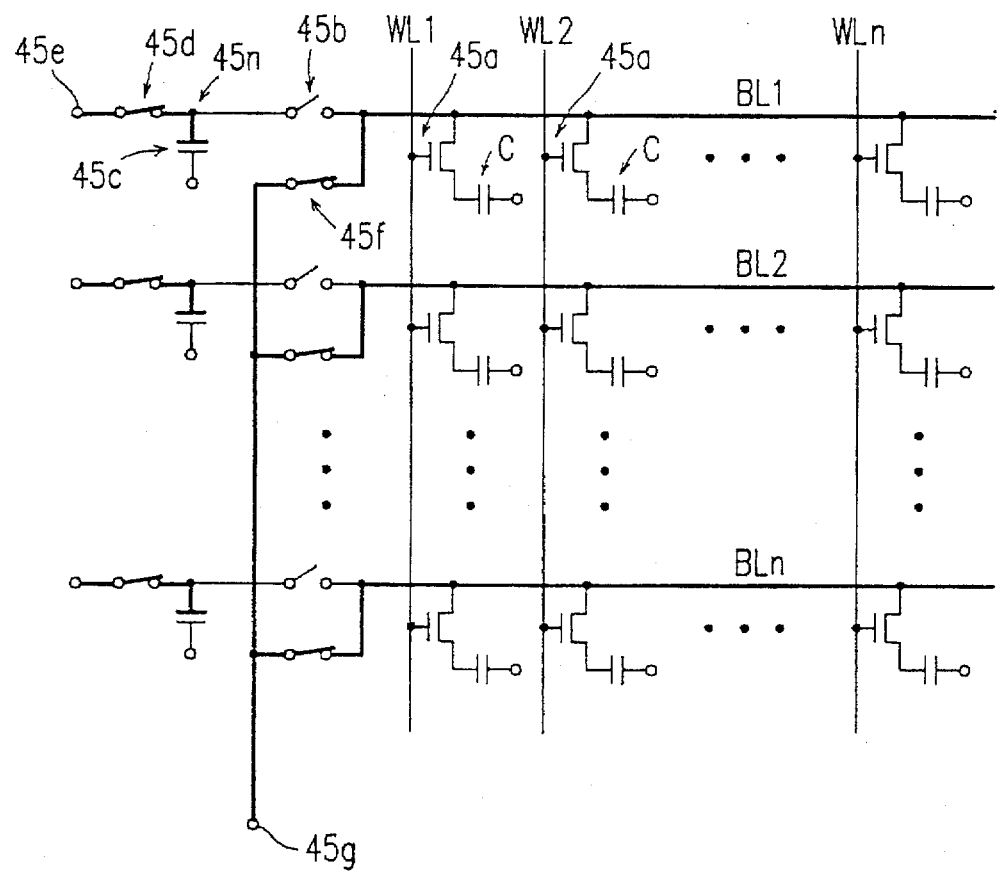
FIG. 46 is a schematic diagram showing a precharge operation of the semiconductor memory device shown in FIG. 45.

FIG. 46 shows the precharging of the capacitors 45c and the bit lines BL. The switching elements 45a and 45b are in a non-conductive state (turned OFF), and the switching elements 45d and 45f are in the conductive state (turned ON), so that the capacitors 45c are precharged to the second potential level and the bit lines BL are precharged to the first potential level, respectively. In FIG. 46, the portion of the same potential level is indicated by a bold line. After the precharge operation, the switching elements 45d and 45f are made non-conductive (turned OFF), so as to allow the nodes 45n and the bit lines BL to be in a floating state.

Figure 47:
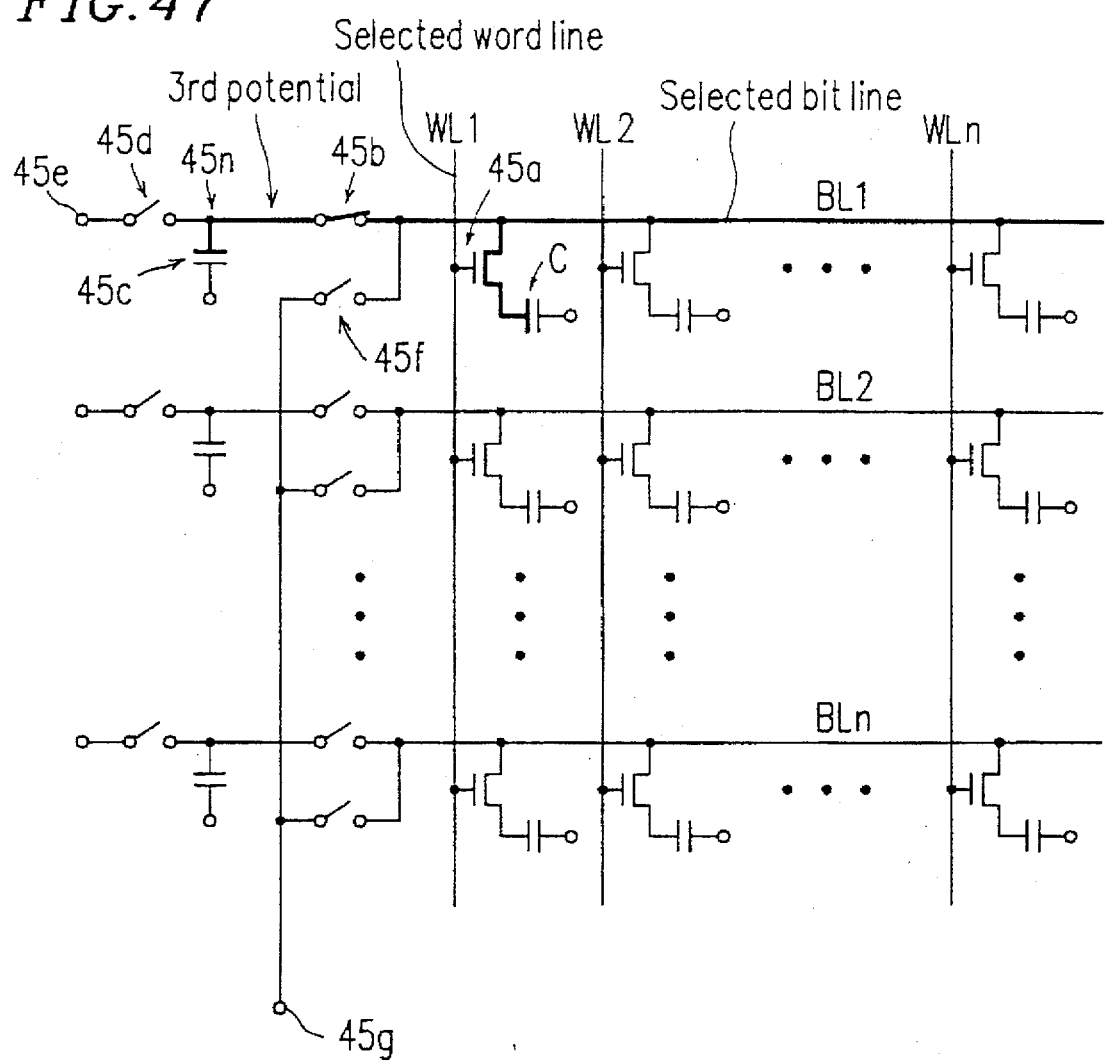
FIG. 47 is a schematic diagram showing a read operation of the semiconductor memory device shown in FIG. 45.

FIG. 47 shows a read operation in the case where the word line $WL_1$ and the bit line $BL_1$ are selected. By turning ON the switching elements 45a and 45b, one electrode of the capacitor C of the selected memory cell, the selected bit line $BL_1$, and the corresponding node 45n are electrically connected so as to realize the third electric potential thereof. In FIG. 47, the portion electrically connected and of the same potential level is indicated by a bold line.

Figure 48:
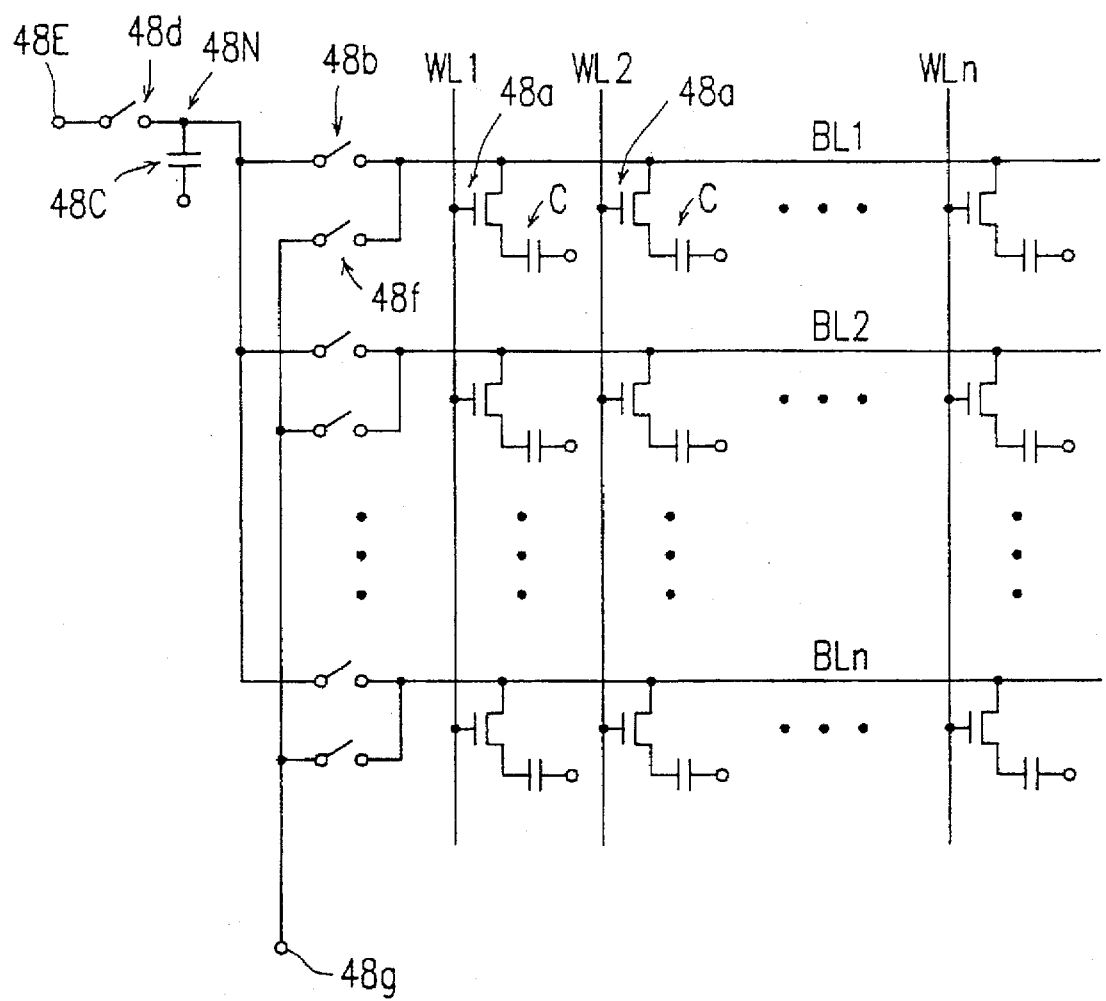
FIG. 48 is a schematic diagram showing a part of the circuitry of a semiconductor memory device in another embodiment of the present invention.

FIG. 48 shows schematically another example in which a node 48N comprising a common capacitance member (capacitor) 48C is provided for the plurality of bit lines BL. Each bit line BL is connected to the node 48N via a corresponding second switching element 48b. The node 48N is coupled to a second potential level 48E which precharges the capacitor 48C via another switching element 48d. Each bit line BL is coupled to a first potential 48g which precharges the bit line BL via a switching element 48f.

Figure 49:
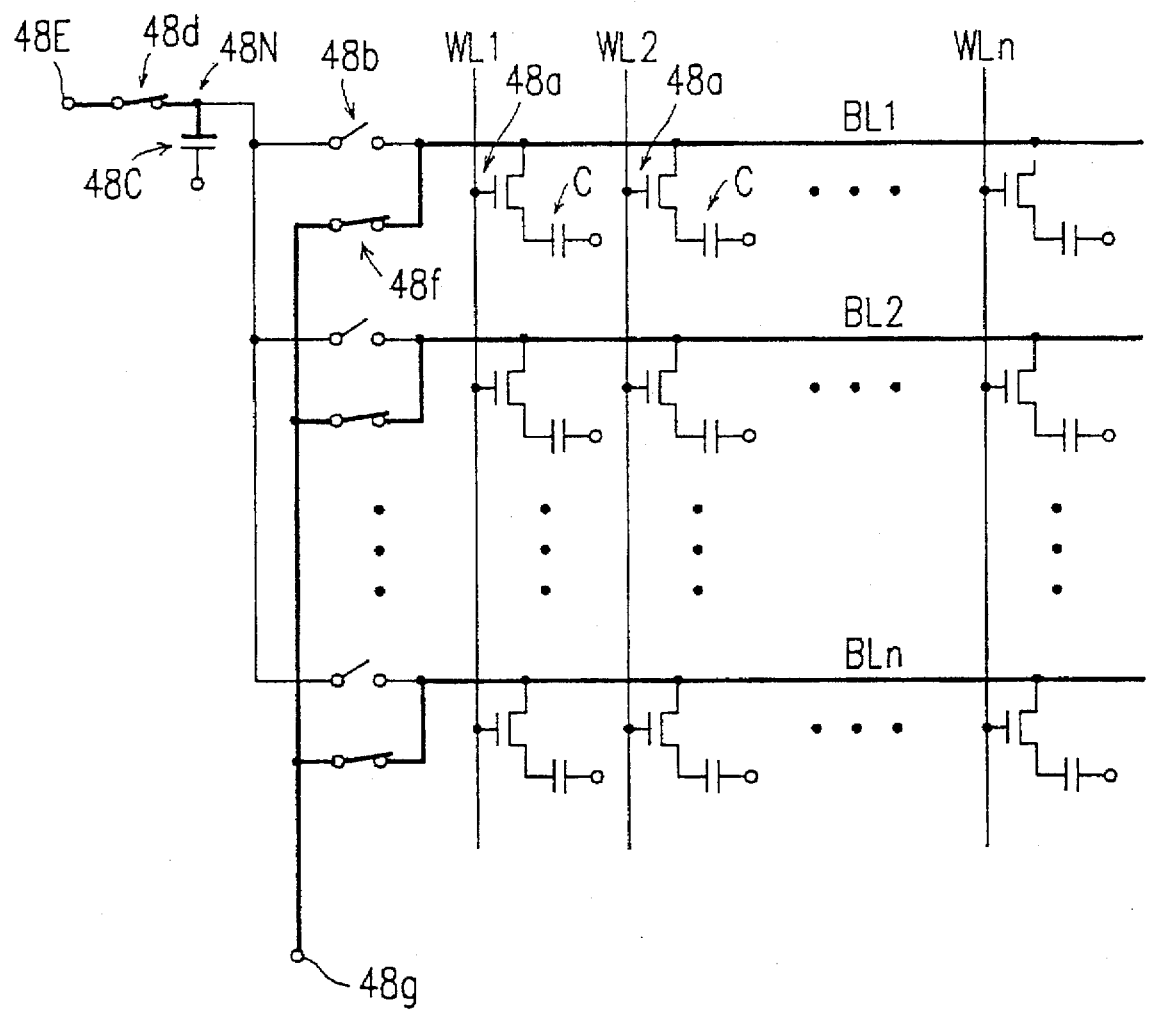
FIG. 49 is a schematic diagram showing a precharge operation of the semiconductor memory device shown in FIG. 48.

FIG. 49 shows the precharging of the capacitor 48C and the bit lines BL. The switching elements 48a and 48b are in the non-conductive state (turned OFF), and the switching elements 48d and 48f are in the conductive state (turned ON), so that the capacitor 48C is precharged to the second potential and the bit lines BL are precharged to the first potential level, respectively. In FIG. 49, the portion of the same potential level is indicated by a bold line. After the precharge operation, the switching elements 48d and 48f are made non-conductive (turned OFF), so as to allow the node 48N and the bit lines BL to be in a floating state.

Figure 50:
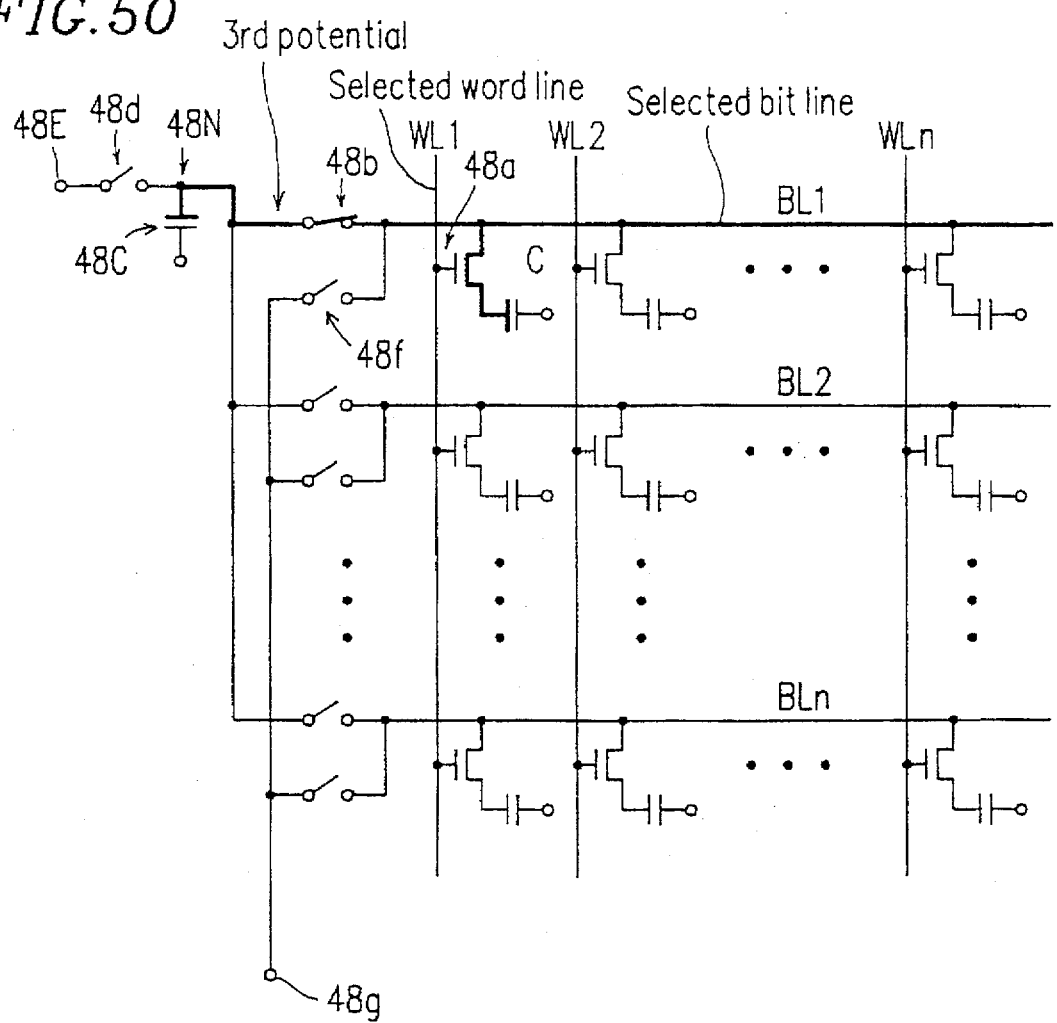
FIG. 50 is a schematic diagram showing a read operation of the semiconductor memory device shown in FIG. 48.

FIG. 50 shows a read operation in the case where the word line $WL_1$ and the bit line $BL_1$ are selected. By turning ON the switching elements 48a and 48b, one electrode of the capacitor C of the selected memory cell and the selected bit line $BL_1$ are electrically connected to the node 48N so as to realize the third electric potential thereof. In FIG. 50, the portion electrically connected and of the same potential level is indicated by a bold line.

The above mentioned switching elements may be transistors or other kind of switches. The predetermined capacitance of the node may be realized by an intentionally designed capacitance such as a capacitor, or by using a parasitic capacitance associated with the node.

In the following explanation, the present invention will be described by using the terms "a common data line" or "a first and second data lines". In this case, the capacitance of the common data line is utilized by allowing the common data line to be the floating state, and each coupling point on the common data line to each bit line is corresponds to the node.

Prior to a read operation, non-selected bit lines are also precharged to the first electric potential by the bit line precharge circuit. When the read operation is started and the signal level of the selected word line becomes active, in all of the memory cells corresponding to the selected word line, a capacitor is electrically connected to the corresponding bit line. Nevertheless, since the non-selected bit lines are not electrically connected to the common data line, the potential levels thereof remain at the first electric potential level. Accordingly, the electric potential of one electrode of the ferroelectric capacitor is the same as that of the other electrode, so that no voltage is applied to between the electrodes.

Accordingly, in each of the memory cells which corresponds to the selected word line and the non-selected bit line (i.e., non-selected memory cells), the polarization state of the ferroelectric film of the capacitor remains unchanged. Thus, the data stored in the non-selected memory cells are not destroyed by the read operation, so that a rewrite operation is not required for the non-selected memory cells.

The electric potential of the selected bit line goes to the third electric potential level by the charge-sharing which occurs with the common data line which is precharged to the second electric potential level. Preferably, the difference between the first and third electric potentials is set larger than the polarization inversion voltage of the ferroelectrtic film of the capacitor. This makes sure to cause the polarization transfer to the positive or negative polarization state in the ferroelectric capacitor of the selected memory cell when the one electrode of the ferroelectric capacitor is electrically connected to the bit line and the common data line, in order to read the data stored in the memory cell without fail.

In the nonvolatile semiconductor memory device of the present invention, the selected bit line is electrically connected to the common data line in the read operation. Accordingly, the data (the corresponding signal level) read out onto the selected bit line is also read out onto the common data line. Thus, by providing a sense amplifier on the common data line so as to amplify the signal level on the common data line, an amplifier which has been required for each bit line (or each bit line pair) in conventional nonvolatile semiconductor memory devices is not necessary in the present invention. The sense amplifier is only required for each common data line (or each common data line pair).

A common data line restore circuit amplifies the signal level read out onto the common data line, and then (or at the same time) amplifies the potential of the common data line to a predetermined level of a write signal so that the corresponding data is restored in the memory cell. A high level of the write signal corresponding to a data "1" is referred to as a fourth electric potential level.

Figure 31:
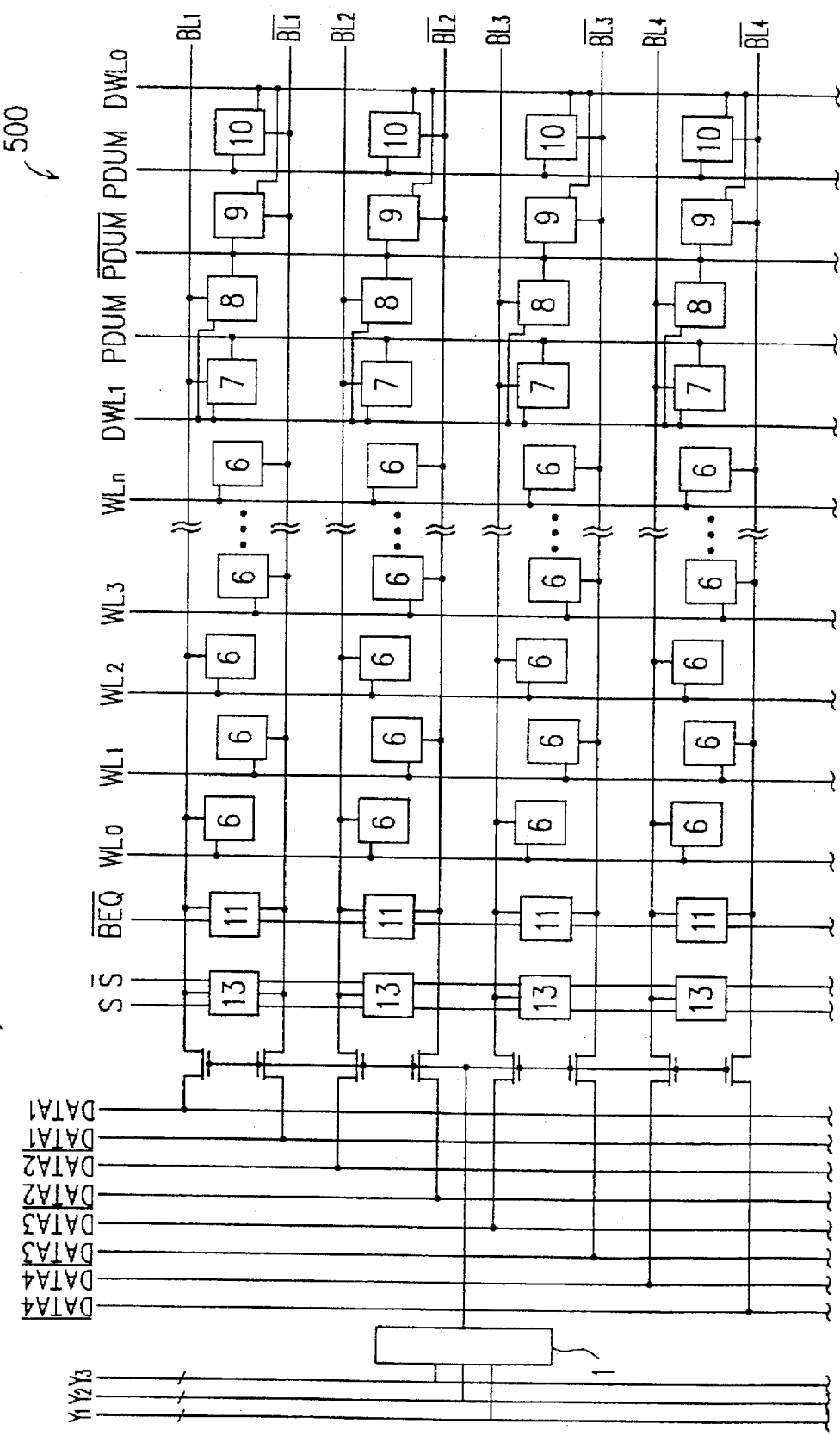
FIG. 31 is a block diagram showing a part of the circuitry of a conventional nonvolatile semiconductor memory device.
Figure 32:
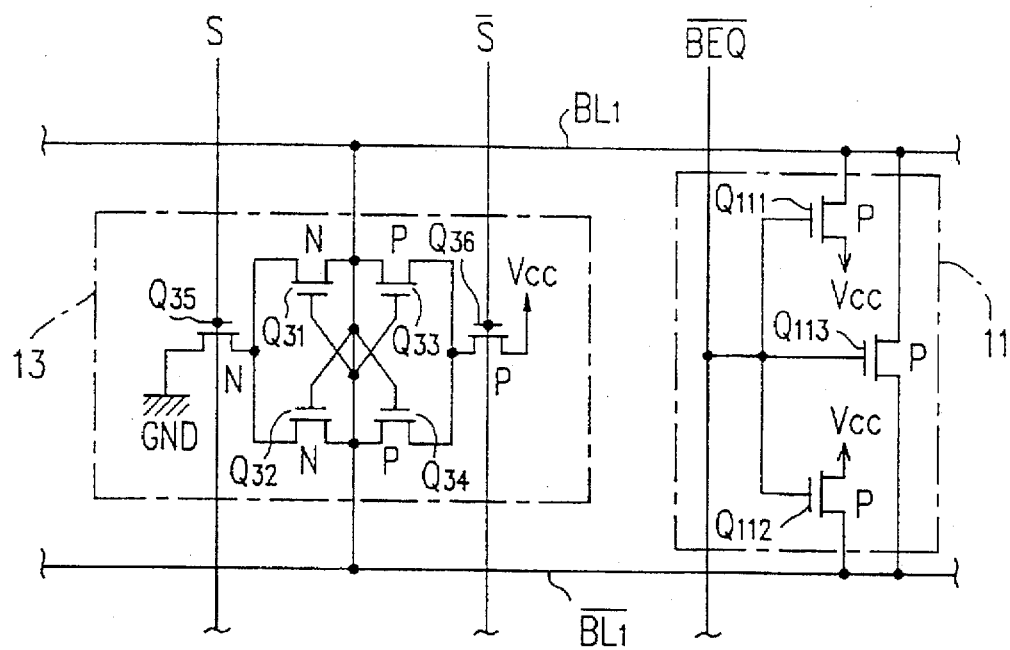
FIG. 32 is a block diagram showing the sense amplifier and the bit-line equalizing circuit shown in FIG. 31 in more detail.

A rewrite operation for non-selected memory cells is not required, so that a restore circuit and a sense amplifier which are required for each bit line (or each bit line pair) in the conventional nonvolatile semiconductor memory devices is not necessary in the present invention. The restore circuit is only required for each common data line (or each common data line pair). Compared with the conventional nonvolatile semiconductor memory device 500 in which, as shown in FIG. 31, the sense amplifier 13 serves as both an amplifier and a restore circuit, the sense amplifier for each bit line pair can be eliminated. This makes it possible to reduce an area for the memory device.

When a word line is selected, gates of the corresponding first switching elements are supplied with a voltage signal having a potential level which is higher than the third electric potential level by an amount of the threshold voltage of the first switching elements. When a bit line is selected, gates of the corresponding second switching elements are supplied with a voltage signal having a potential level which is higher than the fourth electric potential level by an amount of the threshold voltage of the second switching elements. Thus, a voltage of the potential difference between the first and fourth potential levels is certainly applied between both electrodes of the ferroelectric capacitor of the selected memory cell, so that the ferroelectric capacitor is sufficiently charged to cause polarization.

By connecting the other electrodes (i.e., the electrodes which are not connected to the first switching elements) of the ferroelectric capacitors to a common cell plate of the first electric potential level, the structure of the nonvolatile semiconductor memory device can be simplified to allow high integration thereof.

By setting the fourth electric potential equal to a source supply voltage, and the first electric potential equal to half of the source supply voltage, a voltage of half of the source supply voltage is applied between both electrodes of the ferroelectric capacitor of the selected memory cell, so that the ferroelectric capacitor is sufficiently charged to cause polarization.

By setting the fourth electric potential greater than the source supply voltage, and the first electric potential equal to half of the fourth electric potential, a voltage greater than half of the source supply voltage is applied between both electrodes of the ferroelectric capacitor of the selected memory cell, so that the ferroelectric capacitor is sufficiently charged to cause polarization.

When a read operation is performed, prior to turning-ON of the first switching elements, precharging a selected bit line is finished and the bit line is made to float. Then, the ferroelectric capacitor of the selected memory cell is electrically connected to the bit line. Thus, an electric charge which is read out from the selected memory cell does not leak through nodes other than the selected bit line, so that the data stored in the memory cell can be read certainly.

When a read operation is performed, prior to turning-ON of the first and second switching elements, precharging the common data line is finished and the bit line and the common data line are made to float. Then, the ferroelectric capacitor of the selected memory cell is electrically connected to the bit line and to the common data line. Thus, an electric charge which is read out from the selected memory cell does not leak through nodes other than the selected bit line and the common data line, so that the data stored in the memory cell can be read certainly.

In the case where the first and second switching elements are turned-ON at the same time, a third electric potential level is realized by a charge-sharing between the selected bit line which is precharged at the first potential level, the common data line which is precharged at the second potential level, and one electrode of the capacitor in the selected memory cell. Preferably, the second electric potential level is set so that a difference between the third electric potential and the first electric potential of the other electrode of the capacitor is greater than a voltage for inverting the polarization of the ferroelectric film of the capacitor. This makes sure to transfer the polarization state of the ferroelectric capacitor to a positive or negative polarization state so that the data is read out without fail in a read operation.

Next, referring to the drawings, embodiments of the present invention will be described. In the following description, identical components are designated by identical reference numerals to those used in the conventional nonvolatile semiconductor memory device 500.

EXAMPLE 1

FIG. 1 shows a part of the circuitry of a nonvolatile semiconductor memory device 200 of this example. Memory cells 6 of the nonvolatile semiconductor memory device 200 are 1C-1Tr type memory cells in which 1-bit data is stored in a single capacitor.

As shown in FIG. 1, in the nonvolatile semiconductor memory device 200, m pairs of bit lines $BL_1$, $BL_1$ bar, $BL_2$, $BL_2$ bar ..., and $BL_m$, $BL_m$ bar are arranged in the column direction. In the nonvolatile semiconductor memory device 200, n+1 word lines $WL_0$–$WL_n$ each extending along a direction perpendicular to the bit lines are arranged in the row direction. In the read operation, one of the word lines $WL_0$–$WL_n$ is selected based on the row address and set to be at a high level. FIG. 1 shows the case of n+1=64 and m=64.

In parallel to the word lines $WL_0$–$WL_n$, dummy word lines $DWL_0$ and $DWL_1$ and dummy-cell precharge lines PDUM and PDUM bar are disposed. The dummy word line $DWL_0$ goes high when one of the even-numbered word lines $WL_0$, $WL_2$, ... is selected. The dummy word line $DWL_1$ goes high when one of the remaining odd-numbered word lines $WL_1$, $WL_2$, ... is selected. The dummy-cell precharge lines PDUM and PDUM bar go low and high, respectively, by the operation of the control circuit (not shown) prior to the selection of the word line, and go high and low, respectively, by the operation of the control circuit (not shown) after the selected word line returns low.

Adjacent two bit lines $BL_i$ and $BL_i$ bar are paired (FIG. 1 shows the bit-line pair of i=1). To each pair of bit lines $BL_i$ and $BL_i$ bar, a bit-line precharge circuit 4, sixty-four memory cells 6, and four dummy cells 7–10 are connected. For each bit-line pair, respective memory cells 6 are disposed at crossings of one bit line $BL_i$ and the even-numbered word lines $WL_0$, $WL_2$, ..., and crossings of the other bit line $BL_i$ bar and the odd-numbered word lines $WL_1$, $WL_3$, ... Two dummy cells 7 and 8 are disposed correspondingly to the bit line $BL_i$ and the dummy word line $DWL_1$, and two dummy cells 9 and 10 are disposed correspondingly to the bit line $BL_i$ bar and the dummy word line $DWL_0$.

Each pair of the bit lines $BL_i$ and $BL_i$ bar is connected to a pair of common data lines DATA and DATA bar via transistors (switching elements) $Q_1$ and $Q_2$. A column decoder 1 is disposed for each pair of bit lines $BL_i$ and $BL_i$ bar. A row decoder 2 is provided for each word line WL$_j$. For the pair of common data lines DATA and DATA bar, a sense amplifier 3, a restore circuit 5, a common data line precharge circuit 60, and a write circuit 50 are provided.

A pair of bit lines BL$_i$ and BL$_i$ bar and the corresponding column decoder 1, transistors Q$_1$ and Q$_2$, bit-line precharge circuit 4, memory cells 6, and dummy cells 7–10 are referred to as a section 100. FIG. 1 shows three sections 100. A column decoder 1 may be connected to a plurality of bit-line pairs. Nevertheless, in this example, the present invention will be described by using the case that one column decoder 1 is provided for one pair of bit lines BL$_i$ and BL$_i$ bar.

As shown in FIG. 1, the nonvolatile semiconductor memory device 200 includes three row-address predecode signal lines X$_1$–X$_3$ and three column-address predecode signal lines Y$_1$–Y$_3$. A row-address predecode signal which is externally input is applied to the row decoders 2 via the row-address predecode signal lines X$_1$–X$_3$. Similarly, a column-address predecode signal which is externally input is applied to the column decoders 1 via the column-address predecode signal lines Y$_1$–Y$_3$.

Figure 2:
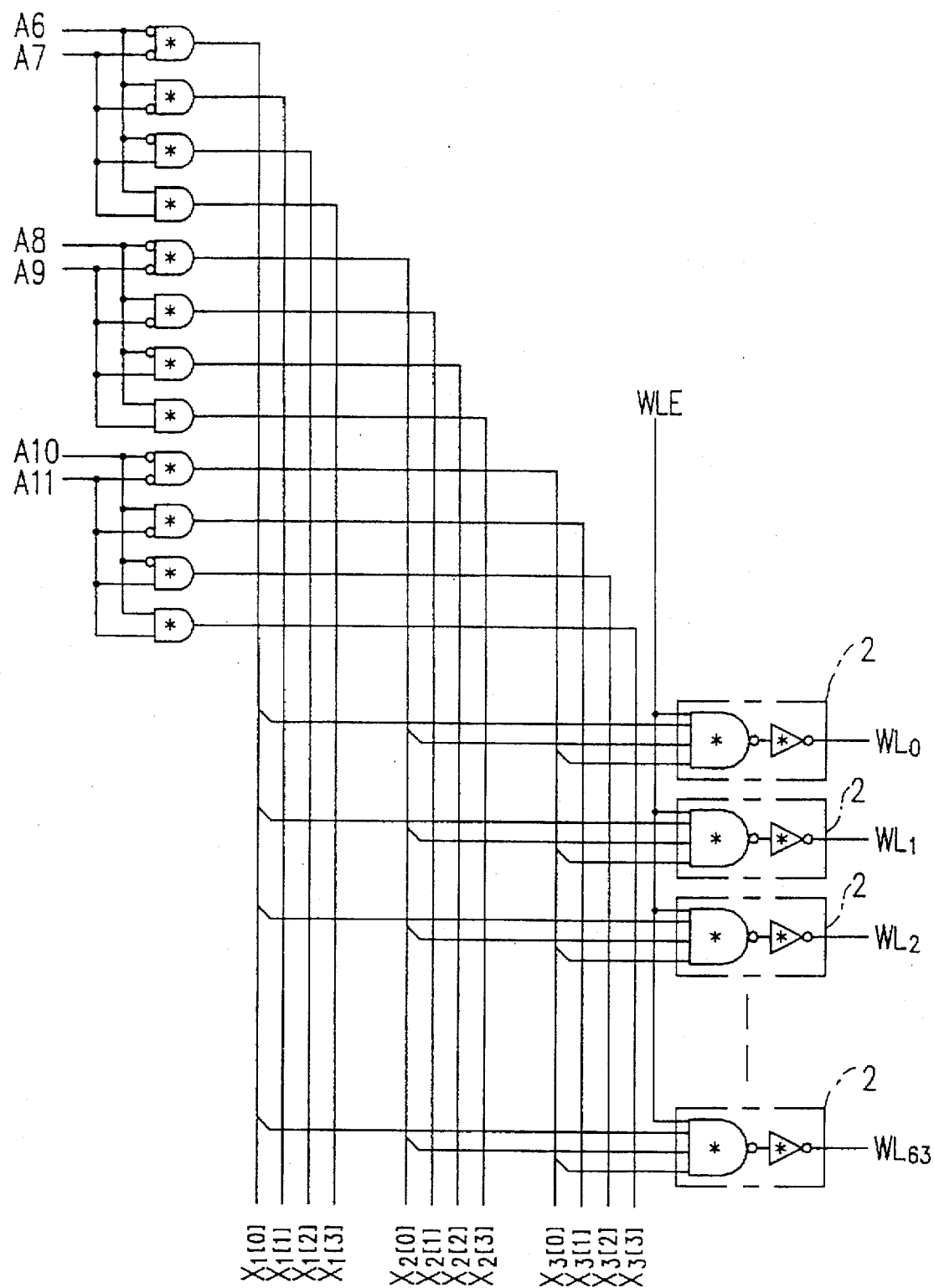
FIG. 2 is a block diagram showing the construction of a row decoder and row-address predecode signal lines shown in FIG. 1.

As shown in FIG. 2, each of the row-address predecode signal lines X$_1$–X$_3$ includes four row-address lines, and one of the four row-address lines is selected in accordance with the applied predecode signal, so as to go high.

For example, the row-address predecode signal line X$_1$ includes four row-address lines X$_{1[0,1,2,3]}$, and one of the four row-address lines X$_{1[0,1,2,3]}$ is selected and goes high in accordance with row-addresses A6 and A7 of the predecode signal. Similarly, the row-address predecode signal line X$_2$ includes four row-address lines X$_{2[0,1,2,3]}$, and one of the four row-address lines X$_{2[0,1,2,3]}$ is selected and goes high in accordance with row-addresses A8 and A9 of the predecode signal. It is the same in the case of the row-address predecode signal line X$_3$. A word line enable signal WLE shown in FIG. 2 goes high after the row-addresses A6–A11 are defined.

In this example, a high level potential (or voltage signal) is set at a predetermined potential level of V$_{pp}$ which is higher than the power source voltage level of V$_{cc}$ by at least the threshold voltage V$_{th}$ of the transistors. That is, V$_{pp}$ is set so as to satisfy an inequality V$_{pp}$>V$_{cc}$+V$_{th}$. The high level of the address signals A0–A11 (shown in FIGS. 2 and 3), the high potential level of the row-address predecode signal lines X$_1$–X$_3$ and the column-address predecode signal lines Y$_1$–Y$_3$, and the high level of the word line enable signal WLE are all set at the predetermined level of V$_{pp}$. The address signals A0–A11 are preferably converted to have the high potential level of V$_{pp}$ by a voltage level convertor (not shown).

Figure 3:
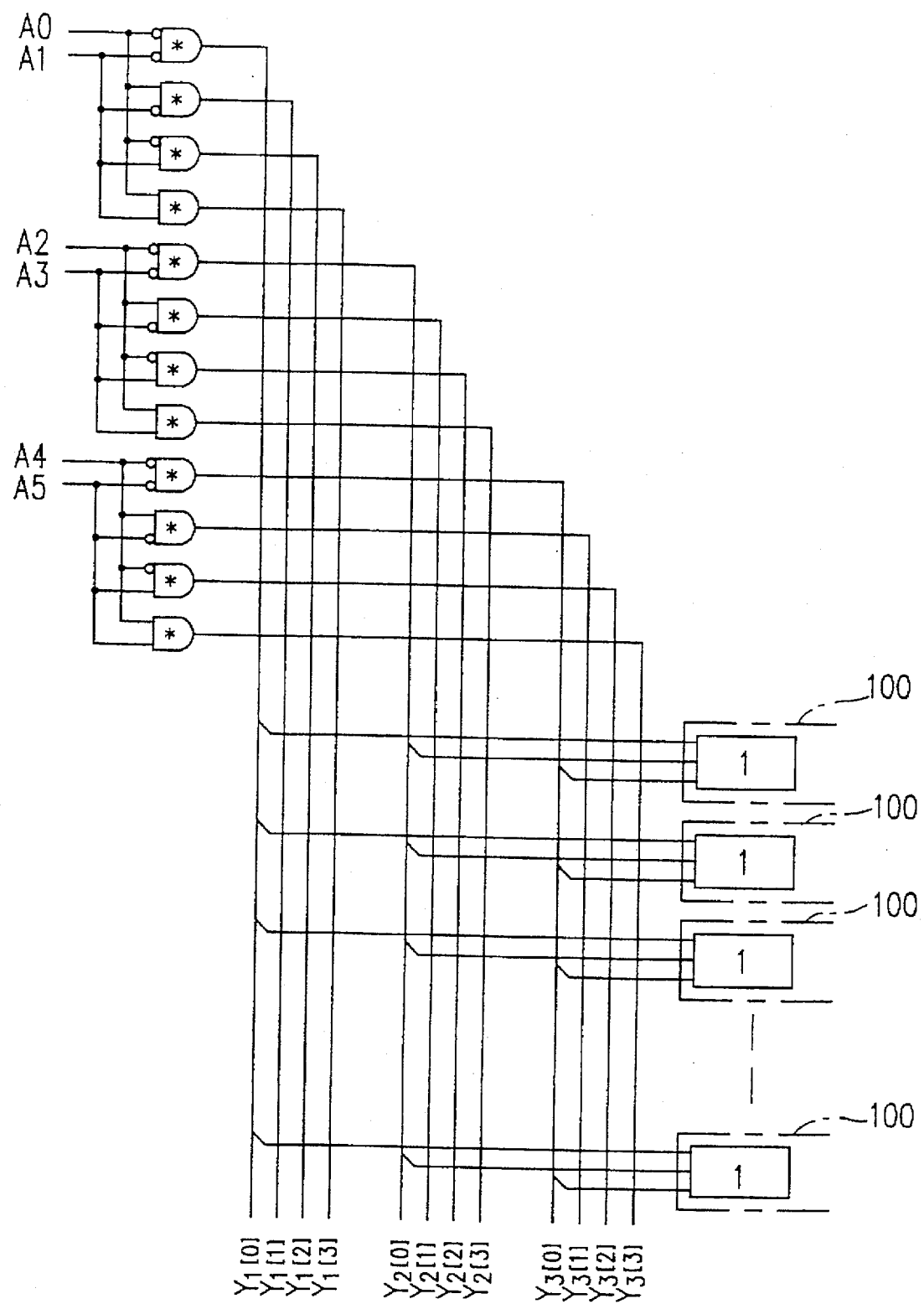
FIG. 3 is a block diagram showing the construction of column-address predecode signal lines shown in FIG. 1.
Figure 4:
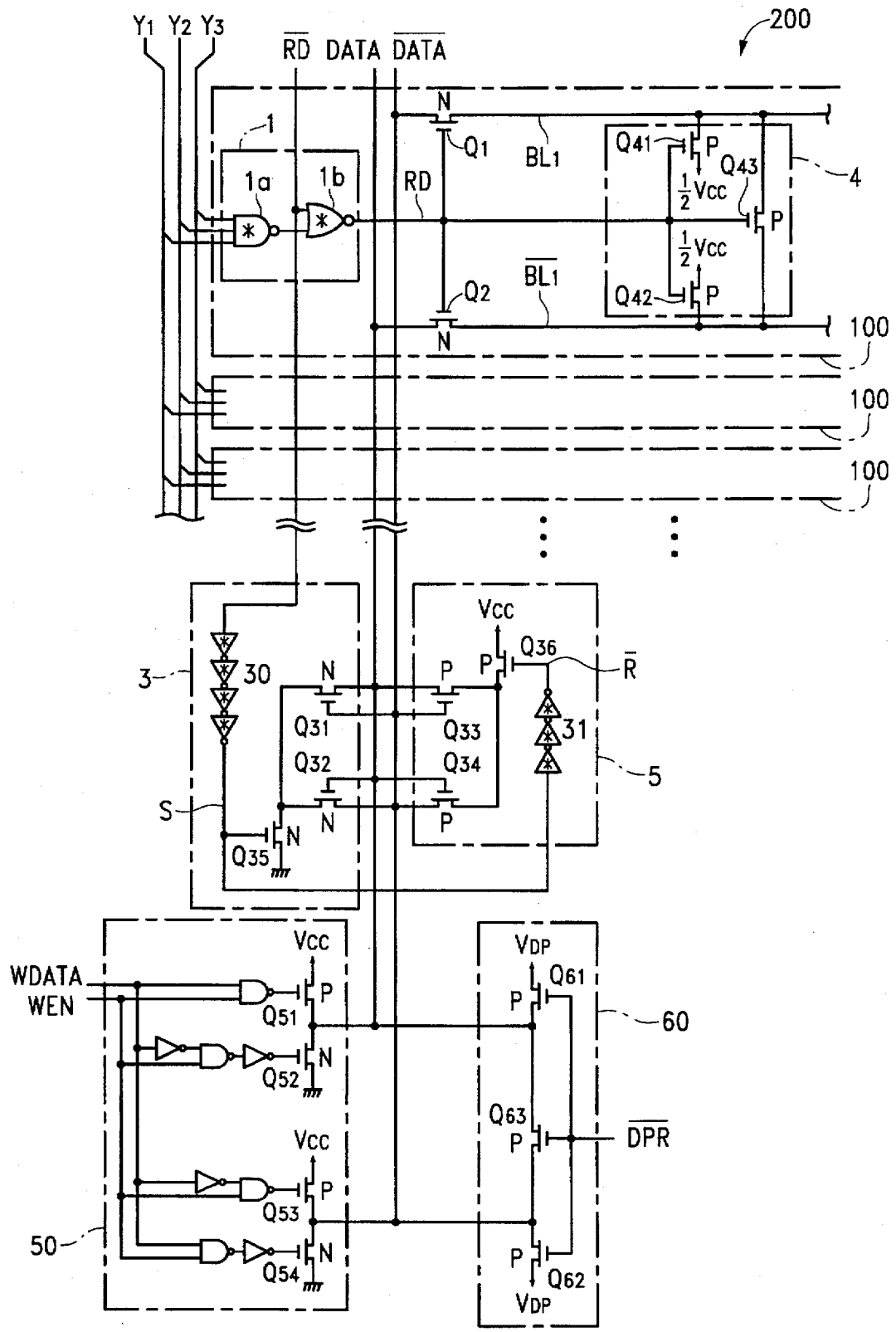
FIG. 4 is a block diagram showing the construction of the circuits shown in FIG. 1 in more detail.

Logic gates marked with an asterisk "*" as shown in FIGS. 2–4 are intended to operate between the high potential level of V$_{pp}$ and the low potential level of the ground GND.

As shown in FIG. 2, three row-address lines are connected to each row decoder 2, which are selected from the respective four row-address lines of the row-address predecode signal lines X$_1$–X$_3$, so as to be a different combination of the row-address lines. A number of the combinations to select one of four row-address lines from each of three row-address predecode signal lines X$_1$–X$_3$ is $4^3$=64, so that sixty-four row addresses can be specified. Accordingly, sixty-four row-address decoders 2 are connected to the row-address predecode signal lines X$_1$–X$_3$. Each row decoder 2 allows the corresponding word line to be active (set at V$_{pp}$) when all of the connected three row-address lines go high (V$_{pp}$). The outputs of the row-decoders 2 are connected to 64 word lines WL$_0$–WL$_{63}$, respectively, and one of the word lines WL$_0$–WL$_{63}$ is selected and goes high (V$_{pp}$) in accordance with an address specified by the predecode signal.

As shown in FIG. 3, similar to the row-address predecode signal lines X$_1$–X$_3$, each of the column-address predecode signal lines Y$_1$–Y$_3$ includes four column-address lines, and one of the four column-address lines is selected in accordance with the applied predecode signal, so as to go high.

For example, the column-address predecode signal line Y$_1$ includes four column-address lines Y$_{1[0,1,2,3]}$, and one of the four column-address lines Y$_{1[0,1,2,3]}$ is selected and goes high in accordance with column-addresses A0 and A1 of the predecode signal. Similarly, the column-address predecode signal line Y$_2$ includes four column-address lines Y$_{2[0,1,2,3]}$, and one of the four column-address lines Y$_{2[0,1,2,3]}$ is selected and goes high in accordance with column-addresses A2 and A3 of the predecode signal. It is the same in the case of the column-address predecode signal line Y$_3$.

As shown in FIG. 3, three column-address lines are connected to each column decoder 1, which are selected from the respective four column-address lines of the column-address predecode signal lines Y$_1$–Y$_3$, so as to be a different combination of the column-address lines. A number of the combinations to select one of four column-address lines from each of three column-address predecode signal lines Y$_1$–Y$_3$ is $4^3$=64, so that sixty-four column addresses can be specified. Accordingly, sixty-four column-address decoders 1 are connected to the column-address predecode signal lines Y$_1$–Y$_3$. An output signal of each column decoder 1 goes high (V$_{pp}$) when all of the connected three column-address lines go high (V$_{pp}$). The output of each column-decoders 1 is connected to a respective pair of the bit lines BL$_i$ and WL$_i$ bar, and one of bit-line pair BL$_i$ and BL$_i$ bar is selected and goes high (V$_{pp}$) in accordance with an address specified by the predecode signal.

Figure 33:
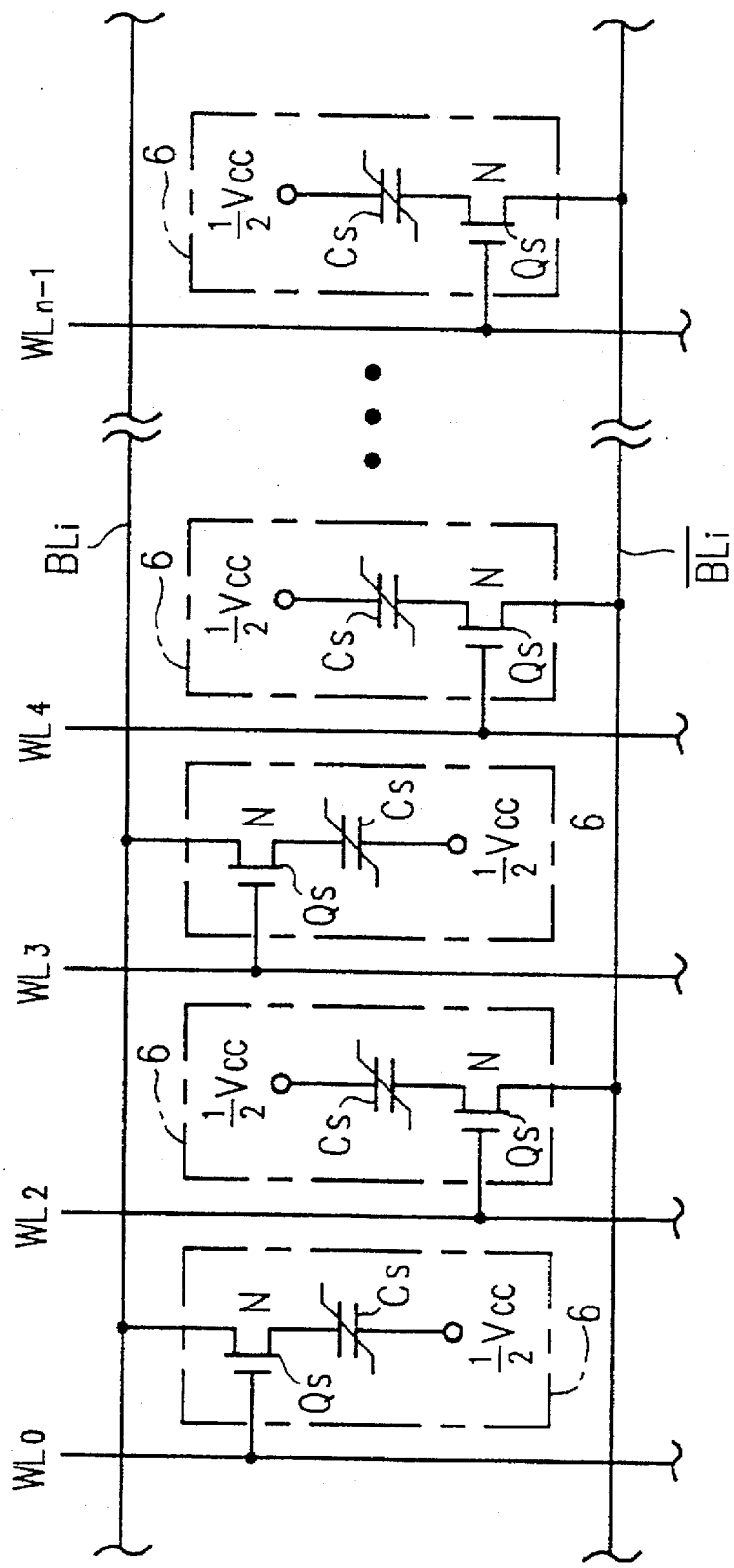
FIG. 33 is a diagram showing the specific circuitry of a memory cell of the conventional nonvolatile semiconductor memory device shown in FIG. 31.
Figure 34:
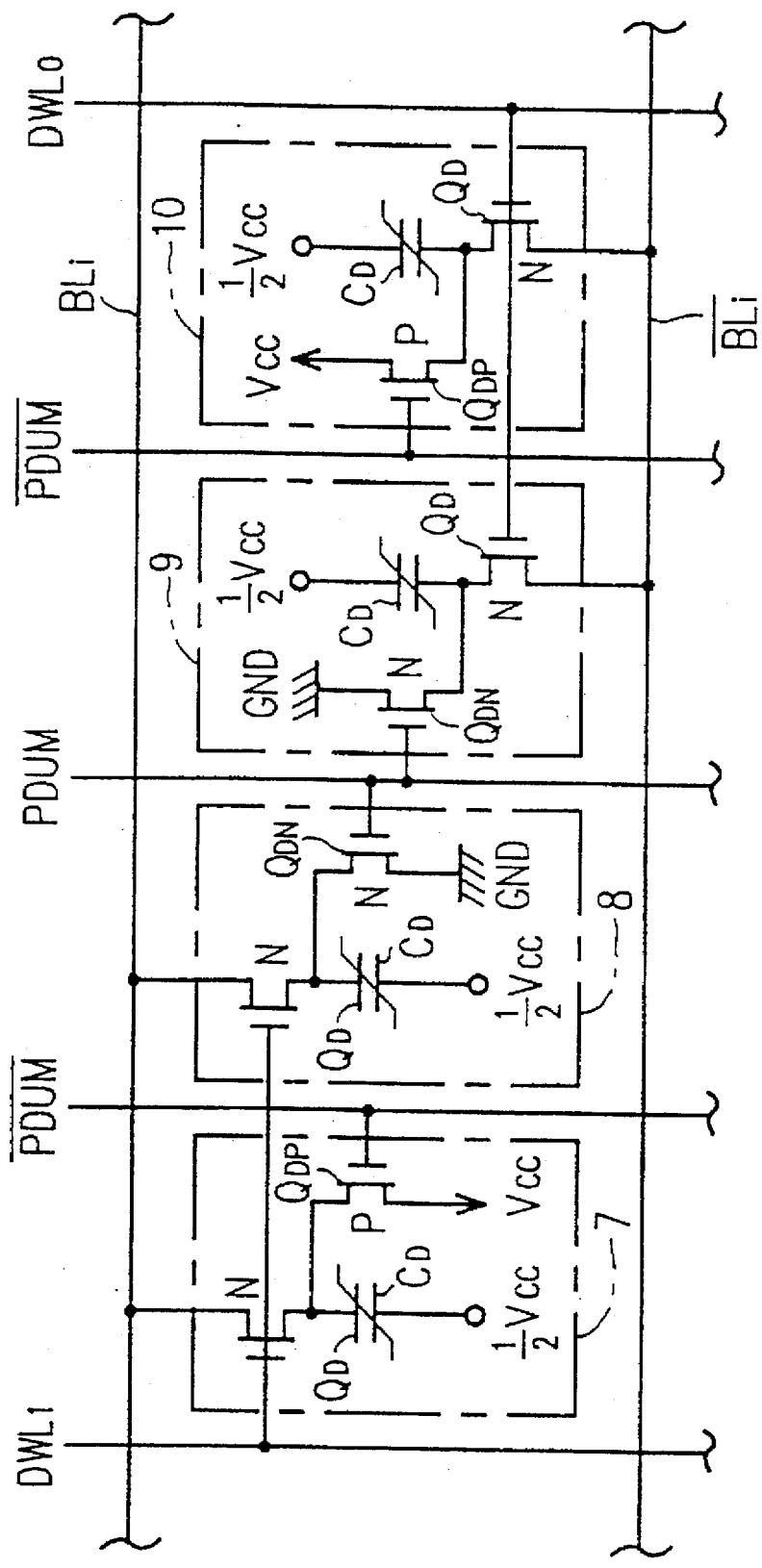
FIG. 34 is a diagram showing the specific circuitry of a dummy cell of the conventional nonvolatile semiconductor memory device shown in FIG. 31.
Figure 43:
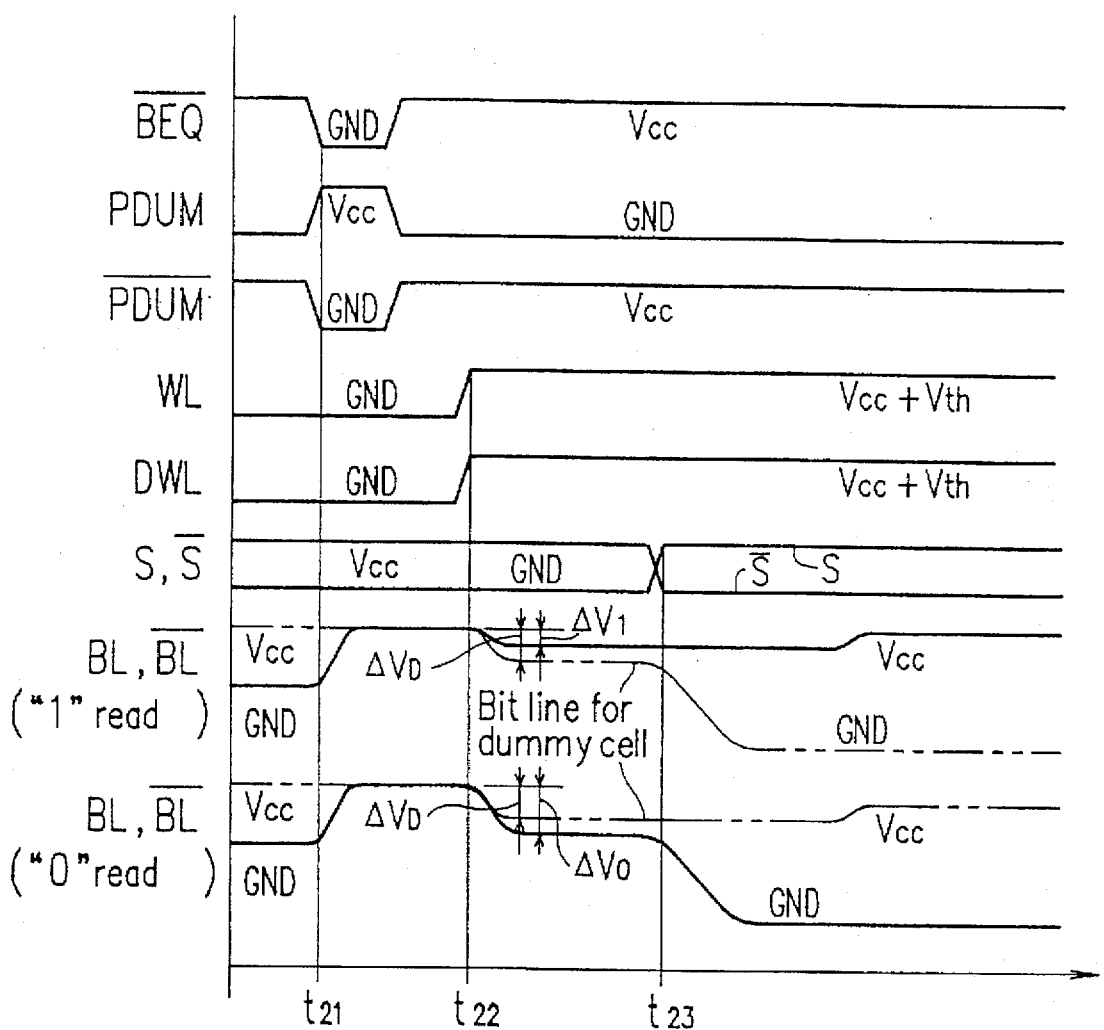
FIG. 43 is a timing diagram showing the read operation in the conventional nonvolatile semiconductor memory device.
Figure 44:
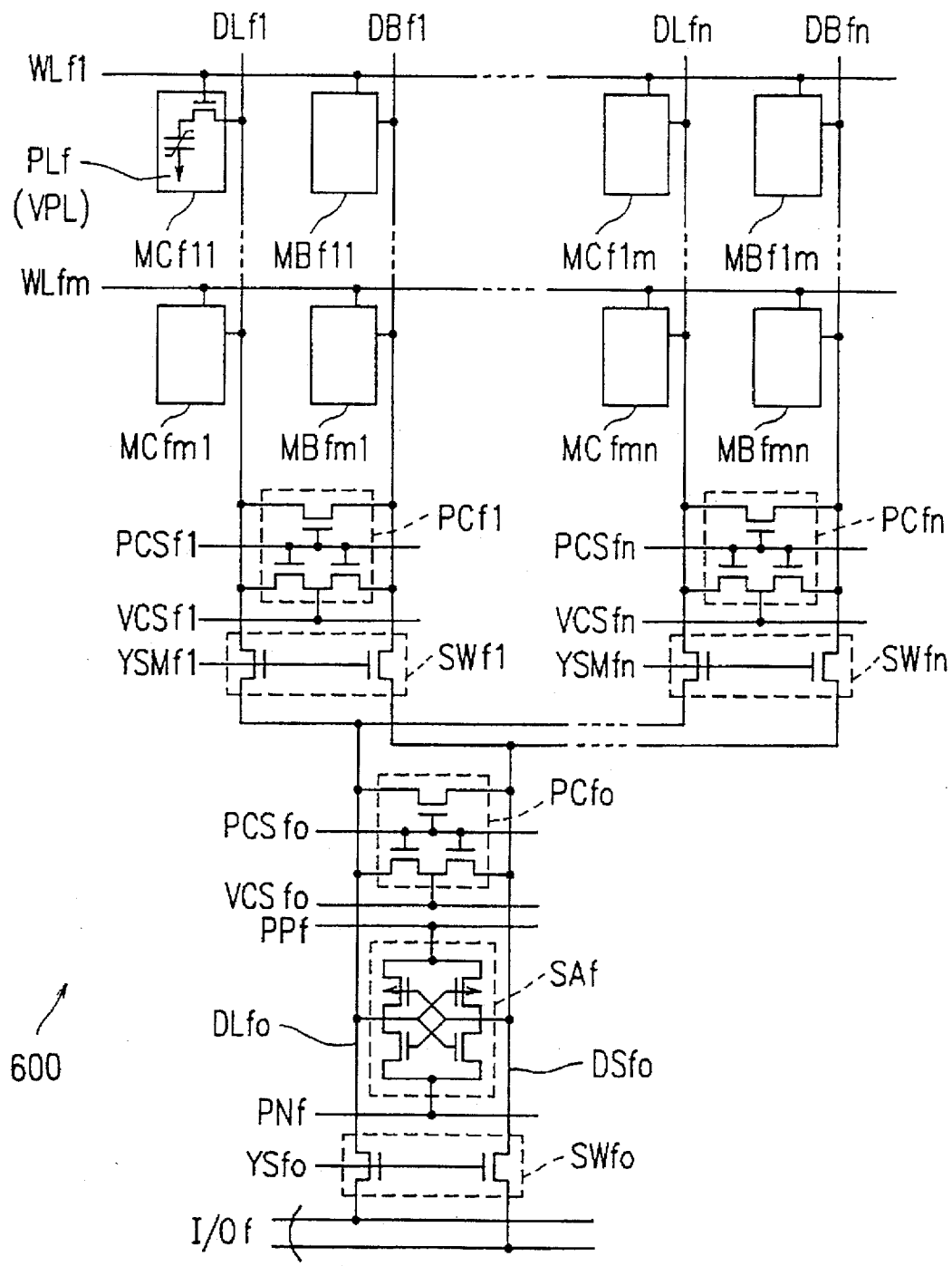
FIG. 44 is a block diagram showing a part of the circuitry of another conventional nonvolatile semiconductor memory device.

Next, the circuit configuration of the nonvolatile semiconductor memory device 200 is described in more detail. In this specification, each signal (for example, a bit-line read signal) and the corresponding line for carrying the signal (for example, a bit-line read signal line) will be denoted by the same symbol RD. A person having ordinary skill in the art can understand such convention without confusion. The construction of the memory cell 6 and the dummy cells 7–10 is identical with that of conventional ones as described above. As shown in FIG. 33, each memory cell 6 includes a capacitor C$_s$ having a ferroelectric film between the electrodes and an N-channel MOSFET Q$_s$. One of the electrodes of the capacitor C$_s$ is connected to the bit line BL$_i$ or BL$_i$ bar via the source-drain of the transistor Q$_s$. The other electrode of the capacitor C$_s$ is connected to a common cell plate to which half of the supply voltage V$_{cc}$ is supplied. Potential levels for storing data (i.e., voltage levels of a write signal supplied to one electrode of the capacitor of the memory cell 6) is intended to be V$_{cc}$ level for a data "1", and GND level for a data "0" in this example. The gate of the transistor Q$_s$ is connected to the corresponding one of the word lines WL$_0$–WL$_n$.

As shown in FIG. 4, the column decoder 1 includes a three-input NAND gate 1a and a NOR gate 1b. Three address lines coupled from the column-address predecode signal lines Y$_1$–Y$_3$ are connected to the three inputs of the NAND gate 1a, respectively. An output of the NAND gate 1a and a bit-line selection signal RD bar are coupled to inputs of NOR gate 1b, respectively. The bit-line selection signal RD bar goes low at the same time when a potential of the selected word line WL goes high, and goes high ($V_{pp}$) at the same time when the potential of the selected word line WL goes low, by the operation of the control circuit (not shown). An output of the NOR gate 1b is coupled to a bit-line read signal line RD. Thus, the bit-line read signal RD goes high ($V_{pp}$) only when the bit-line selection signal RD bar goes low and the output of the NAND gate 1a goes low.

As shown in FIG. 4, a bit line $BL_i$ of each pair of bit lines $BL_i$ and $BL_i$ bar is connected to a common data line DATA via the source-drain of N-channel MOSFET $Q_1$. The bit line $BL_i$ bar of the pair of bit lines $BL_i$ and $BL_i$ bar is connected to a common data line DATA bar via the source-drain of N-channel MOSFET $Q_2$. The data lines DATA and DATA bar form a pair. The gates of the transistors $Q_1$ and $Q_2$ are connected to a bit-line read signal line RD from the column decoder 1.

When the bit-line read signal RD goes high ($V_{pp}$), the bit line $BL_i$ and the common data line DATA are electrically connected via the transistor $Q_1$, and the bit line $BL_i$ bar and the common data line DATA bar are electrically connected via the transistor $Q_2$. As seen from the setting of the high level potential $V_{pp}$, a signal having potential level of $V_{cc}$, GND, or an intermediate level thereof can be transferred via the transistors $Q_1$ and $Q_2$ without being affected by the threshold voltage of the transistors $Q_1$ and $Q_2$.

As shown in FIG. 4, the bit-line precharge circuit 4 is connected to a pair of bit lines $BL_i$ and $BL_i$ bar. The bit-line precharge circuit 4 includes three P-channel MOSFETs $Q_{41}$–$Q_{43}$. The source of the transistor $Q_{41}$ is connected to a (½)$V_{cc}$ power supply which supplies a voltage of half of the supply voltage $V_{cc}$. The drain of the transistor $Q_{41}$ is connected to one bit line $BL_i$. The source of the transistor $Q_{42}$ is connected to the (½)$V_{cc}$ power supply and the drain thereof is connected to the other bit line $BL_i$ bar. The drain of the transistor $Q_{43}$ is connected to one bit line $BL_i$, and the source thereof is connected to the other bit line $BL_i$ bar. The gates of the transistors $Q_{41}$–$Q_{43}$ all connected to the bit-line read signal line RD.

The bit-line read signal RD is at a low level when the pair of bit lines $BL_i$ and $BL_i$ bar are not selected. Accordingly, when the bit-line pair is not selected, or by setting the bit-line read signal RD at the low level prior to the selection of the bit line pair, the bit lines $BL_i$ and $BL_i$ bar of the bit-line pair are precharged to the voltage of (½)$V_{cc}$ which is a half of the power supply voltage, via the transistors $Q_{41}$ and $Q_{42}$. At the same time, the potentials of the bit lines $BL_i$ and $BL_i$ bar are equalized by the transistor $Q_{43}$. The bit-line read signal RD goes high when the pair of bit lines $BL_i$ and $BL_i$ bar are selected, and the transistors $Q_{41}$–$Q_{43}$ are turned-OFF (in a non-conductive state).

As shown in FIG. 4, the sense amplifier 3 is connected to the pair of common data lines DATA and DATA bar. The sense amplifier 3 differentially amplifies a small potential difference between the common data lines DATA and DATA bar by using two N-channel MOSFETs $Q_{31}$ and $Q_{32}$, so as to make the signal level valid. At this time, a lower potential level of the common data lines DATA and DATA bar is set at a ground level GND. The transistors $Q_{31}$ and $Q_{32}$ are connected to the ground GND via an N-channel MOSFET $Q_{35}$. The gate of the transistor $Q_{35}$ is connected to a sense-amplifier driving signal line S.

The sense-amplifier driving signal S is generated from the bit-line selection signal RD bar via a series of four-stage delay inverters 30. The sense-amplifier driving signal S goes high after a small potential difference is read from the memory cell 6 and the corresponding pair of the dummy cells 7–10 onto the common data lines DATA and DATA bar in a read operation, as will be discussed later.

As shown in FIG. 4, the restore circuit 5 is connected to the pair of common data lines DATA and DATA bar. The restore circuit 5 amplifies a higher signal level of the common data lines DATA and DATA bar to the source supply voltage $V_{cc}$ by using two P-channel MOSFETs $Q_{33}$ and $Q_{34}$, so as to restore the amplified signal. The transistors $Q_{33}$ and $Q_{34}$ are connected to the source supply voltage $V_{cc}$ via a P-channel MOSFET $Q_{36}$. The gate of the transistor $Q_{36}$ is connected to a restore-circuit driving signal line R bar.

The restore-circuit driving signal R bar is generated from the sense-amplifier driving signal S via a series of three-stage delay inverters 31. The restore-circuit driving signal R bar goes low after the small potential difference between the common data lines DATA and DATA bar is amplified to make a signal level valid by the sense amplifier 3 in the read operation.

As shown in FIG. 4, the common data line precharge circuit 60 is connected to the pair of common data lines DATA and DATA bar. The common data line precharge circuit 60 includes three P-channel MOSFETs $Q_{61}$–$Q_{63}$. The source of the transistor $Q_{61}$ is connected to a predetermined voltage $V_{DP}$, and the drain thereof is connected to one common data line DATA. The source of the transistor $Q_{62}$ is connected to the predetermined voltage $V_{DP}$, and the drain thereof is connected to the other common data line DATA bar. The drain of the transistor $Q_{63}$ is connected to one common data line DATA, and the source thereof is connected to the other common data line DATA bar. The gates of the transistors $Q_{61}$–$Q_{63}$ are all connected to a common data line precharge signal line DPR bar.

The common data line precharge signal DPR bar goes low after a potential level of the selected word line WL goes low, and goes high ($V_{DP}$) prior to a selection of the word line WL, by an operation of the control circuit (not shown). Thus, the pair of the common data lines DATA and DATA bar are precharged to the predetermined voltage $V_{DP}$ via the transistors $Q_{61}$ and $Q_{62}$ by lowering the common data line precharge signal DPR bar. At the same time, the potentials of the common data lines DATA and DATA bar are equalized by the transistor $Q_{63}$. When the common data line precharge signal DPR bar is at the high level ($V_{DP}$), the transistors $Q_{61}$–$Q_{63}$ are turned-OFF (in a non-conductive state).

The potential level $V_{DP}$ for precharging the common data lines DATA and DATA bar is determined as follows:

In the read operation, when the transistors $Q_1$ and $Q_2$ are turned-ON so as to electrically connect the common data line DATA (DATA bar) which is precharged to the potential level $V_{DP}$ by the common data line precharge circuit 60 and the selected bit line BL (BL bar) which is precharged to the potential level (½)$V_{cc}$ by the bit line precharge circuit 4, suppose an electric potential $V_{DP2}$ is realized, as described below, by a charge-sharing between the common data line DATA (or DATA bar) and the selected bit line BL (or BL bar). Suppose a capacitance of the bit line BL (BL bar) is $C_{BL}$, and that of the common data line DATA (or DATA bar) is $C_{DL}$. When the common data line and the corresponding bit line are electrically connected, a electric charge is transferred between the common data line and the bit line, resulting in the potential level $V_{DP2}$ as expressed by the following Equation (6).

$$\Delta V_{DP2} = \frac{V_{DP} \cdot C_{DL} + (1/2)V_{cc} \cdot C_{BL}}{C_{DL} + C_{BL}} \quad (6)$$

Figure 5:
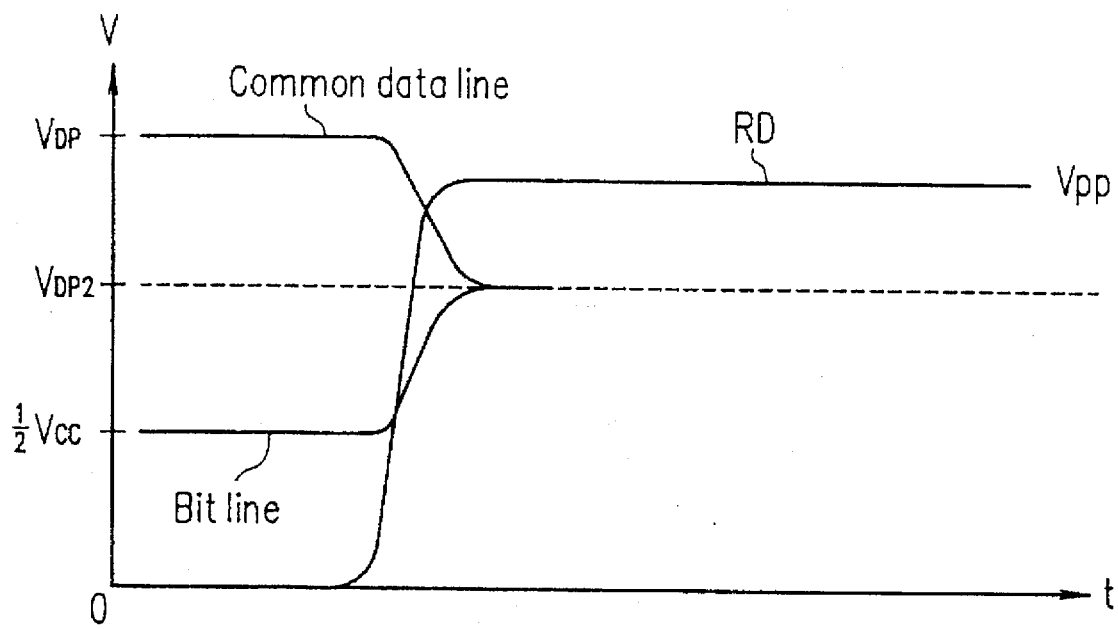
FIG. 5 is a diagram showing changes in the electric potentials of a bit line and a common data line when the bit line and the common data line are electrically connected in the nonvolatile semiconductor memory device in one embodiment of the present invention.

FIG. 5 shows schematically the change of the potential levels due to the charge-sharing. In FIG. 5, an effect of electrically connecting the bit line and the capacitor of the memory cell is neglected. When the bit line read signal RD changes from low to high ($V_{pp}$), the transistors $Q_1$ and $Q_2$ turn-ON and the respective potential levels of the common data line and the bit line become the intermediate potential level of $V_{DP2}$.

Figure 6:
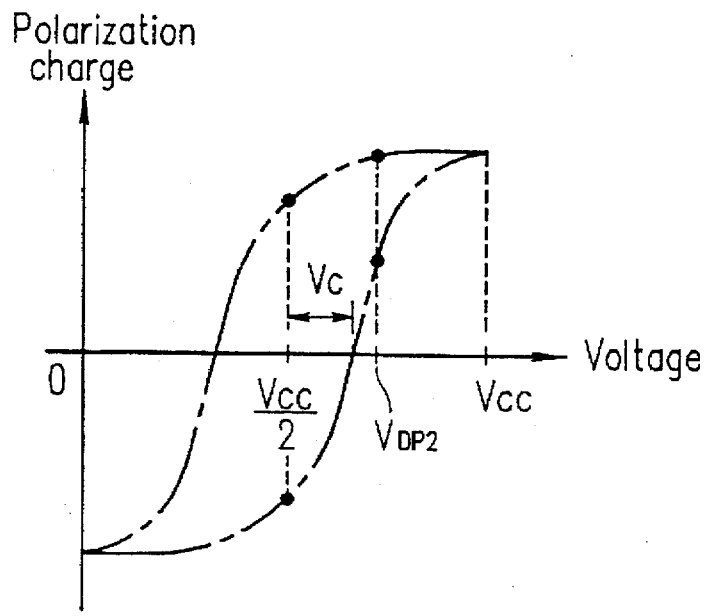
FIG. 6 is a diagram showing the polarization characteristics of a ferroelectric film of a capacitor of a memory cell in the nonvolatile semiconductor memory device in one embodiment of the present invention.

FIG. 6 shows the polarization characteristics (i.e., electric potential dependence of the polarization charge) of the ferroelectric film of the capacitor $C_s$. In this example, the other electrode of the capacitor $C_s$ is set at the potential level of $(\frac{1}{2})V_{cc}$, so that the curve of the polarization characteristics shown in FIG. 6 is symmetric with respect to the potential level of $(\frac{1}{2})V_{cc}$. The polarization inversion voltage $V_c$ is, as shown in FIG. 6, a voltage across the electrodes of the capacitor $C_s$ at which the polarization charge changes from positive to negative and vice versa.

The precharge potential level $V_{DP}$ of the common data line is set sufficiently high so as to satisfy the following Equation (7).

$$V_{DP2} - (1/2)V_{cc} = \frac{V_{DP} \cdot C_{DL} + (1/2)V_{cc} \cdot C_{BL}}{C_{DL}(1/2)V_{cc} + C_{BL}} - (1/2)V_{cc} > V_c \quad (7)$$

As shown in FIG. 6 and Equation (7), the precharge potential level $V_{DP}$ is determined so that the difference between the potential level $V_{DP2}$ and the potential level $(\frac{1}{2})V_{cc}$ is larger than the polarization inversion voltage $V_c$ of the capacitor $C_s$. In addition, as shown in FIG. 6, the potential level $V_{DP2}$ is set with respect to the source supply voltage $V_{cc}$ so as to satisfy the inequality $V_{DP2} \leq V_{cc}$.

As shown in FIG. 4, the write circuit 50 is connected to the pair of common data lines DATA and DATA bar. The write circuit 50 includes two P-channel MOSFETs $Q_{51}$ and $Q_{53}$, two N-channel MOSFETs $Q_{52}$ and $Q_{54}$, four NAND gates, and four inverters. The source of the transistor $Q_{51}$ is connected to the source supply voltage $V_{cc}$, and the drain thereof is connected to one common data line DATA. The source of the transistor $Q_{52}$ is connected to the ground GND, and the drain thereof is connected to the one common data line DATA. The source of the transistor $Q_{53}$ is connected to the source supply voltage $V_{cc}$, and the drain thereof is connected to the other common data line DATA bar. The source of the transistor $Q_{54}$ is connected to the ground GND, and the drain thereof is connected to the other common data line DATA bar. The gates of the transistors $Q_{51}$–$Q_{54}$ are supplied with respective signals which are output from the NAND gates and the inverters in accordance with values of a write data signal WDATA and the write signal WEN.

When the write signal WEN is low, the gates of the transistors $Q_{51}$ and $Q_{53}$ go high ($V_{cc}$), while the gates of the transistors $Q_{52}$ and $Q_{54}$ go low. Accordingly, all of the four transistors $Q_{51}$–$Q_{54}$ turn-OFF, so that the common data lines DATA and DATA bar are not affected.

When the write signal WEN is high ($V_{cc}$) and the write data signal WDATA is low (corresponds to the data "0"), the gates of the transistors $Q_{51}$ and $Q_{52}$ go high ($V_{cc}$), while the gates of the transistors $Q_{53}$ and $Q_{54}$ go low. Accordingly, the common data line DATA is electrically connected to the low level potential and the common data line DATA bar is electrically connected to the high level potential ($V_{cc}$), so that the data "0" is written onto the pair of common data lines DATA and DATA bar.

When the write signal WEN is high ($V_{cc}$) and the write data signal WDATA is high (corresponds to the data "1"), the gates of the transistors $Q_{51}$ and $Q_{52}$ go low, while the gates of the transistors $Q_{53}$ and $Q_{54}$ go high ($V_{cc}$). Accordingly, the common data line DATA is electrically connected to the high level potential ($V_{cc}$) and the common data line DATA bar is electrically connected to the low level potential, so that the data "1" is written onto the pair of common data lines DATA and DATA bar.

Next, the read and write operations for the memory cells 6 in the nonvolatile semiconductor memory device 200 are described. In the following explanation, a word line WL indicates any one of the word lines $WL_0$–$WL_n$ selected in the write or read operation. A bit line BL indicates one bit line of a selected pair of bit lines $BL_i$ and $BL_i$ bar, which is connected to the selected memory cell 6 which is connected to the selected word line WL. Similarly, a bit line BL bar indicates the other of the selected pair of bit lines $BL_i$ and $BL_i$ bar, which is connected to the corresponding dummy cells.

First, the read operation of the nonvolatile semiconductor memory device 200 will be described with reference to the drawings. Suppose the data "1" or "0" has been already stored in the memory cell 6 by the write operation as will be described later.

Figure 7:
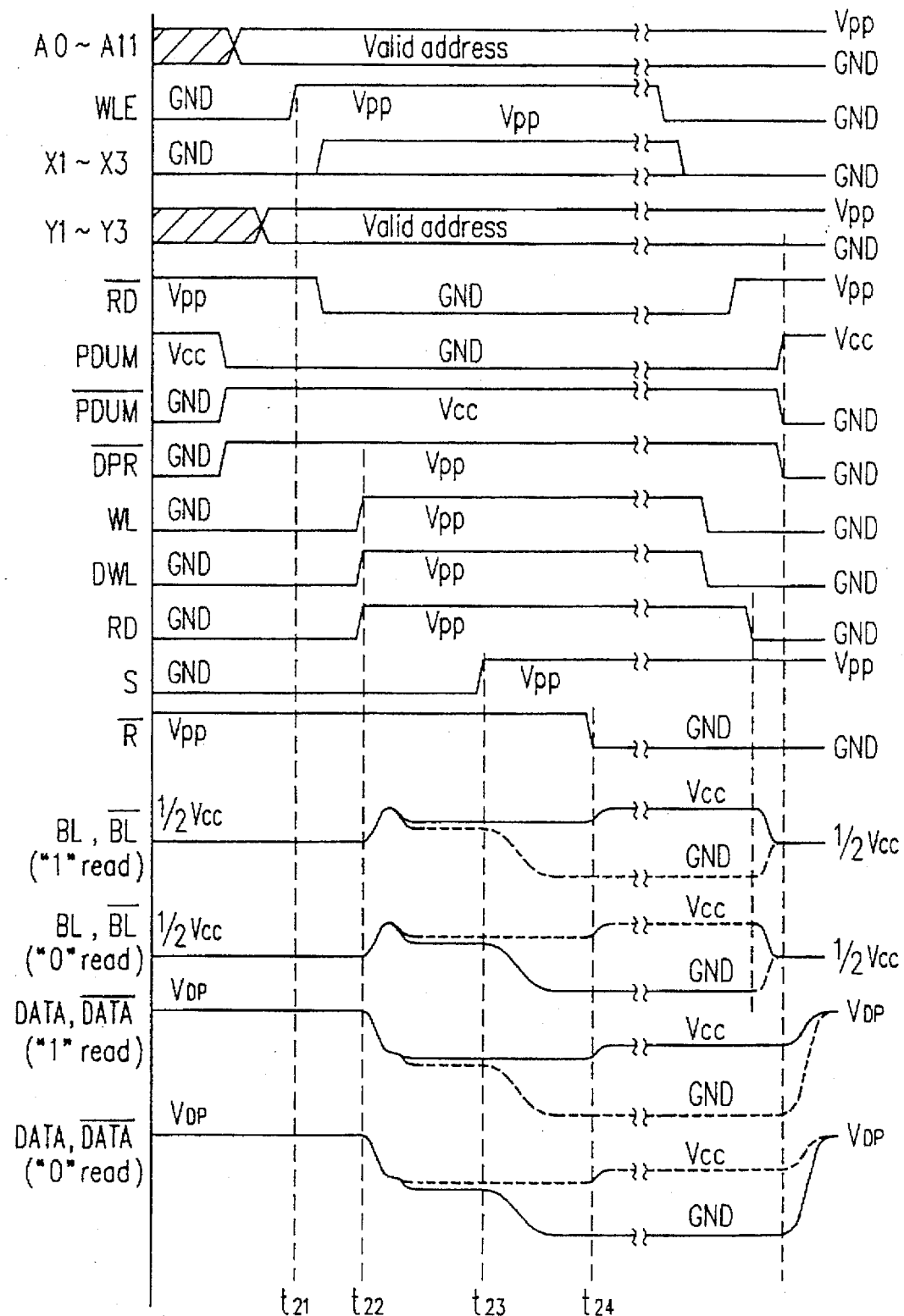
FIG. 7 is a timing diagram showing the read operation of a selected bit line in the nonvolatile semiconductor memory device in one embodiment of the present invention.

FIG. 7 shows a read operation for the selected bit line BL. Prior to the read operation, by allowing the bit-line selection signal RD bar to go high, the bit-line line read signal RD goes low, so that the bit-line precharge circuit 4 is driven to precharge the bit lines BL and BL bar to a voltage which is half of the supply voltage $V_{cc}$. By allowing the dummy cell precharge lines PDUM and PDUM bar to go high and low, respectively, a positive or negative remanent polarization charge is stored in a ferroelectric film of each of the dummy capacitors $C_D$ of the dummy cells 7–10. The remanent polarization charge of the dummy capacitor $C_D$ is half the amount of that of the ferroelectric capacitor $C_s$ of the memory cell 6, as in the case of the conventional nonvolatile semiconductor memory device 500. At the same time, by allowing the common data line precharge signal DPR bar to go low, the common data line precharge circuit 60 is driven to precharge the common data lines DATA and DATA bar to the predetermined voltage $V_{DP}$.

The address signals A0–A11 are defined prior to the read operation. Accordingly, when the word-line enable signal WLE goes high at the start of the read operation (at the time $t_{21}$), among the row-address predecode signals $X_{1(0,1,2,3,)}$–$X_{3(0,1,2,3)}$, signals which correspond to the address signals A6–A11 go high so that a word line WL is selected and the potential level thereof goes high (at the time $t_{22}$). Similarly, the column-address predecode signals $Y_{1(0,1,2,3)}$–$Y_{3(0,1,2,3)}$ go high or low in accordance with the address signals A0–A5.

In the read operation, when the bit-line selection signal RD bar goes low, the column-decoder 1 selects a bit-line pair of bit lines BL and BL bar in accordance with the column-address predecode signals $Y_1$–$Y_3$, and the corresponding bit-line read signal RD goes high (at the time $t_{22}$). When the bit-line read signal RD goes high for the selected bit-line pair, the corresponding bit lines BL and BL bar are electrically connected to the common data lines DATA and DATA bar, respectively, so that the electric potential $V_{DP2}$ which is expressed by Equation (6) is realized on the bit lines BL and BL bar and the common data lines DATA and DATA bar, as mentioned above. At the same time $t_{22}$, the potential of the word line WL goes high so as to turn-ON the transistor $Q_s$ and the data stored in the memory cell 6 is read out on the bit line BL.

Figure 8:
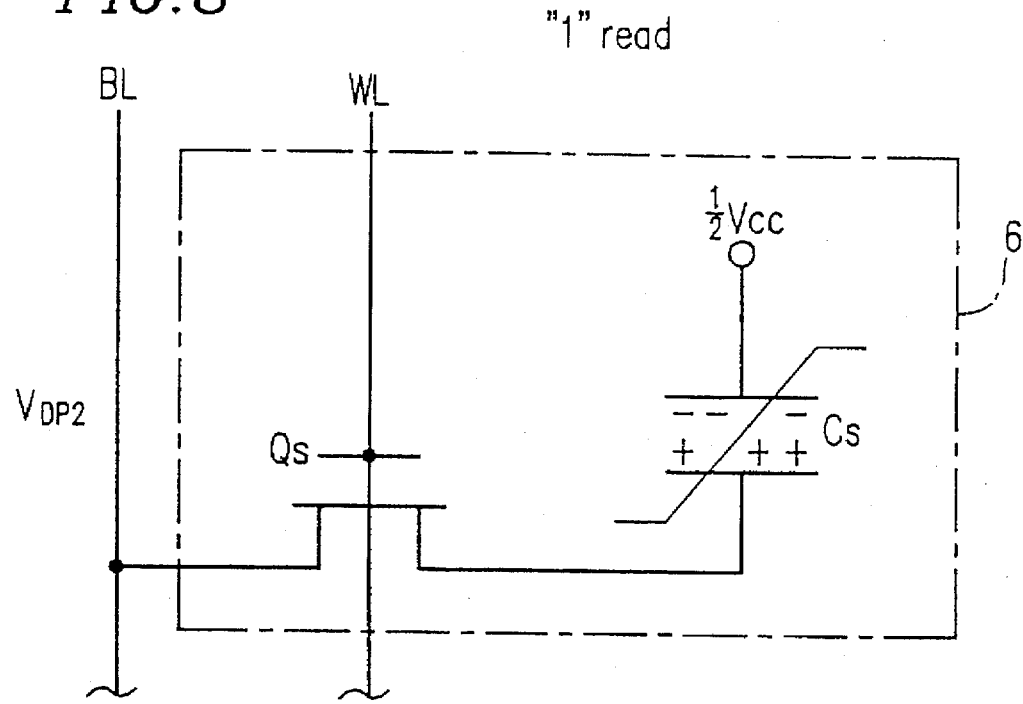
FIG. 8 is a diagram showing a memory cell from which a data "1" is read out in the nonvolatile semiconductor memory device in one embodiment of the present invention.

The read operation when the data "1" is stored in the memory cell 6 is performed in the following way. As shown in FIG. 8, when the transistor $Q_s$ turns-ON, a charge of the bit line BL which is electrically connected to the common data line DATA and a positive remanent polarization charge $P_r$ of the ferroelectric film of the capacitor $C_s$ are charge-shared. In general, the capacitance $C_{BL}$ of the bit line BL and the capacitance $C_{DL}$ of the common data line DATA are sufficiently larger than the capacitance $C_s$ of the capacitor $C_s$, so that a voltage substantially equal to the electric potential $V_{DP2}$ is applied to one of the electrodes of the capacitor $C_s$. Therefore, a positive voltage substantially equal to a difference between the electric potentials $V_{DP2}$ and $(\frac{1}{2})V_{cc}$ is applied across the electrodes of the capacitor $C_s$, so that, as shown in FIG. 9, a polarization charge $P_{DP2[1]}$ is accumulated in the ferroelectric film of the capacitor $C_s$.

Figure 9:
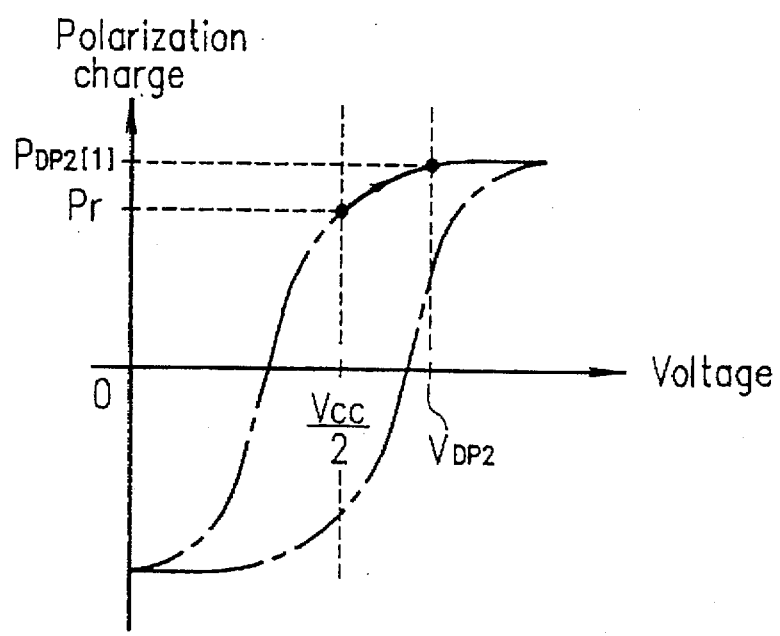
FIG. 9 is a diagram showing the polarization characteristics of a ferroelectric film when the data "1" is read out in the nonvolatile semiconductor memory device in one embodiment of the present invention.

As is seen from FIG. 9, a polarization inversion is not caused in the ferroelectric film. The amount of charge moved from the bit line BL to the capacitor $C_s$ is $P_{DP2[1]}-P_r$, which is a relatively small amount. The potential variation $V_1$ of the bit line BL is given by Equation (8) below. The potential level of the bit line BL is lowered by a small amount.

$$V_1 = -\frac{P_{DP2[1]}-P_r}{C_{BL}+C_{DL}} \tag{8}$$

Next, the read operation when the data "0" is stored in the memory cell 6 is described. As shown in FIG. 10, when the transistor $Q_s$ turns-ON, a charge of the bit line BL which is electrically connected to the common data line DATA and a negative remanent polarization charge $-P_r$ of the ferroelectric film of the capacitor $C_s$ are charge-shared. Similar to the case of the data "1", a positive voltage substantially equal to a difference between the electric potentials $VD_{DP2}$ and $(\frac{1}{2})V_{cc}$ is applied across the electrodes of the capacitor $C_s$. Thus, as shown in FIG. 11, a polarization charge $P_{DP2[0]}$ is accumulated in the ferroelectric film of the capacitor $C_s$.

As is seen from FIG. 11, a polarization inversion is caused in the ferroelectric film. Therefore, the amount of charge moved from the bit line BL to the capacitor $C_s$ is $P_{DP2[0]}-(-P_r)=P_{DP2[0]}+P_r$, which is a relatively large amount. The potential variation $V_0$ of the bit line BL is given by Equation (9) below. The potential level of the bit line BL is lowered by a large amount.

$$V_0 = -\frac{P_{DP2[0]}+P_r}{C_{BL}+C_{DL}} \tag{9}$$

In the read operation, the potential level of a dummy word line DWL which corresponds to the selected word line WL goes high, so that the transistors $Q_D$ of a pair of dummy cells 7 and 8 (or 9 and 10) turn-ON. In the dummy cell 7 and 10, a charge transfer which is the same as that in the memory cell 6 storing the data "1" is caused (as shown in FIG. 9). In the dummy cell 8 and 9, a charge transfer which is the same as that in the memory cell 6 storing the data "0" is caused (as shown in FIG. 11). The capacitance of the dummy capacitor $C_D$ is half of that of the capacitor $C_s$ of the memory cell 6, and an amount of charge which is transferred from the bit line BL to the dummy capacitor $C_D$ of dummy cell 7 or 10 is expressed as $(P_{DP2[1]}-P_r)/2$. Similarly, an amount of charge which is transferred from the bit line BL bar to the dummy capacitor $C_D$ of the dummy cell 8 or 9 is expressed as $(P_{DP2[0]}+P_r)/2$.

Accordingly, a total amount of charge which is transferred from the bit line BL bar to the corresponding pair of the dummy cells is obtained by summing the above-mentioned values, resulting in $(P_{DP2[1]}+P_{DP2[0]})/2$. The potential variation $V_D$ of the bit line BL is a constant given by Equation (10) below.

$$V_D = -\frac{(P_{DP2[1]}+P_{DP2[0]})/2}{C_{BL}+C_{DL}} \tag{10}$$

Accordingly, the potential difference $V_{dif1}$ given by Equation (11) below is obtained in a short time after the time $t_{22}$ between the bit lines BL and BL bar to which the selected memory cell 6 and the corresponding pair of dummy cells are connected.

$$V_{dif1} = -\frac{P_r-(P_{DP2[1]}-P_{DP2[0]})/2}{C_{BL}+C_{DL}} \tag{11}$$

Similarly, in the case where the data "0" is stored in the memory cell 6, the potential difference $V_{dif0}$ is obtained from the difference between the potential variations $V_0$ and $V_D$ expressed in Equations (9) and (10), and given by Equation (12) below.

$$V_{dif0} = -\frac{P_r-(P_{DP2[1]}-P_{DP2[0]})/2}{C_{BL}+C_{DL}} \tag{12}$$

Accordingly, the potential differences between the bit lines BL and BL bar corresponding to the selected memory cell 6 have a same magnitude and the opposite polarity in accordance with the data stored in the memory cell 6.

The high potential levels of the word line WL and the dummy word line DWL are, as shown in FIG. 7, set at the potential level $V_{pp}$ which is higher than the power supply voltage level $V_{cc}$ by at least the threshold voltage $V_{th}$ of the transistors $Q_s$ and $Q_D$. This makes sure to apply the voltage $V_{DP2}$ ($\leq V_{cc}$) to one electrode of each of the capacitor $C_s$ and the dummy capacitor $C_D$ when the bit line BL (BL bar) and the common data line DATA (DATA bar) are electrically connected.

The high level of the bit-line read signal RD is, as shown in FIG. 7, also set at the potential level $V_{pp}$ which is higher than the power supply voltage level $V_{cc}$ by at least the threshold voltage $V_{th}$ of the transistors $Q_1$ and $Q_2$. This makes sure to electrically connect the bit line BL (BL bar) and the common data line DATA (DATA bar) so as to obtain the potential level $V_{DP2}$.

The order in time as to when the potential of the word line WL goes high and when the bit-line read signal RD goes high is arbitrary, and makes no difference in the potential difference which is read out from the memory cell 6 and the corresponding dummy cells onto the pair of bit lines BL and BL bar.

In the read operation, the selected bit lines BL and BL bar are electrically connected to the common data lines DATA and DaTA bar, respectively, so that the potential difference between the pair of bit lines BL and BL bar is read out onto the pair of common data lines DATA and DATA bar.

At the time $t_{23}$, the sense amplifier driving signal S goes high so as to drive the sense amplifier 3. The sense amplifier 3 differentially amplifies the potential difference between the common data lines DATA and DATA bar so as to fix the signal level, by setting a lower potential level of the pair of common data lines DATA and DATA bar at the ground GND based on the polarity of the potential difference. On the other hand, a higher potential level of the pair of common data lines DATA and DATA bar is not changed very much, so that the higher level remains approximately same level as before the amplification (i.e., $V_{DP2}-V_{dif1}$). Accordingly, the potential difference between the common data lines DATA and DATA bar is sufficiently amplified, and the data stored in the memory cell 6 is output by reading the amplified signal level.

Then, at the time $t_{24}$, the restore circuit driving signal R bar goes low so as to drive the restore circuit 5. The restore circuit 5 changes the higher potential level of the pair of common data lines DATA and DATA bar to the source supply voltage level $V_{cc}$.

At this time, the lines BL and BL bar are electrically connected to the common data lines DATA and DATA bar, respectively, so that a lower potential level of the pair of bit lines BL and BL bar is set at the ground GND, while a higher potential level of the pair of bit lines BL and BL bar is set at the source supply voltage $V_{cc}$.

Accordingly, when the data "1" has been stored in the memory cell 6 before the read operation, one electrode of the capacitor $C_s$ is supplied with the source supply voltage $V_{cc}$ after the read operation. On the other hand, when the data "0" has been stored in the memory cell 6 before the read operation, one electrode of the capacitor $C_s$ is supplied with the ground voltage GND after the read operation. Thus, in accordance with the previous data of the memory cell 6, either one of the voltages which have the same magnitude of $(\frac{1}{2})V_{cc}$ and the opposite polarity is applied across the electrodes of the capacitor $C_s$. Therefore, the polarization charge $P_r$ or $-P_r$ which is the same as that before the read operation is rewritten in the ferroelectric film of the capacitor $C_s$, in the same manner as the restore operation (as shown in FIGS. 36 and 38) of the conventional nonvolatile semiconductor memory device 500. As described above, the data which is identical with that stored in the memory cell 6 prior to the read operation is rewritten in the memory cell 6, so as to complete a restore operation.

The high potential level of the word line WL and the high level of the bit-line read signal RD are, as shown in FIG. 7, set at the potential level $V_{pp}$ which is higher than the power supply voltage level $V_{cc}$ by at least the threshold voltage $V_{th}$ of the transistors $Q_s$, $Q_1$, and $Q_2$. This makes sure to apply the source supply voltage $V_{cc}$ to one electrode of the capacitor $C_s$.

Next, the read operation of the nonvolatile semiconductor memory device 200 for a non-selected pair of bit lines $BL_i$ and $BL_i$ bar will be described.

Figure 16:
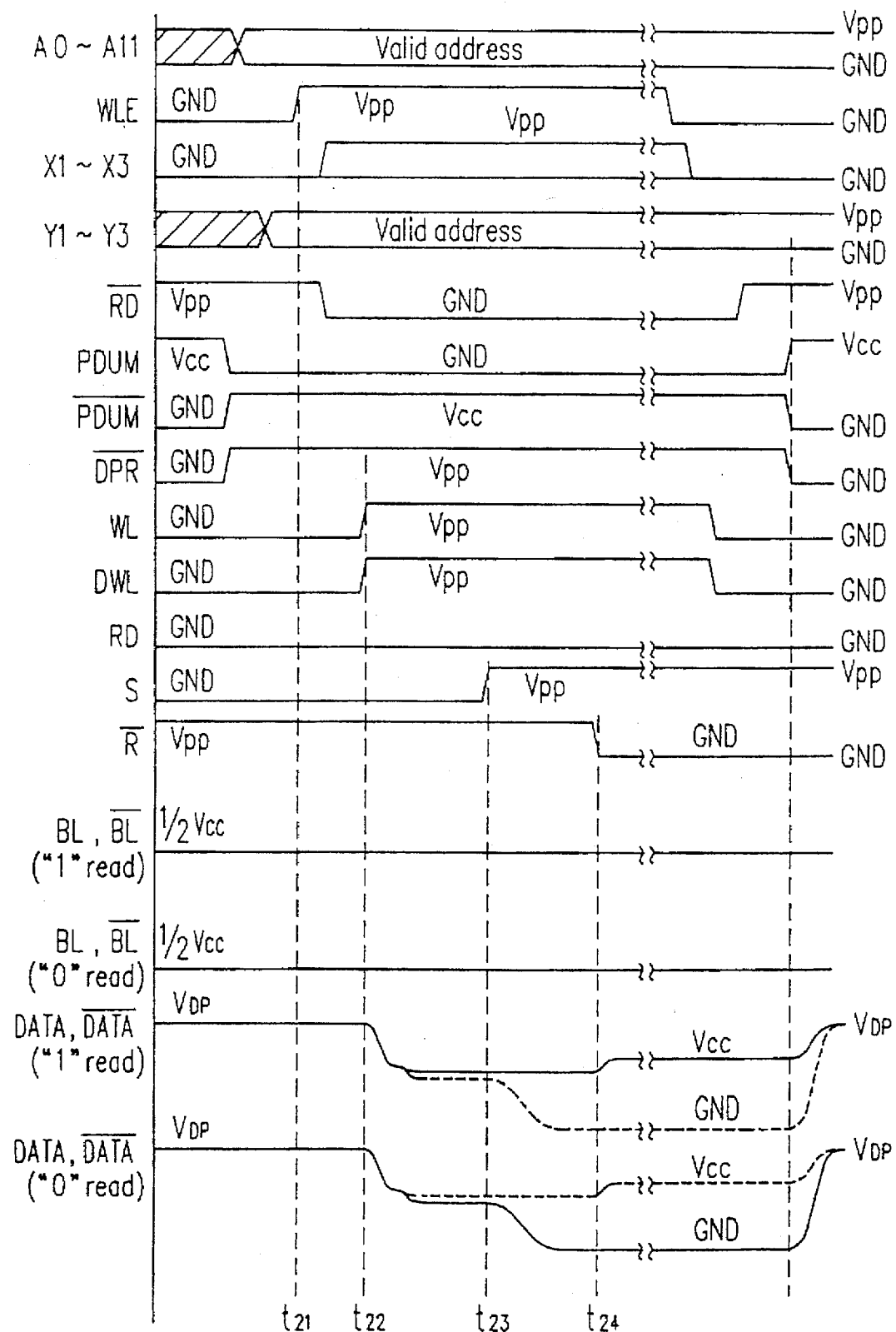
FIG. 16 is a timing diagram showing the read operation of non-selected bit lines in the nonvolatile semiconductor memory device in one embodiment of the present invention.

The non-selected pairs of bit lines $BL_i$ and $BL_i$ bar are also precharged to the voltage of $(\frac{1}{2})V_{cc}$ by the bit-line precharge circuit 4, and remains at the same voltage $(\frac{1}{2})V_{cc}$ during the read operation (see FIG. 16).

In the case where the data "1" is stored in the memory cell 6, a positive remanent polarization charge $P_r$ is held in the ferroelectric film of the capacitor $C_s$ as shown in FIG. 12. During the read operation, the potential level of the bit line $BL_i$ ($BL_i$ bar) and that of the other electrode of the capacitor $C_s$ remain the same potential level of $(\frac{1}{2})V_{cc}$. Accordingly, when the potential level of the selected word line WL goes high so as to turn-ON the transistor $Q_s$, no voltage is applied across the electrodes of the capacitor $C_s$. Thus, as shown in FIG. 13, the remanent polarization charge $P_r$ remains unchanged, so that the data "1" is retained in the memory cell 6.

Figure 14:
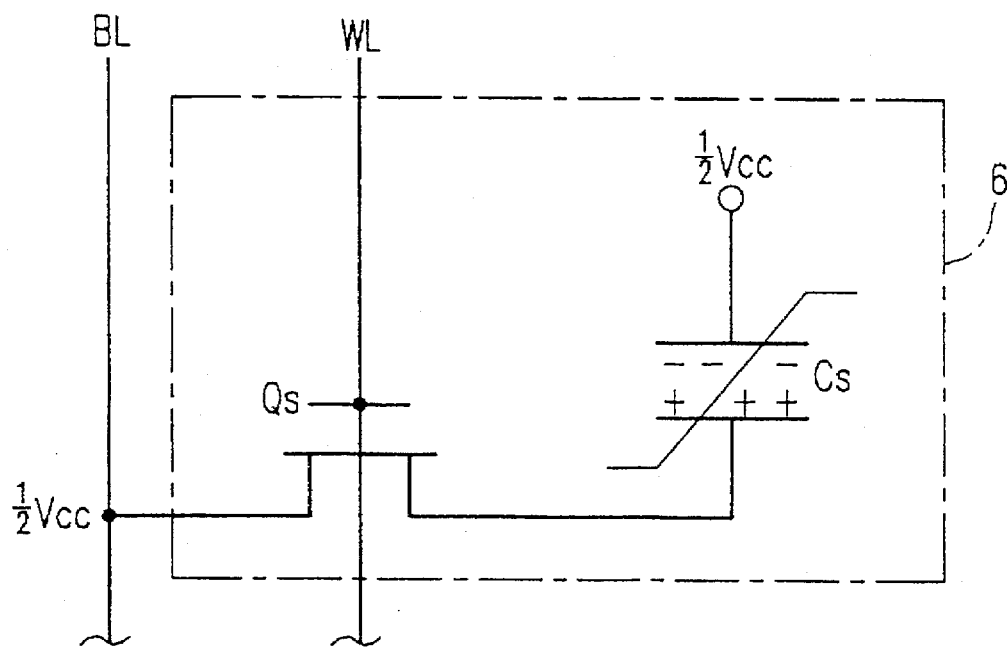
FIG. 14 is a diagram showing a memory cell which retains a data "0" in the nonvolatile semiconductor memory device in one embodiment of the present invention.
Figure 15:
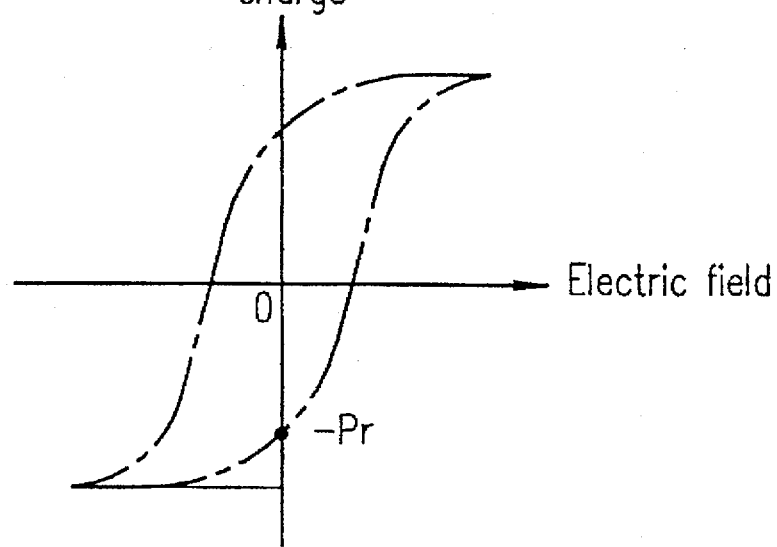
FIG. 15 is a diagram showing the polarization state of a ferroelectric film when the data "0" is retained in the nonvolatile semiconductor memory device in one embodiment of the present invention.

In the case where the data "0" is stored in the memory cell 6, a negative remanent polarization $-P_r$ (i.e., the opposite polarization with respect to that of the data "1") is held in the ferroelectric film of the capacitor $C_s$ as shown in FIG. 14. During the read operation, the potential level of the bit line $BL_i$ ($BL_i$ bar) and that of the other electrode of the capacitor $C_s$ remain the same potential level of $(\frac{1}{2})V_{cc}$. Accordingly, when the potential level of the selected word line WL goes high so as to turn-ON the transistor $Q_s$, no voltage is applied across the electrodes of the capacitor $C_s$. Thus, as shown in FIG. 15, the remanent polarization charge $-P_r$ remains unchanged, so that the data "0" is retained in the memory cell 6.

In addition, in both cases of the data "1" and "0", the potential level of the bit line $BL_i$ ($BL_i$ bar) is unchanged.

Next, the read operation for the non-selected bit lines $BL_i$ and $BL_i$ bar will be described more in detail with reference to FIG. 16. Prior to the read operation, by allowing the bit-line selection signal RD bar to go high, the bit-line write signal RD goes low, so that the bit-line precharge circuit 4 is driven to precharge the bit lines $BL_i$ and $BL_i$ bar to half the voltage of the supply voltage $V_{cc}$. By allowing the dummy cell precharge lines PDUM and PDUM bar to go high and low, respectively, a positive or negative remanent polarization charge is stored in a ferroelectric film of each of the dummy capacitors $C_D$ of the dummy cells 7–10. At the same time, by allowing the common data line precharge signal DPR bar to go low, the common data line precharge circuit 60 is driven to precharge the common data lines DATA and DATA bar to the predetermined voltage $V_{DP}$.

At the start of the read operation, the word-line enable signal WLE goes high (at the time $t_{21}$), and the potential level of the word line WL goes high at the time $t_{22}$. In the read operation, the bit-line selection signal RD bar goes low so as to activate the column-decoder 1; nevertheless, the column-decoder 1 does not select a bit-line pair $BL_i$ and $BL_i$ bar which is connected to the non-selected memory cell 6. Accordingly, the bit-line read signal RD remains low (at the time $t_{22}$), so that the bit lines $BL_i$ and $BL_i$ bar are not electrically connected to the common data lines DATA and DATA bar. At that time, the bit-line precharge circuit 4 is still driven, so that the bit lines $BL_i$ and $BL_i$ bar remain at the precharged potential level of $(\frac{1}{2})V_{cc}$.

Accordingly, even when the word line WL is selected and the potential level thereof goes high so as to turn-ON the transistor $Q_s$ at the time $t_{22}$, the potential level of the non-selected bit lines $BL_i$ and $BL_i$ bar is not changed. Thus, as shown in FIGS. 12–15, the data stored in the memory cell 6 is retained. At the time $t_{22}$, one of the dummy word lines DWL goes high so as to turn-ON the transistors $Q_D$ of the corresponding pair of the dummy cells 7 and 8 or 9 and 10. However, similar to the non-selected memory cell 6, the potential level of the bit line $BL_i$ or $BL_i$ bar to which the dummy cell-pair is connected is not changed.

At the time $t_{23}$, the sense amplifier driving signal S goes high so as to drive the sense amplifier 3. Then, at the time $t_{24}$, the restore circuit driving signal R bar goes low so as to drive the restore circuit 5. The restore circuit 5 changes the higher potential level of the pair of common data lines DATA and DATA bar to the source supply voltage level $V_{cc}$. However, since the non-selected bit lines $BL_i$ and $BL_i$ bar are electrically disconnected from the common data lines DATA and DATA bar, the potential level of the non-selected bit lines $BL_i$ and $BL_i$ bar remains unchanged.

As descried above, according to the nonvolatile semiconductor memory device 200 of the present invention, the electric potential level of the non-selected bit lines $BL_i$ and $BL_i$ bar is kept at $(\frac{1}{2})V_{cc}$ which is the same as that of the common cell plate to which the other electrode of the capacitor $C_s$ of the memory cell 6 is connected. Thus, even when the word line WL is selected and the transistor $Q_s$ of the non-selected memory cell 6 is turned-ON so as to connect the one electrode of the capacitor $C_s$ to the bit line $BL_i$ or $BL_i$ bar, no voltage is applied across the electrodes of the capacitor $C_s$ and the remanent polarization charge of the ferroelectric film remains unchanged. This eliminates the rewrite operations of the non-selected memory cells 6 which are connected to the selected word line WL and the non-selected bit line $BL_i$ or $BL_i$ bar. Accordingly, the nonvolatile semiconductor memory device 200 reduces significantly the power consumption which has been required to perform the read and rewrite operations of a number of memory cells the data stored in which is not necessary to be read.

In addition, according to the nonvolatile semiconductor memory device 200 of the present invention, a sense amplifier is not required to be provided to every bit-line pair, compared with the conventional nonvolatile semiconductor memory device 500 shown in FIG. 31. This makes it possible to reduce, for example, a chip area of the memory device.

Next, the write operation of the memory cell 6 will be described with reference to a timing diagram of FIG. 17. The operation until the time $t_{24}$ (the restore operation) is the same as that of the read operation of the selected bit line BL as shown in FIG. 7. In the following explanation, the memory cell 6 is supposed to be connected to the bit line BL.

Then, when the write enable signal WEN goes high at the time $t_{25}$, the potential levels of the common data line DATA (DATA bar) and the bit line BL (BL bar) which is electrically connected to the common data line DATA (DATA bar) are shifted in accordance with the write data signal WDATA. In the case where the write data signal WDATA is high corresponding to the data "1", the potential levels of the common data line DATA and the corresponding bit line BL go high, while the potential levels of the common data line DATA bar and the corresponding bit line BL bar go low. In the case where the write data signal WDATA is low corresponding to the data "0", the potential levels of the common data line DATA and the corresponding bit line BL go low, while the potential levels of the common data line DATA bar and the corresponding bit line BL bar go high. The data corresponding to the write data signal WDATA is written into the memory cell 6 in a same manner as that of the conventional nonvolatile semiconductor memory device 500.

EXAMPLE 2

Figure 18:
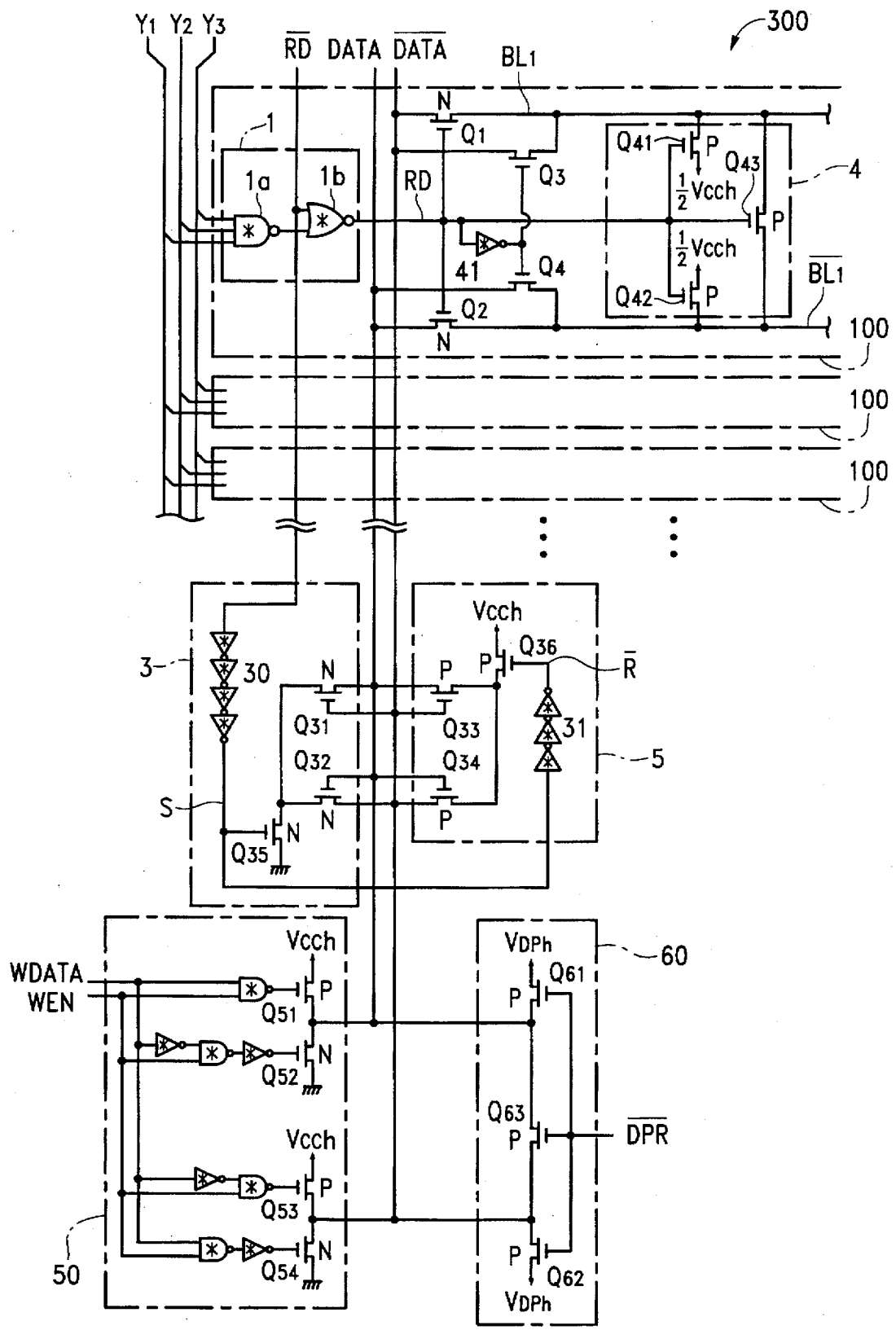
FIG. 18 is a block diagram showing a part of the circuitry of a nonvolatile semiconductor memory device in another embodiment of the present invention.

FIG. 18 shows a part of the circuitry of a nonvolatile semiconductor memory device 300 of this example. In the following explanation, the same components as those of the nonvolatile semiconductor memory device 200 are denoted by the same numerical references. The overall structure of the nonvolatile semiconductor memory device 300 is similar to that of the nonvolatile semiconductor memory device 200 as show in FIG. 1.

The memory cells 6 of the nonvolatile semiconductor memory device 300 are 1C-1Tr type memory cells in which 1-bit data is stored in a single capacitor. In this example, the common cell plate is supplied with a voltage which is half of a predetermined voltage $V_{cch}$, which is higher than the source supply voltage $V_{cc}$. One electrode of the capacitor $C_s$ is connected to the bit line and the other electrode is connected the common cell plate so as to be supplied with the voltage $(\frac{1}{2})V_{cch}$.

The nonvolatile semiconductor memory device 300 will be described primarily with respect to those structures which are different from those of the nonvolatile semiconductor memory device 200. As shown in FIG. 18, the nonvolatile semiconductor memory device 300 includes transistors $Q_1$–$Q_4$ and an inverter 41 which are provided between each pair of bit lines $BL_i$ and $BL_i$ bar and a pair of common data lines DATA and DATA bar. An input of the inverter 41 is coupled to the bit-line read signal line RD.

The bit line $BL_i$ is connected to the common data line DATA via the source-drain of an N-channel type MOSFET $Q_1$, and is also connected to the common data line DATA via the source-drain of a P-channel type MOSFET $Q_3$. Similarly, the bit line $BL_i$ bar is connected to the common data line DATA bar via the source-drain of an N-channel type MOSFET $Q_2$, and is also connected to the common data line DATA bar via the source-drain of a P-channel type MOSFET $Q_4$. The gates of the transistors $Q_1$ and $Q_2$ are coupled to the bit-line read signal line RD from the column decoder 1. The gates of the transistors $Q_3$ and $Q_4$ are coupled to the output of the inverter 41.

As shown in FIG. 18, the transistors $Q_1$ and $Q_3$ between the bit line $BL_i$ and the common data line DATA have a complementary structure, and similarly, the transistors $Q_2$ and $Q_4$ between the bit line $BL_i$ bar and the common data line DATA bar have a complementary structure. Other coupling structures are the same as those of the nonvolatile semiconductor memory device 200.

In the second example, the high levels of the signals or high potential levels of the signal lines shown in FIG. 1 are set as follows. The high potential levels of the word line $WL_i$, the dummy word lines $DWL_0$ and $DWL_1$, and the dummy cell precharge lines PDUM and PDUM bar are set at a predetermined voltage level $V_{pph}$. The high level of the column-address predecode signals $Y_1$–$Y_3$, the bit-line read signal RD, and the bit-line selection signal RD bar are set at the predetermined voltage level $V_{cch}$. The predetermined voltage level $V_{pph}$ is higher than the voltage level $V_{cch}$ by at least the threshold voltage $V_{th}$ of the transistors. The high level of the common data line precharge signal DPR bar is also different from that in the first example, as will be described below.

In the second example, the high levels of the signals or high potential levels of the signal lines shown in FIG. 18 are set as follows.

The high potential level of the column-address predecode signal lines $Y_1$–$Y_3$, the bit-line read signal lines RD, the bit-line selection signal lines RD bar, the source of the transistor $Q_{36}$ and the series of inverters 31 of the restore circuit 5, the series of inverters 30 of the sense amplifier 3, and the sources of the transistors $Q_{51}$ and $Q_{53}$ of the write circuit 50 are set at the predetermined voltage level $V_{cch}$. The sources of the transistors $Q_{41}$ and $Q_{42}$ of the bit-line precharge circuit 4 are set at the voltage level $(\frac{1}{2})V_{cch}$. The sources of the transistors $Q_{61}$ and $Q_{62}$ of the common data line precharge circuit 60 are set at a predetermined voltage level $V_{DPh}$, as will be described below. The logical gates marked with "*", as shown in FIG. 18, operate with the logical high level of $V_{cch}$.

When the bit-line read signal RD is high ($V_{cch}$), the bit line $BL_i$ and the common data line DATA are connected electrically via a pair of the transistors $Q_1$ and $Q_2$, and the bit line $BL_i$ bar and the common data line DATA bar are connected electrically via a pair of the transistors $Q_3$ and $Q_4$. Since each pair of the transistors has a complementary structure, the electric potential levels of $V_{cch}$, GND, and an intermediate level thereof are transferred without being affected by the threshold voltage of the transistors $Q_1$–$Q_4$.

The potential level $V_{DPh}$ for precharging the common data lines DATA and DATA bar is determined as follows:

In the read operation, when the transistors $Q_1$–$Q_4$ are turned-ON so as to electrically connect the common data line DATA (DATA bar) which is precharged to the potential level $V_{DPh}$ by the common data line precharge circuit 60 and the selected bit line BL (BL bar) which is precharged to the potential level $(1/2)V_{cch}$ by the bit line precharge circuit 4, suppose an electric potential $V_{DP2h}$ is realized by a charge-sharing between the common data line DATA (DATA bar) and the selected bit line BL (BL bar). Suppose a capacitance of the bit line BL (BL bar) is $C_{BL}$, and that of the common data line DATA (DATA bar) is $C_{DL}$. The resultant potential level $V_{DP2}$ of the charge-sharing is expressed by the following Equation (13).

$$V_{DP2h} = \frac{V_{DPh} \cdot C_{DL} + (1/2)V_{cch} \cdot C_{BL}}{C_{BL} + C_{DL}} \quad (13)$$

The precharge potential level $V_{DPh}$ of the common data line DATA (DATA bar) is set sufficiently high so as to satisfy the following Equation (14).

$$V_{DP2h} - (1/2)V_{cch} = \frac{V_{DPh} \cdot C_{DL} + (1/2)V_{cch} \cdot C_{BL}}{C_{BL} + C_{DL}} - (1/2)V_{cch} > V_c \quad (14)$$

As in the case described above using FIG. 6 and Equation (7) in the first example, the precharge potential level $V_{DPh}$ is determined so that the difference between the potential level $V_{DP2h}$ and the potential level $(1/2)V_{cch}$ is larger than the polarization inversion voltage $V_c$ of the capacitor $C_s$.

Figure 17:
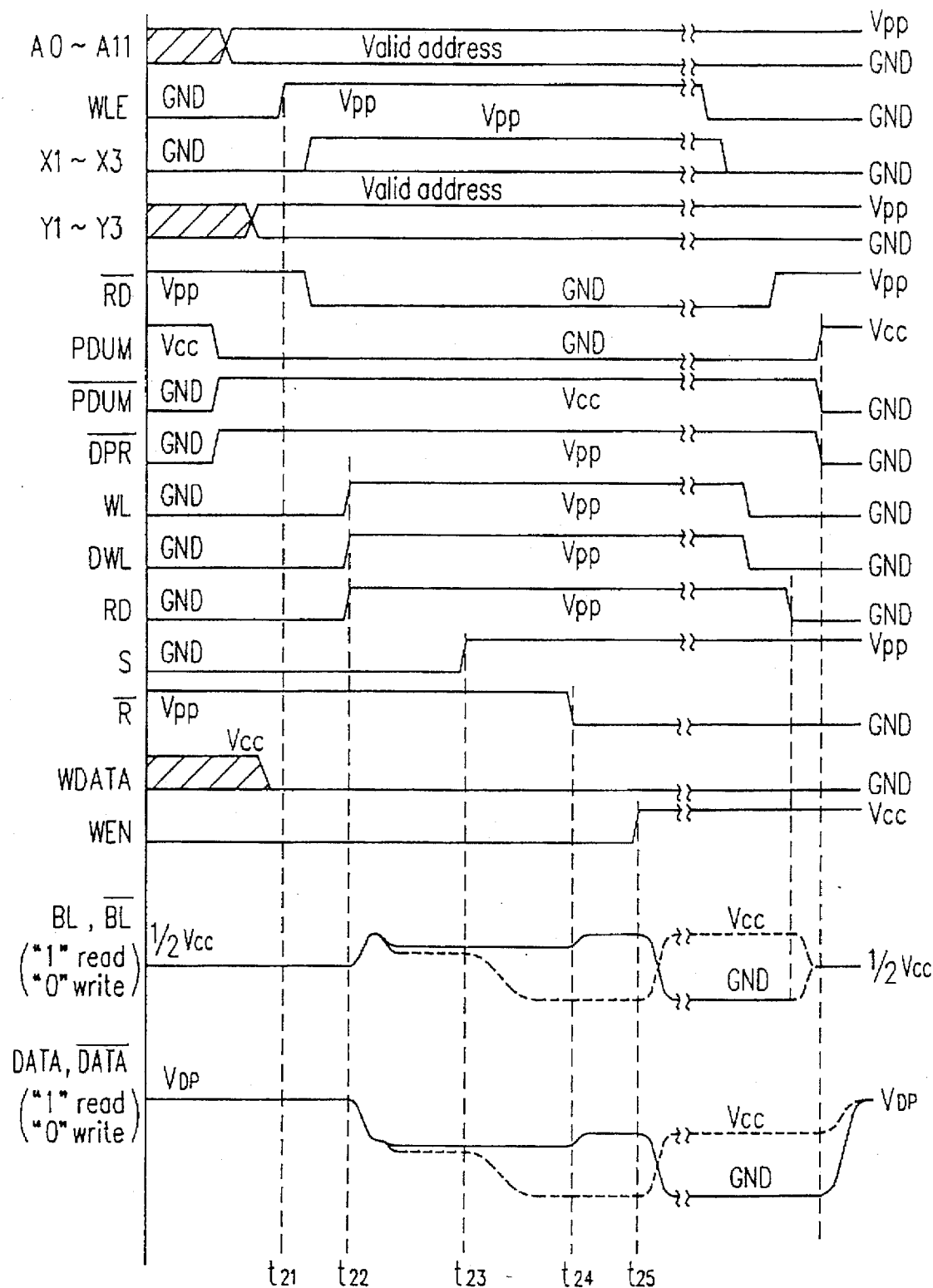
FIG. 17 is a timing diagram showing the write operation of a selected bit line in the nonvolatile semiconductor memory device in one embodiment of the present invention.

The read operation and write operation for the memory cell 6 of the nonvolatile semiconductor memory device 300 are, except for the signal levels and the potential levels of the signal lines, the same as those of the nonvolatile semiconductor memory device 200 in the first example as shown in the timing diagrams of FIGS. 7, 16, and 17.

Regarding the signal levels, the write signal level is $V_{cch}$ which is higher than $V_{cc}$. Accordingly, a write voltage which is the potential level difference between the electrodes of the capacitor $C_s$ is $(1/2)V_{cch}$ which is larger than the voltage $(1/2)V_{cc}$ representing half of the source supply voltage.

Figure 19:
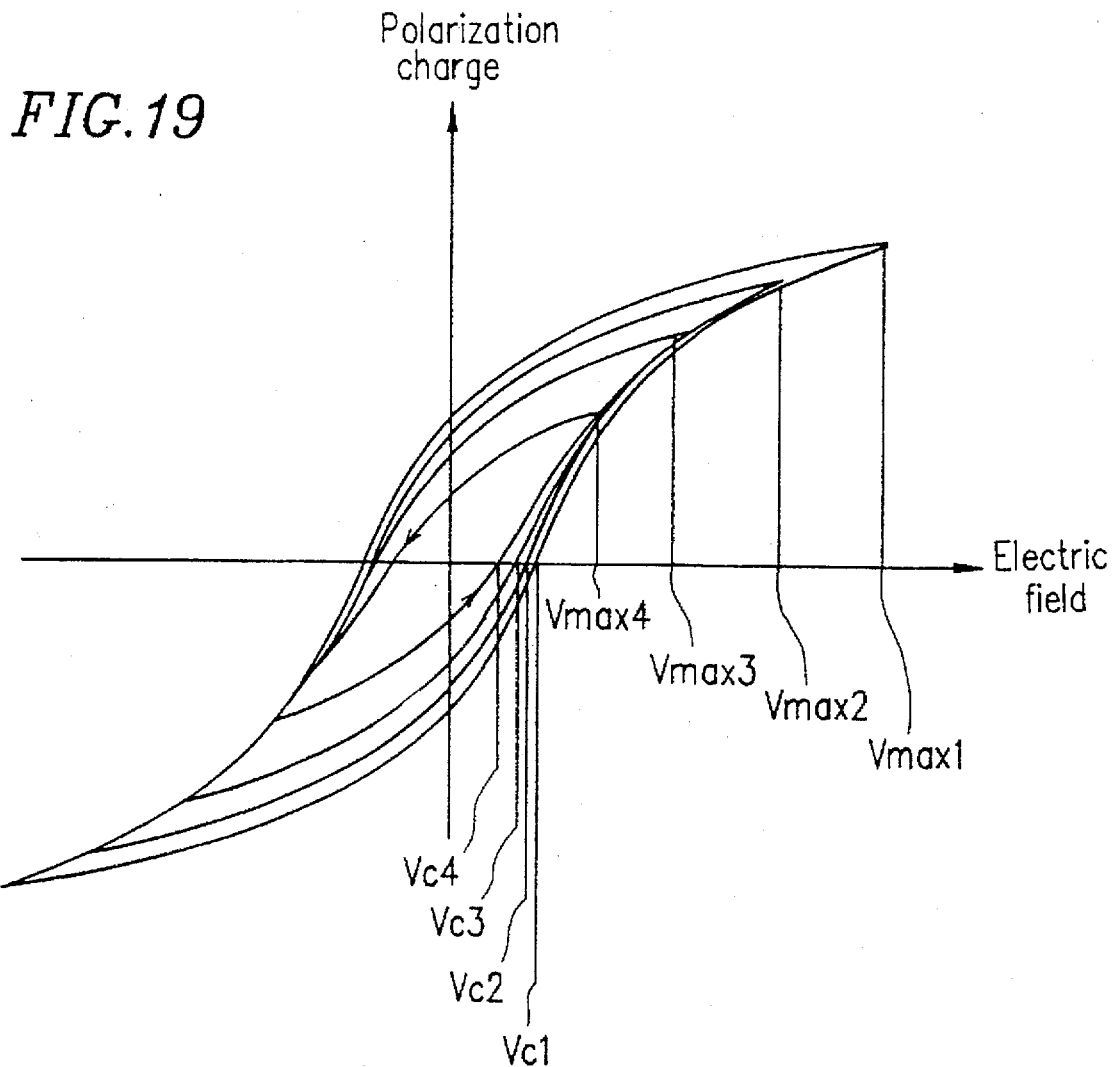
FIG. 19 is a diagram showing the hysteresis characteristics of a ferroelectric film of the nonvolatile semiconductor memory device in another embodiment of the present invention.

The advantages of the nonvolatile semiconductor memory device 300 in this example are as follows:

FIG. 19 shows an example of the polarization characteristics, i.e., polarization charge-voltage characteristics, of a ferroelectric film. FIG. 19 shows the hysteresis characteristics of the ferroelectric film with respect to four different write voltages $V_{max1}$–$V_{max4}$. As shown in FIG. 19, the respective polarization inversion voltages $V_{c1}$ to $V_{c4}$ are not reduced very much as compared with the decrease of the write voltages $V_{max1}$ to $V_{max4}$. On the other hand, in order to write the data in the ferroelectric film without fail, it is required to apply a write voltage which is sufficiently greater than the polarization inversion voltages $V_c$. Accordingly, in the case where the write voltage $V_{max}$ is set at $(1/2)V_{cc}$ depending on the source supply voltage, even when the nonvolatile semiconductor memory device is preferred to be driven by a lower supply voltage due to a source supply voltage of a computer system or the like, it is not allowed to lower the supply voltage $V_{cc}$ because the polarization inversion voltage $V_c$ can not be lowered.

According to this example, the write voltage $V_{max}$ is set at the voltage level of $V_{cch}$ which is higher than $(1/2)V_{cc}$. Therefore, even if the source supply voltage $V_{cc}$ is lowered, the data is written to the ferroelectric capacitor without fail.

EXAMPLE 3

Figure 20:
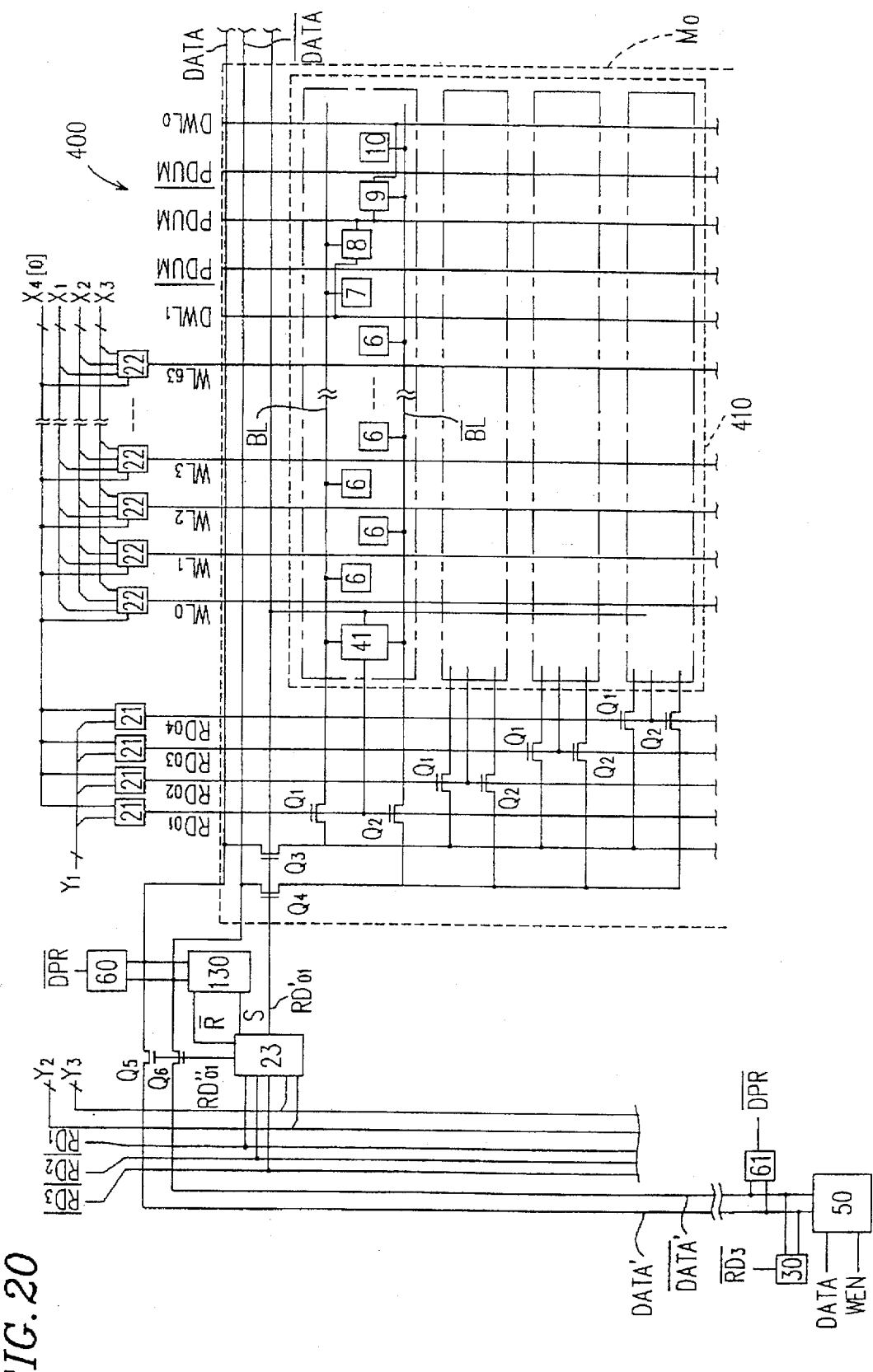
FIG. 20 is a block diagram showing a part of the circuitry of a nonvolatile semiconductor memory device in still another embodiment of the present invention.
Figure 21:
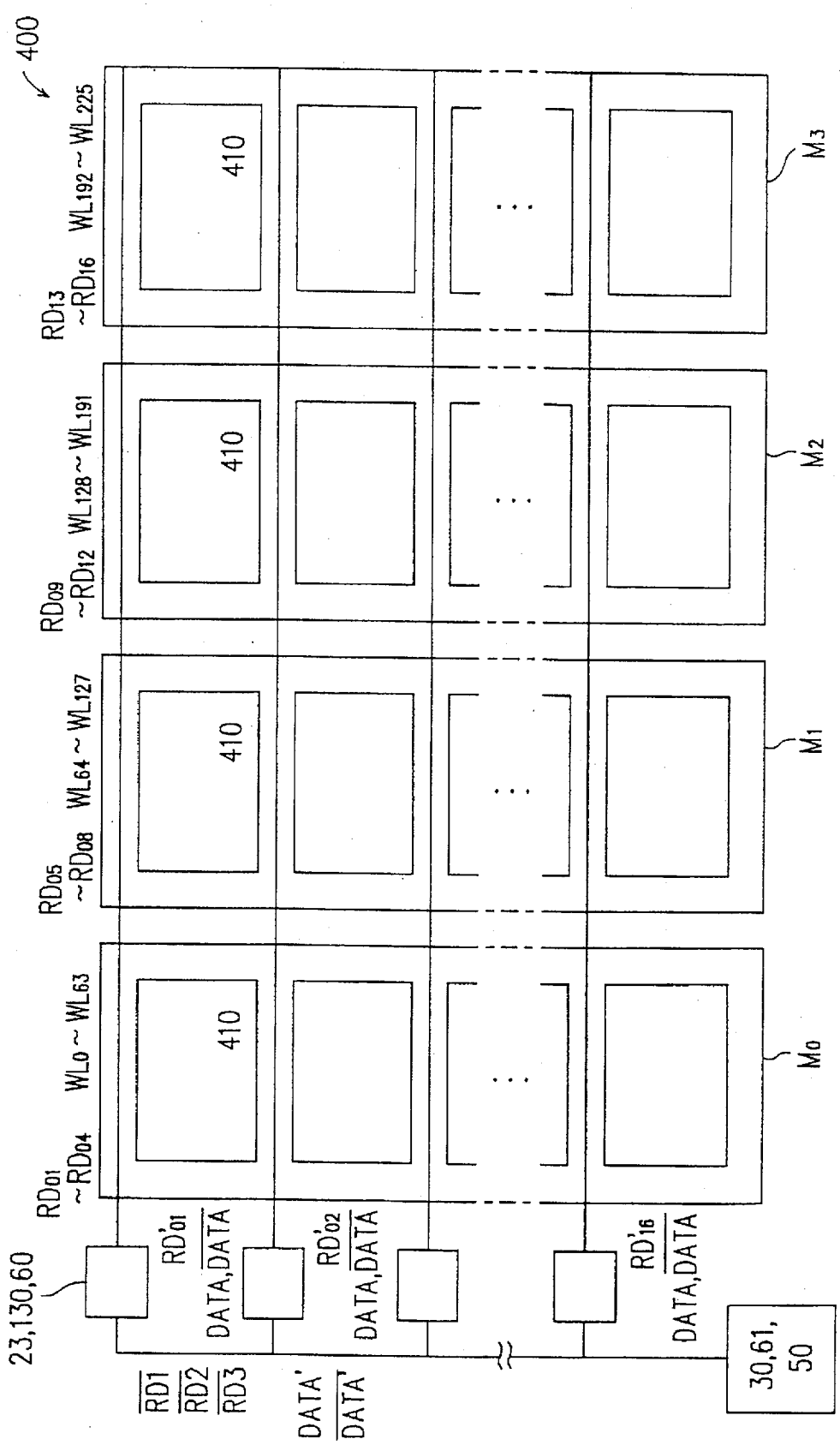
FIG. 21 is a block diagram showing the schematic structure of the nonvolatile semiconductor memory device shown in FIG. 20.

FIGS. 20 and 21 show a part of the circuitry of a nonvolatile semiconductor memory device 400 of the third example of the present invention. As shown in FIG. 20, the nonvolatile semiconductor memory device 400 of this example includes a plurality of bit lines, a plurality of word lines, and at least one memory block (memory cell matrix) having memory cell arrays, similar to the nonvolatile semiconductor memory device 200 in the first example. The nonvolatile semiconductor memory device 400 may include a plurality of memory blocks. In the following explanation, the components which are the same as those of the nonvolatile semiconductor memory device 200 are denoted by the same numerical references those of the nonvolatile semiconductor memory device 200. Also, the nonvolatile semiconductor memory device 400 is intended to include a plurality of memory blocks.

First, the differences between the nonvolatile semiconductor memory device 400 of this example and the nonvolatile semiconductor memory device 200 will be described briefly.

The common data line of this example includes a first portion DATA (DATA bar) and a second portion DATA' (DATA' bar) which are coupled by a switching element, as will be described below. Compared with the nonvolatile semiconductor memory device 200 of the first example in which at least one common data line DATA (DATA bar) is provided for one memory block (memory cell matrix), in the nonvolatile semiconductor memory device 400 of the present example, as shown in FIGS. 20 and 21, at least one first data line (the first portion of the common data line) DATA (DATA bar) is provided for at least one submatrix 410 which includes a plurality of pairs of bit lines $BL_i$ and $BL_i$ bar.

With respect to one memory block (or in the case where the nonvolatile semiconductor memory device 400 includes single memory block), at least one first data line DATA (DATA bar) is provided for each sub-matrix 410 of the memory block. With respect to a plurality of memory blocks, at least one first data line DATA (DATA bar) is provided across the plurality of memory blocks, so that the plurality of sub-matrices 410 correspond to the at least one first data line DATA (DATA bar), as shown in FIG. 21.

In the nonvolatile semiconductor memory device 400 of the present example, switching elements (transistors) which are provided between the bit lines $BL_i$ and $BL_i$ bar and the common data lines DATA and DATA bar are controlled to turn-ON and turn-OFF based on the row-address and column-address. On the other hand, the switching elements (the transistors $Q_1$ and $Q_2$) which are provided between the bit lines $BL_i$ and $BL_i$ bar and the common data lines DATA and DATA bar are controlled to turn-ON and turn-OFF based on the column-address and/or the row-address.

In the nonvolatile semiconductor memory device 400 of the present example, a predetermined number of pairs of bit lines $BL_i$ and $BL_i$ bar are precharged prior to a read operation, as compared with the nonvolatile semiconductor memory device 200 of the first example in which all pairs of the bit lines $BL_i$ and $BL_i$ bar included in one memory block are precharged prior to the read operation.

The write operation of the nonvolatile semiconductor memory device 400 and circuits for performing the write operation thereof are the same as those of the nonvolatile semiconductor memory device 200 of the first example.

The read operation of the nonvolatile semiconductor memory device 400 and the circuits for performing the read operation thereof are now described.

The memory cells 6 of the nonvolatile semiconductor memory device 400 are 1C-1Tr type memory cells in which 1-bit data is stored in a single capacitor, similar to the previous examples. In this example, the common cell plate is supplied with a voltage which is half of the source supply voltage $V_{cc}$. One electrode of the capacitor $C_s$ is connected to the bit line and the other electrode is connected the common cell plate so as to be supplied with the voltage $(½)V_{cc}$. The voltage applied to the one electrode of the capacitor $C_s$ is at the level $V_{cc}$ for the data "1" and at the level GND for the data "0".

The nonvolatile semiconductor memory device 400 includes a plurality of memory blocks M. In this example, a nonvolatile semiconductor memory device 400 which has four memory blocks $M_0$–$M_3$ will be described.

As shown in FIG. 20, in each memory block M of the nonvolatile semiconductor memory device 400, m pairs of bit lines $BL_1$, $BL_1$ bar, $BL_2$, $BL_2$ bar, . . . , and $BL_m$, $BL_m$ bar are arranged in the column direction. In the memory block M, n+1 word lines $WL_0$–$WL_n$ each extending along a direction perpendicular to the bit lines are arranged in the row direction. A row decoder 22 is provided for each of the word lines $WL_0$–$WL_n$. In parallel to the word lines $WL_0$–$WL_n$, dummy word lines $DWL_0$ and $DWL_1$ and dummy-cell precharge lines PDUM and PDUM bar are disposed. FIG. 20 shows the memory block $M_0$ in the case of n+1=64.

FIG. 21 shows schematic structure of the nonvolatile semiconductor memory device 400. As shown in FIG. 21, four memory blocks $M_0$–$M_3$ are disposed in the row direction. For the four memory blocks $M_0$–$M_3$, 256 word lines $WL_0$–$WL_{255}$ are provided as a whole. In each of the memory blocks $M_1$–$M_3$, as shown in FIG. 21, the corresponding dummy word lines (for example, $DWL_3$ and $DWL_4$) and the corresponding dummy-cell precharge lines PDUM and PDUM bar (not shown in FIG. 21) are provided with respect to the word lines $WL_{64}$–$WL_{127}$, $WL_{128}$–$WL_{191}$, and $WL_{192}$–$WL_{255}$.

To each pair of bit lines $BL_i$ and $BL_i$ bar in each memory block M, a bit-line precharge circuit 41, sixty-four memory cells 6, and four dummy cells 7–10 are connected. Similar the first example, for each bit-line pair, respective memory cells 6 are disposed at crossings of one bit line $BL_i$ and the even-numbered word lines $WL_0$, $WL_2$, . . . , and crossings of the other bit line $BL_i$ bar and the odd-numbered word lines $WL_1$, $WL_3$, . . . Two dummy cells 7 and 8 are disposed correspondingly to the bit line $BL_i$ and the dummy word line $DWL_1$, and two dummy cells 9 and 10 are disposed correspondingly to the bit line $BL_i$ bar and the dummy word line $DWL_0$.

As shown in FIG. 20, the nonvolatile semiconductor memory device 400 includes first column decoders 21 which are provided four per memory block M. In addition, to each four pairs of bit lines $BL_i$ and $BL_i$ bar across the memory blocks, a second column decoder 23, a sense amplifier/restore circuit 130, and a common data line precharge circuit 60 are provided. In FIGS. 20 and 21, a portion of each memory block M corresponding to four bit-line pairs $BL_i$ and $BL_i$ bar is denoted as a sub-matrix 410. In this example, each memory block M includes 16 sub-matrices 410.

As shown in FIGS. 20 and 21, 16 pairs of first data lines DATA and DATA bar are provided across the four memory blocks M. Each pair of first data lines DATA and DATA bar corresponds to four pairs of bit lines $BL_i$ and $BL_i$ bar (i.e., each sub-matrix 410) in each memory block M. The second column decoder 23, the sense amplifier/restore circuit 130, and the common data line precharge circuit 60 are provided for each pair of first data lines DATA and DATA bar.

As shown in FIG. 20, each pair of the first data lines DATA and DATA bar is connected to a pair of second data lines DATA' and DATA' bar via transistors (switching elements) $Q_5$ and $Q_6$. For all of the memory blocks, the pair of second data lines DATA' and DATA' bar is provided. For the pair of second data lines DATA' and DATA' bar, a sense amplifier 30, a second line precharge circuit 61, and a write circuit 50 are provided.

Figure 22:
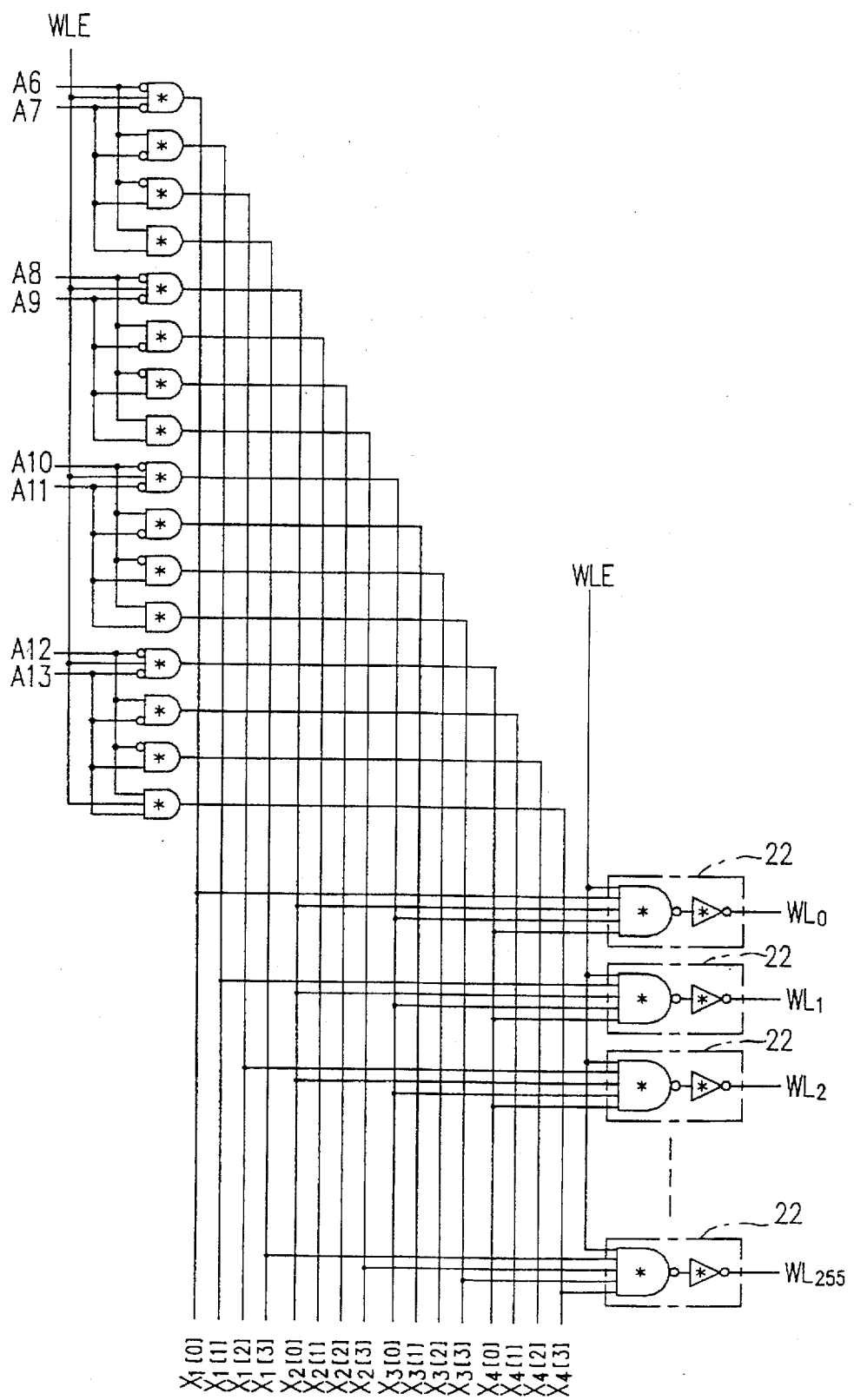
FIG. 22 is a block diagram showing the construction of a row decoder and row-address predecode signal lines shown in FIG. 20.
Figure 23:
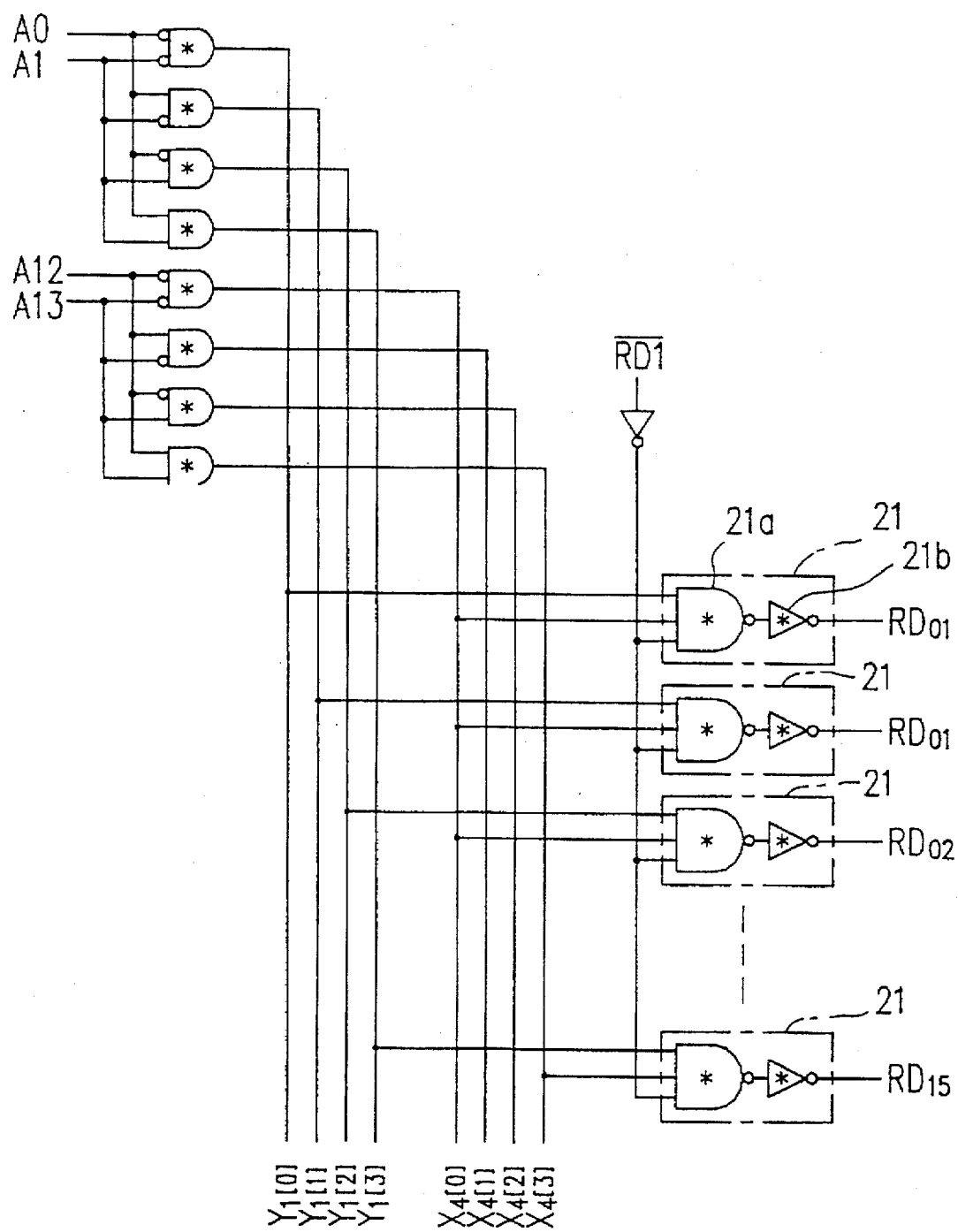
FIG. 23 is a block diagram showing the construction of a first column decoder and column-address predecode signal lines shown in FIG. 20.

As shown in FIGS. 20, 22, and 23, the nonvolatile semiconductor memory device 400 includes four row-address predecode signal lines $X_1$–$X_4$ and three column-address predecode signal lines $Y_1$–$Y_3$.

As shown in FIG. 22, each of the row-address predecode signal lines $X_1$–$X_4$ includes four row-address lines, and one of the four row-address lines is selected in accordance with the applied predecode signal, so as to go high. For example, the row-address predecode signal line $X_1$ includes four row-address lines $X_{1[0,1,2,3]}$, and one of the four row-address lines $X_{1[0,1,2,3]}$ is selected and goes high in accordance with row-addresses A6 and A7 of the predecode signal. Similarly, the row-address predecode signal line $X_2$ includes four row-address lines $X_{2[0,1,2,3]}$, and one of the four row-address lines $X_{2[0,1,2,3]}$ is selected and goes high in accordance with row-addresses A8 and A9 of the predecode signal. It is the same in the case of the row-address predecode signal lines $X_3$ and $X_4$.

A word line enable signal WLE shown in FIG. 22 goes high (at a predetermined potential of $V_{pp}$) after the row-address A6–A13 are defined. Logic gates marked with an asterisk "*" as shown in FIGS. 22–44 are intended to operate between the high potential level of $V_{pp}$ and the low potential level of grounded GND.

In this example, the predetermined potential level of $V_{pp}$ is set higher than the power source voltage level of $V_{cc}$ by at least the threshold voltage $V_{th}$ of the transistors. That is, $V_{pp}$ is set so as to satisfy an inequality $V_{pp} > V_{cc} + V_{th}$. The high level of the address signals A0–A13 (shown in FIGS. 22–24), the high potential level of the row-address predecode signal lines $X_1$–$X_4$ and the column-address predecode signal lines $Y_1$–$Y_3$, and the high level of the word line enable signal WLE are all set at the predetermined level of $V_{pp}$. The address signals A0–A13 are preferably converted to have the high potential level of $V_{pp}$ by a voltage level convertor (not shown).

As shown in FIG. 22, four row-address lines which are respectively selected in a different combination from the four row-address predecode signal lines $X_1$–$X_4$ are connected to each row decoder 22. A number of the combinations to select one of four row-address lines from each of four row-address predecode signal lines $X_1$–$X_4$ is $4^4=256$, so that 256 row addresses can be specified. Accordingly, 256 row decoders 22 are connected to the row-address predecode signal lines $X_1$–$X_4$ for all of the four memory blocks.

The row-address predecode signal $X_4$ is a signal for selecting one memory block from the four memory blocks. Each row decoder 22 allows the corresponding word line to be active (set at $V_{pp}$) when all of the connected four row-address lines go high ($V_{pp}$). The outputs of the row-decoders 22 are connected to 256 word lines $WL_0$–$WL_{255}$, respectively, and one of the word lines $WL_0$–$WL_{255}$ is selected and goes high ($V_{pp}$) in accordance with an address specified by the address predecode signal.

Figure 24:
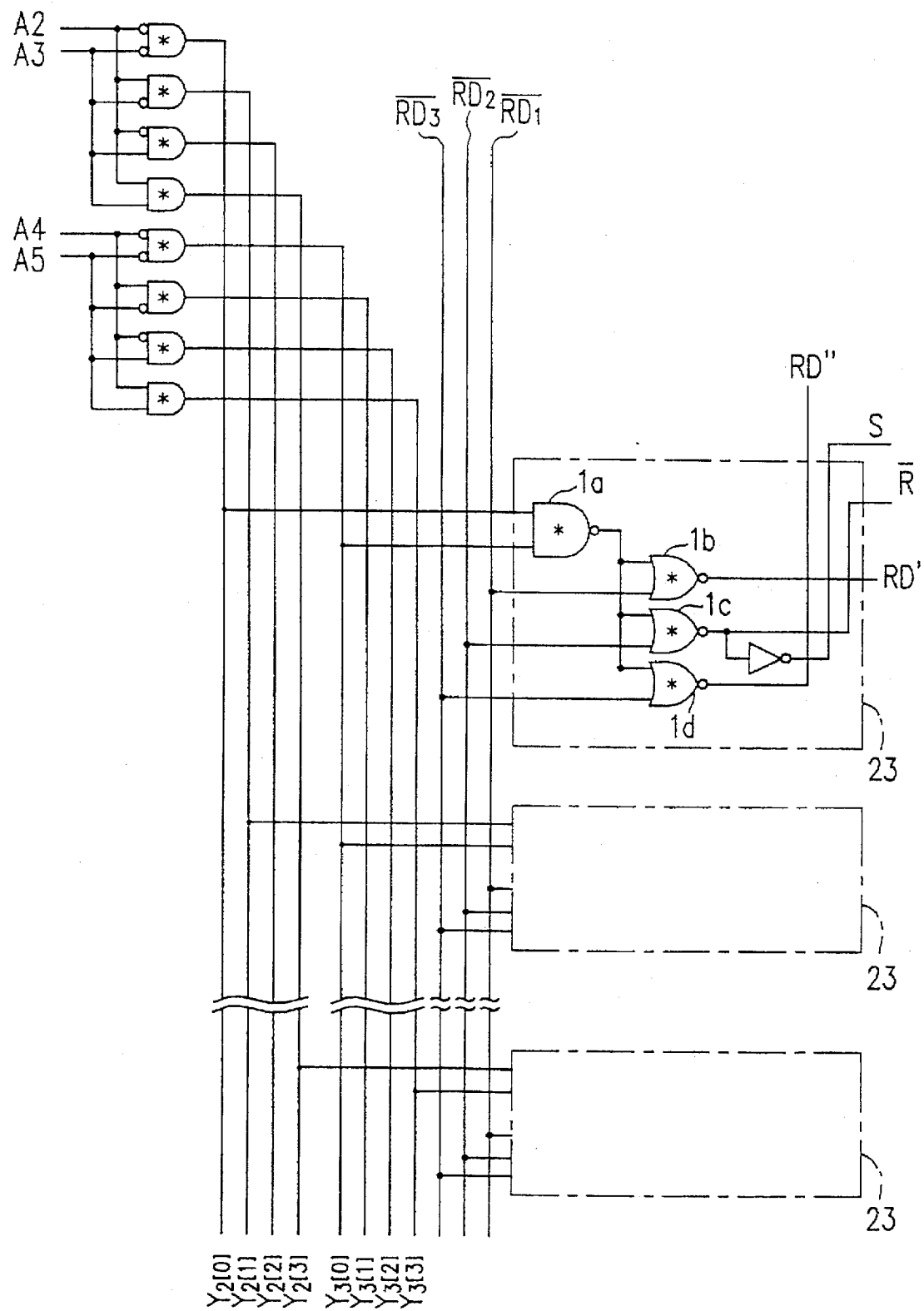
FIG. 24 is a block diagram showing the construction of a second column decoder and column-address predecode signal lines shown in FIG. 20.

As shown in FIGS. 23 and 24, similar to the row-address predecode signal lines $X_1$–$X_4$, each of the column-address predecode signal lines $Y_1$–$Y_3$ includes four column-address lines, and one of the four column-address lines is selected in accordance with the applied address predecode signal, so as to go high. For example, the column-address predecode signal line $Y_1$ includes four column-address lines $Y_{1[0,1,2,3]}$, and one of the four column-address lines $Y_{1[0,1,2,3]}$ is selected and goes high in accordance with column-addresses A0 and A1 of the address predecode signal. Similarly, the column-address predecode signal line $Y_2$ includes four column-address lines $Y_{2[0,1,2,3]}$, and one of the four column-address lines $Y_{2[0,1,2,3]}$ is selected and goes high in accordance with column-addresses A2 and A3 of the address predecode signal. It is the same in the case of the column-address predecode signal line $Y_3$.

As shown in FIGS. 20 and 23, two address lines are coupled to each first column decoder 21, one of which is selected from the four row-address lines of the row-address predecode signal line $X_4$, and the other of which is selected from the four column-address lines of the column-address predecode signal line $Y_1$, so as to be a different combination of the address lines. For each memory block, four first column decoders 21 are coupled to the row-address predecode signal line $X_4$ and the column-address predecode signal line $Y_1$, so that 16 first column decoders 21 are provided for the four memory blocks.

For each first column decode 21, 16 pairs of bit lines $BL_i$ and $BL_i$ bar in one memory block M are disposed. For example, as shown in FIG. 20, one bit-line pair per sub-matrix 410 in the memory block $M_0$ i.e., 16 pairs of bit lines $BL_i$ and $BL_i$ bar of the memory block $M_0$ are coupled to a first column decoder 21 which outputs a first bit-line read signal $RD_{01}$. Accordingly, the first bit-line read signal $RD_{01}$ is input to the gates of 16 pairs of transistors $Q_1$ and $Q_2$, to the sources of which the 16 pairs of bit lines $BL_i$ and $BL_i$ bar are connected, respectively.

As shown in FIGS. 20 and 24, two column-address lines are coupled to each second column decoder 23, which are selected from the respective four column-address lines of the column-address predecode signal lines Y2 and $Y_3$, so as to be a different combination of the column-address lines. To the column-address predecode signal lines $Y_2$ and $Y_3$, 16 second column decoders 23 are coupled. For the four memory blocks, four first row decoders 21 are coupled.

For each second column decode 23, 4 bit-line pairs per memory block M, i.e., 16 pairs of bit lines $BL_i$ and $BL_i$ bar from the four memory blocks M are disposed. For example, as shown in FIG. 20, 4 bit-line pairs of one sub-matrix 410 in the memory block $M_0$ and 4 bit-line pairs of one sub-matrix 410 in the memory block $M_1$, and so on, are coupled to a second column decoder 23 which outputs a second bit-line read signal $RD'_{01}$. Accordingly, the second bit-line read signal $RD'_{01}$ is input to the gates of 4 pairs of transistors $Q_3$ and $Q_4$, each pair corresponding to one of the sub-matrices 410 of each memory block M. To each pair of transistors $Q_3$ and $Q_4$, four pairs of bit lines $BL_i$ and $BL_i$ bar are connected via the corresponding pairs of the transistors $Q_1$ and $Q_2$, so that 16 pairs of bit lines $BL_i$ and $BL_i$ bar are coupled to one second column decoder 23.

As shown in FIG. 20, each bit line $BL_i$ of four pairs of bit lines $BL_i$ and $BL_i$ bar which correspond to a second column decoder 23 is connected to a first data line DATA via the source-drains of N-channel MOSFETs $Q_1$ and $Q_3$. Similarly, each bit line $BL_i$ bar of the four pairs of bit lines $BL_i$ and $BL_i$ bar which correspond to the second column decoder 23 is connected to a first data line DATA bar via the source-drains of N-channel MOSFETs $Q_2$ and $Q_4$. The first data lines DATA and DATA bar are paired.

The gates of the transistors $Q_1$ and $Q_2$ are connected to a second bit-line read signal line RD' from the second column decoder 23. The gates of the transistors $Q_3$ and $Q_4$ are connected to a first bit-line read signal line RD from the first column decoder 21.

When the first and second bit-line read signals RD and RD' go high ($V_{pp}$), each bit line $BL_i$ is electrically connected to the first data line DATA, and each bit line $BL_i$ bar is connected to the first data line DATA bar, via the transistors $Q_1$–$Q_4$. As seen from the setting of the high level potential $V_{pp}$, a signal having potential level of $V_{cc}$, GND, or an intermediate level thereof can be transferred via the transistors $Q_1$–$Q_4$ without being affected by the threshold voltage of the transistors $Q_1$–$Q_4$.

Next, the circuit configuration of the nonvolatile semiconductor memory device 400 is described in more detail. In this specification, as previously noted, each signal (for example, the first bit-line read signal) and the corresponding line for carrying the signal (for example, the first bit-line read signal line) will be denoted by the same symbol RD.

The construction of the memory cell 6 and the dummy cells 7–10 is identical with that of conventional ones as described above in Example 1.

As shown in FIG. 23, the first column decoder 21 includes a three-input NAND gate 21a and an inverter 21b. The row-address predecode signal $X_4$, the column-address predecode signal $Y_1$, and an inverted signal of a first bit-line selection signal RD1 bar are coupled to the three inputs of the NAND gate 21a, respectively. An output of the NAND gate 21a is coupled to an input of the inverter 21b, and an output of the inverter 21b is coupled to the first bit-line read signal line RD. Accordingly, the first bit-line read signal RD goes high ($V_{pp}$) when the output of the NAND gate 21a is low and the first bit-line selection signal RD1 bar goes low.

As shown in FIG. 24, the second column decoder 23 includes a NAND gate 1a and NOR gates 1b, 1c, and 1d. Two address lines from the column-address predecode signal lines $Y_2$ and $Y_3$ are connected to the NAND gate 1a. An output of the NAND gate 1a and the first bit-line selection signal RD1 bar are coupled to an input of the NOR gate 1b. The first bit-line selection signal RD1 bar goes low at the same time when the potential level of the selected word line WL goes high, and goes high ($V_{pp}$) at the same time when the potential level of the selected word line WL goes low, by the operation of the control circuit (not shown).

An output of the NOR gate 1b is coupled to the second bit-line read signal line RD'. Accordingly, the second bit-line read signal RD' goes high ($V_{pp}$) when the output of the NAND gate 1a is low and the first bit-line selection signal RD1 bar goes low.

By the second bit-line read signal RD', 16 pairs of the bit lines BL and BL bar are selected from the 256 pairs of the bit lines $BL_i$ and $BL_i$ bar of the four memory blocks. By the first and second bit-line read signals RD and RD', a single pair of the bit lines BL and BL bar are selected from the four memory blocks.

The output of the NAND gate 1a and the second bit-line selection signal RD2 bar are coupled to an input of the NOR gate 1c. The second bit-line selection signal RD2 bar goes low, when the selected bit lines BL and BL bar are electrically connected to the first data lines DATA and DATA bar via the transistors (transfer gates) $Q_1$–$Q_4$ and the potential levels thereof are equalized, by the operation of the control circuit (not shown).

The first bit-line read signal RD is input to the gates of the transistors $Q_1$ and $Q_2$, and the second bit-line read signal RD' is input to the gates of the transistors $Q_3$ and $Q_4$. The second bit-line selection signal RD2 bar goes high ($V_{pp}$) at the same time when the electric potential of the selected word line WL goes low by the operation of the control circuit (not shown).

The output of the NOR gate 1c is coupled to a sense amplifier driving signal line S via an inverter, and to a restore signal line R bar directly. Accordingly, the sense amplifier driving signal S goes high ($V_{cc}$), only when the output of the NAND gate 1a is low, and after the selected bit lines BL and BL bar are electrically connected to the first data lines DATA and DATA bar and the potential levels thereof are equalized. The restore signal R bar goes low, only when the output of the NAND gate 1a is low, and after the selected bit lines BL and BL bar are electrically connected to the first data lines DATA and DATA bar and the potential levels thereof are equalized.

The output of the NAND gate 1a and a third bit-line selection signal RD3 bar are coupled to an input of the NOR gate 1d. The third bit-line selection signal RD3 bar goes low, after the potential difference between a selected pair of the first data lines DATA and DATA bar are amplified by the sense amplifier/restore circuit 130, by the operation of the control circuit (not shown). The third bit-line selection signal RD3 bar goes high ($V_{pp}$), at the same time when the potential level of the selected word line WL goes low, by the operation of the control circuit (not shown).

The output of the NOR gate 1d is coupled to a third bit-line read signal line RD". Accordingly, the third bit-line read signal RD" goes high ($V_{cc}$), only when the output of the NAND gate 1a is low, and after the potential difference between the selected pair of the first data lines DATA and DATA bar are amplified by the sense amplifier/restore circuit 130. When the third bit-line read signal RD" goes high, as shown in FIG. 20, the pair of the first data lines DATA and DATA bar is electrically connected to the pair of the second data lines DATA' and DATA' bar via the transistors $Q_5$ and $Q_6$, so that the potential difference between the first data lines DATA and DATA bar are transferred to the pair of the second data lines DATA' and DATA' bar.

Figure 25:
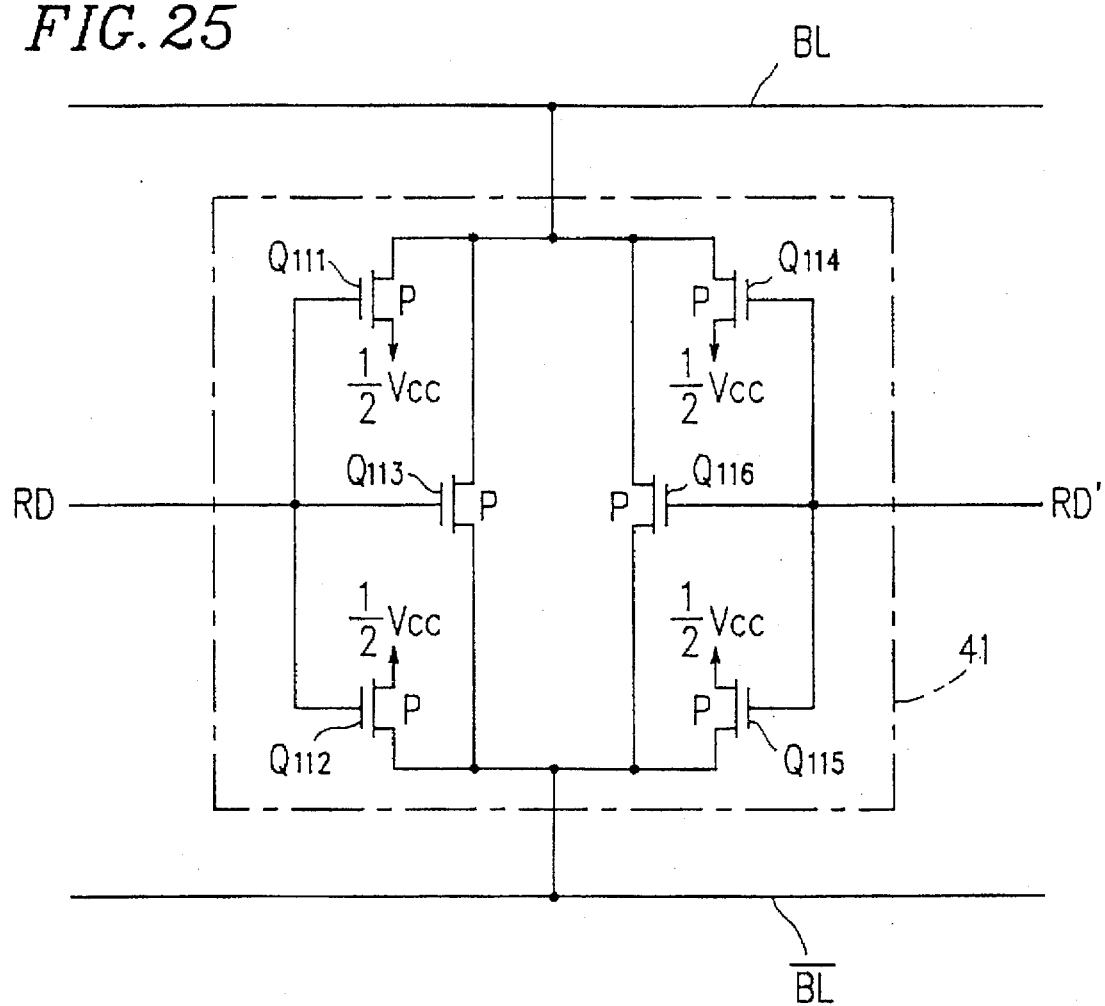
FIG. 25 is a block diagram showing the construction of a bit line precharge circuit shown in FIG. 20 in more detail.

As shown in FIG. 25, the bit-line precharge circuit 41 is connected to a pair of the bit lines $BL_i$ and $BL_i$ bar. The bit-line precharge circuit 41 includes six P-channel MOSFETs $Q_{111}$–$Q_{116}$. The sources of the transistors $Q_{111}$ and $Q_{114}$ are connected to a ($\frac{1}{2}$)$V_{cc}$ power supply which supplies a voltage which is half of the supply voltage $V_{cc}$. The drains of the transistor $Q_{111}$ and $Q_{114}$ are connected to one bit line $BL_i$. The sources of the transistors $Q_{112}$ and $Q_{115}$ are connected to the ($\frac{1}{2}$)$V_{cc}$ power supply and the drains thereof are connected to the other bit line $BL_i$ bar. The drains of the transistors $Q_{113}$ and $Q_{116}$ are connected to the one bit line $BL_i$, and the sources thereof are connected to the other bit line $BL_i$ bar. The gates of the transistors $Q_{111}$–$Q_{113}$ are all connected to the first bit-line read signal line RD, and the gates of the transistors $Q_{114}$–$Q_{116}$ are all connected to the second bit-line read signal line RD'. At least one of the first and second bit-line read signals RD and RD' is low when the corresponding bit lines $BL_i$ and $BL_i$ bar are not selected.

Accordingly, a bit-line pair is not selected when at least one of the corresponding first and second bit-line read signals RD and RD' is at the low level, or by setting at least one of the first and second bit-line read signals RD and RD' at the low level prior to the selection of the bit-line pair, the corresponding bit lines $BL_i$ and $BL_i$ bar are precharged to the voltage of ($\frac{1}{2}$)$V_{cc}$ via the transistors $Q_{111}$ and $Q_{112}$ or $Q_{114}$ and $Q_{115}$. At the same time, the potentials of the bit lines $BL_i$ and $BL_i$ bar are equalized by the transistors $Q_{113}$ or $Q_{116}$.

The first and second bit-line read signals RD and RD' go high when the corresponding pair of bit-lines and $BL_i$ bar are selected, and the transistors $Q_{111}$–$Q_{116}$ are turned-OFF (in a non-conductive state).

Figure 26:
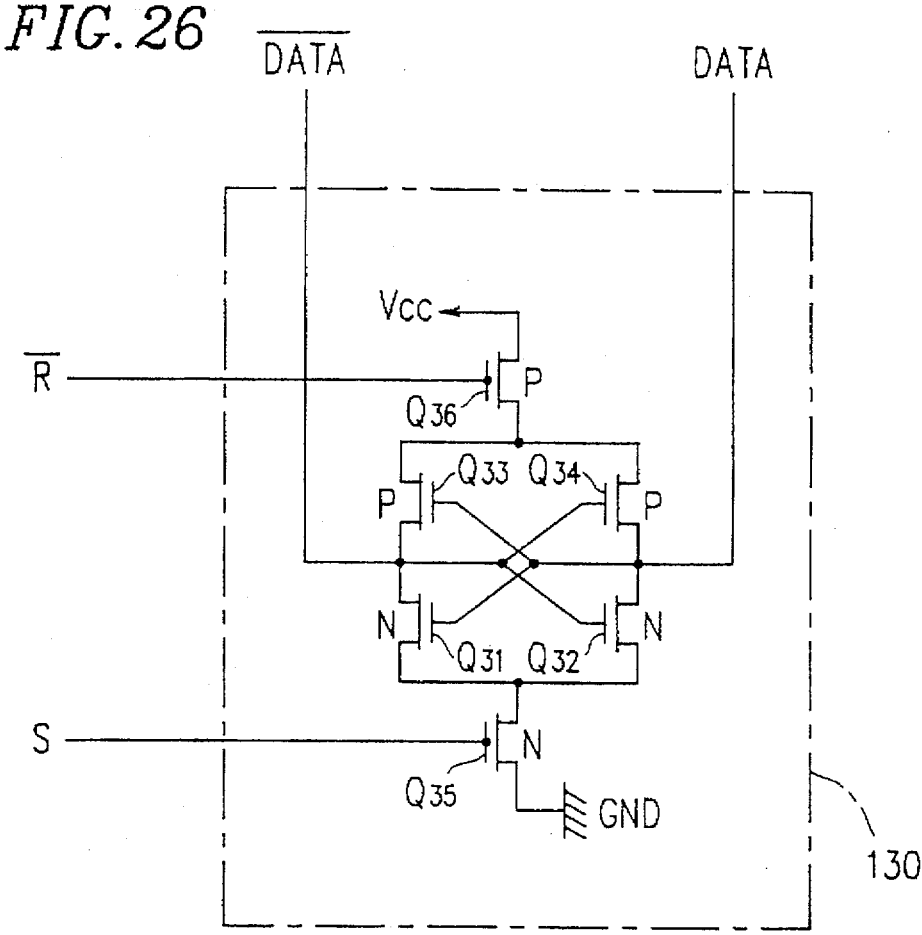
FIG. 26 is a block diagram showing the construction of a sense-amplifier/restore circuit shown in FIG. 20 in more detail.

As shown in FIG. 26, the sense amplifier/restore circuit 130 is connected to the pair of the first data lines DATA and DATA bar. The sense amplifier/restore circuit 130 includes N-channel MOSFETs $Q_{31}$ and $Q_{32}$ and P-channel MOSFETs $Q_{33}$ and $Q_{34}$, and differentially amplifies a small potential difference between the first data lines DATA and DATA bar so as to make the signal level valid. At this time, the lower potential level of the first data lines DATA and DATA bar is set at a ground level GND, and the higher potential level of the first data lines DATA and DATA bar is set at $V_{cc}$.

The transistors $Q_{31}$ and $Q_{32}$ are connected to the ground GND via an N-channel MOSFET $Q_{35}$. The gate of the transistor $Q_{35}$ is connected to a sense-amplifier driving signal line S. The sense-amplifier driving signal S goes high, after a small potential difference is read onto the first data lines DATA and DATA bar from the memory cell 6 and the corresponding pair of the dummy cells 7–10 in a read operation, as will be discussed later.

The transistors $Q_{33}$ and $Q_{34}$ are connected to the potential level $V_{cc}$ via an P-channel MOSFET $Q_{36}$. The gate of the transistor $Q_{36}$ is connected to a restore signal line R bar. The restore signal R bar goes high, after the small potential difference is read onto the first data lines DATA and DATA bar from the memory cell 6 and the corresponding one pair of the dummy cells 7–10 in a read operation, as will be discussed later.

The data line precharge circuit 60 is connected to a pair of the first data lines DATA and DATA bar. The structure of the common data line precharge circuit 60 is the same as that of the first example described above. The data line precharge signal RPD bar which is output from the data line precharge circuit 60 goes low after the potential level of the selected word line WL goes low, by the operation of the control circuit (not shown). The data line precharge signal DPR bar goes high ($V_{DP}$) prior that a word line WL is selected and the potential level thereof goes high, by the operation of the control circuit (not shown).

Thus, the pair of the first data lines DATA and DATA bar are precharged to the predetermined voltage $V_{DP}$ and the potential levels of the first data lines DATA and DATA bar are equalized, by lowering the data line precharge signal DPR bar. When the data line precharge signal DPR bar is at the high level ($V_{DP}$), the first data lines DATA and DATA bar are in a floating state.

The sense amplifier 30 is connected to the pair of second data lines DATA' and DATA' bar. The structure of the sense amplifier 30 is similar to that of the sense amplifier 3 described in the first example. The sense amplifier 30 differentially amplifies a small potential difference between the second data lines DATA' and DATA' bar, when the third bit-line selection signal RD3 bar goes low in a read operation and after the delay time of a series of four-stage delay inverters. The third bit-line selection signal RD3 bar goes high after the potential difference between the first data lines DATA and DATA bar is read out onto the second data lines DATA' and DATA bar', as will be described later.

Figure 27:
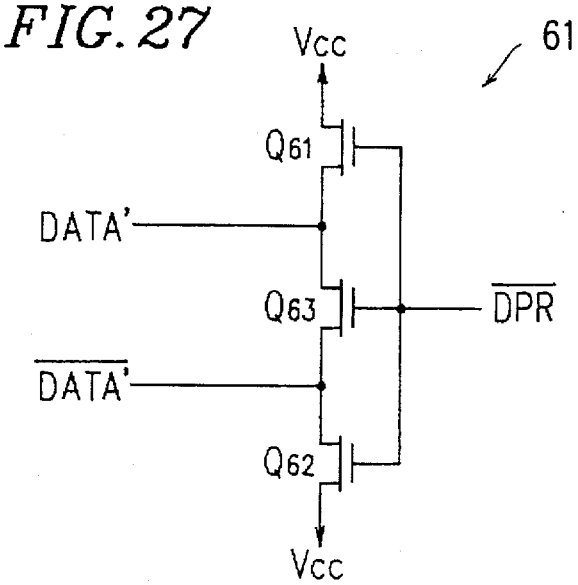
FIG. 27 is a block diagram showing the construction of a second bit line precharge circuit shown in FIG. 20 in more detail.

As shown in FIG. 20, the second data line precharge circuit 61 is connected to the pair of the second data lines DATA' and DATA' bar. The common data line precharge circuit 61 includes, as shown in FIG. 27, three P-channel MOSFETs $Q_{61}$–$Q_{63}$, similar to the data line precharge circuit 60. The difference between the second data line precharge circuit 61 and the data line precharge circuit 60 is that the sources of the transistors $Q_{61}$ and $Q_{62}$ are connected to the predetermined voltage $V_{DP}$ in the data line precharge circuit 60, while the sources of the transistors $Q_{61}$ and $Q_{62}$ are connected to the source supply voltage $V_{cc}$ in the second data line precharge circuit 61. Accordingly, when the data line precharge signal DPR bar goes low, the second data line precharge circuit 61 precharges the pair of the second data lines DATA' and DATA' bar to the voltage $V_{cc}$ and equalizes the potential levels thereof. When the data line precharge signal DPR bar is at the high level ($V_{DP}$), the second data lines DATA' and DATA' bar are in a floating state.

The potential level $V_{DP}$ for precharging the first data lines DATA and DATA bar is determined as follows in a similar manner as the first example:

Suppose a capacitance of the bit line BL (BL bar) is $C_{BL}$, and that of the first data line DATA (DATA bar) is $C_{DL}$. In the read operation, when the transistors $Q_3$ and $Q_4$ are turned-ON so as to electrically connected the first data line DATA (DATA bar) which is precharged to the potential level $V_{DP}$ by the data line precharge circuit 60 and the selected bit line BL (BL bar) which is precharged to the potential level $(½)V_{cc}$ by the bit line precharge circuit 41, an electric potential $V_{DP2}$ is realized by a charge-sharing between the first data line DATA (DATA bar) and the selected bit line BL (BL bar). The resultant potential level $V_{DP2}$ of the charge-sharing is expressed by the following Equation (15).

$$V_{DP2} = \frac{V_{DP} \cdot C_{DL} + (1/2)V_{cc} \cdot C_{BL}}{C_{BL} + C_{DL}} \quad (15)$$

The precharge potential level $V_{DP}$ of the first data line is set sufficiently high so as to satisfy the following Equation (16).

$$V_{DP2} - (1/2)V_{cc} = \frac{V_{DP} \cdot C_{DL} + (1/2)V_{cc} \cdot C_{BL}}{C_{BL} + C_{DL}} - (1/2)V_{cc} > V_c \quad (16)$$

The write circuit 50 is connected to the pair of second data lines DATA' and DATA' bar, as shown in FIG. 20. The structure of the write circuit 50 is similar to that of the first example.

When the write signal WEN is low, all of the transistors in the write circuit 50 are turned-OFF and the second data lines DATA' and DATA' bar are not affected, as described in the first example.

When the write signal WEN is high ($V_{cc}$) and the write data signal WDATA is low (corresponding to the data "0"), the second data line DATA' is electrically connected to the low level potential and the second data line DATA' bar is electrically connected to the high level potential ($V_{cc}$) by the write circuit 50, so that the data "0" is written onto the pair of second data lines DATA' and DATA' bar.

When the write signal WEN is high ($V_{cc}$) and the write data signal WDATA is high (corresponding to the data "1"), the second data line DATA' is electrically connected to the high level potential ($V_{cc}$) and the second data line DATA' bar is electrically connected to the low level potential by the write circuit 50, so that the data "1" is written onto the pair of second data lines DATA' and DATA' bar.

Next, the read operation for the memory cells 6 in the nonvolatile semiconductor memory device 400 are described. In the following explanation, a word line WL indicates any one of the word lines $WL_0$–$WL_{225}$ selected in the read operation. A bit line BL indicates one bit line of a selected pair of bit lines $BL_i$ and $BL_i$ bar, which is connected to the selected memory cell 6. Similarly, a bit line BL bar indicates the other of the selected pair of bit lines $BL_i$ and $BL_i$ bar, which is connected to the corresponding dummy cells. In addition, suppose the data "1" or "0" has been already stored in the memory cell 6 by the write operation as described above.

Figure 28:
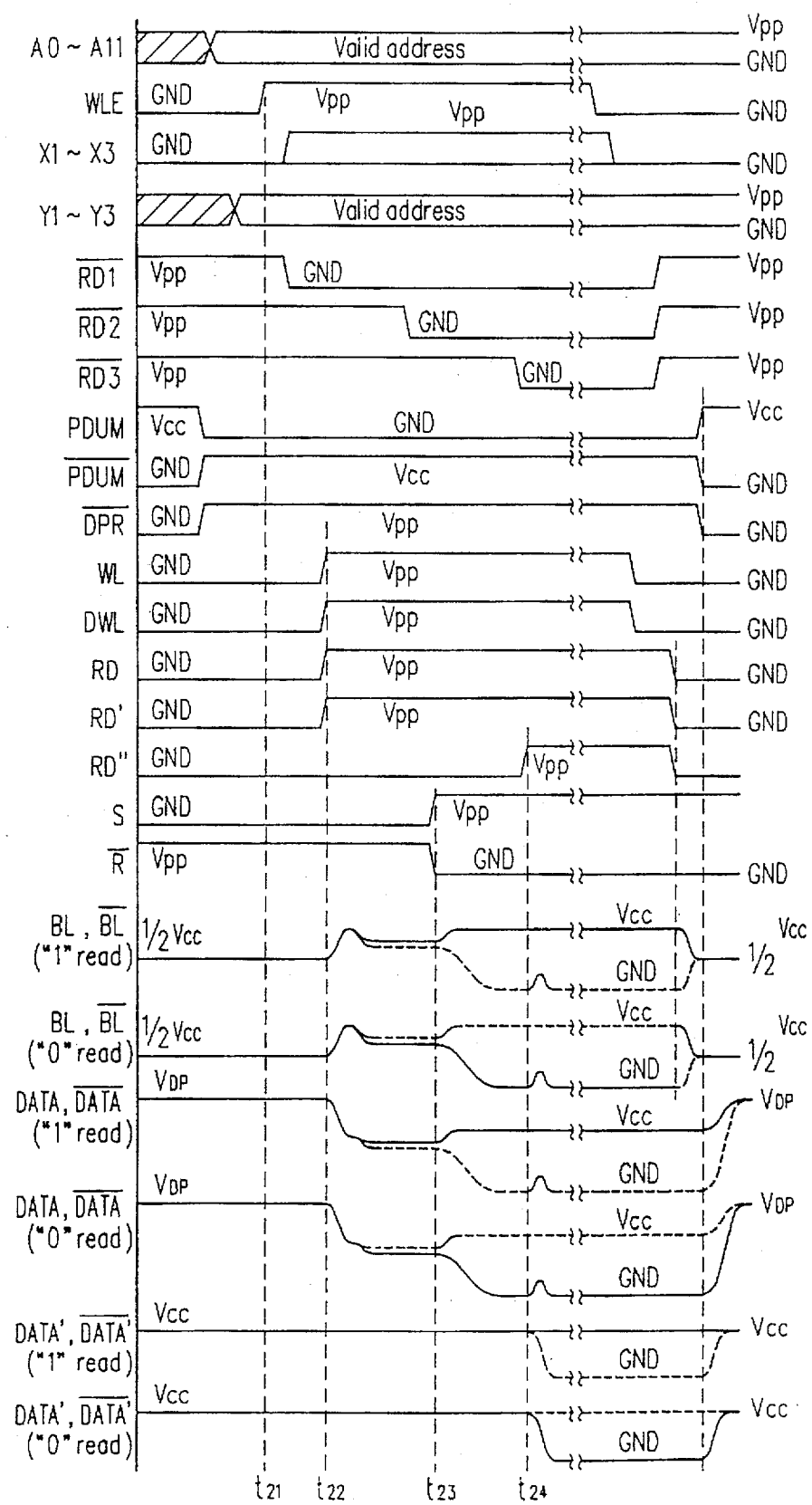
FIG. 28 is a timing diagram showing the read operation of a selected bit line in the nonvolatile semiconductor memory device in another embodiment of the present invention.

First, the read operation of the nonvolatile semiconductor memory device 400 will be described with reference to the drawings. FIG. 28 shows a read operation for the selected bit line BL.

Prior to the read operation, by allowing the first bit-line selection signal RD1 bar to go high, the second bit-line read signal RD' (the second bit-line read signals $RD'_{01}$–$RD'_{16}$ as shown in FIG. 20) goes low, so that all of the bit-line precharge circuits 41 are driven to precharge all the bit lines $BL_i$ and $BL_i$ bar to a voltage half of the supply voltage $V_{cc}$. For example, as shown in FIGS. 20 and 21, when the second bit-line read signal $RD'_{01}$ goes low, the corresponding bit-line precharge circuits 41 which are connected the second bit-line read signal line $RD'_{01}$ via the switching elements is driven to precharge the bit-line pairs which are included in the four corresponding sub-matrices 410 (one sub-matrix 410 per memory block M).

By allowing the dummy cell precharge lines PDUM and PDUM bar to go high and low, respectively, a positive or negative remanent polarization charge is stored in a ferroelectric film of each of the dummy capacitors $C_D$ of the dummy cells 7–10.

At the same time, by allowing the data line precharge signal DPR bar to go low, the data line precharge circuit 60 and the second data line precharge circuit 61 are driven to precharge the first data lines DATA and DATA bar to the predetermined voltage $V_{DP}$, and the second data lines DATA' and DATA' bar to the source supply voltage $V_{cc}$.

The address signals A0–A13 are defined prior to the read operation. Accordingly, when the word-line enable signal WLE goes high at the start of the read operation (at the time $t_{21}$), among the row-address predecode signals $X_{1(0,1,2,3)}$–$X_4$ (0,1,2,3), signals which correspond to the address signals A6–A13 go high so that a word line WL is selected and the potential level thereof goes high (at the time $t_{22}$).

The column-address predecode signal $Y_{1(0,1,2,3)}$ goes high or low in accordance with the address signals A0 and A1. In the read operation, when the first bit-line selection signal RD1 bar goes low, the first column-decoder 21 selects a pair of bit lines BL and BL bar and allows the corresponding first bit-line read signal RD to go high (at the time $t_{22}$). Similarly, the column-address predecode signals $Y_{2(0,1,2,33)}$ and $Y_{3(0,1,2,3)}$ go high or low in accordance with the address signals A2–A5. In the read operation, when the first bit-line selection signal RD1 bar goes low, the second column-decoder 23 allows the second bit-line read signal RD' corresponding to the selected pair of bit lines BL and BL bar to go high (at the time $t_{22}$).

Approximately the same time as (or a short time prior to or after) the time $t_{22}$, the electric potential level of the selected word line WL goes high so as to turn-ON the transistor $Q_s$ of the memory cell 6. Then, the respective charge on the bit lines BL and the first data line DATA and the remanent polarization charge $P_r$ of the capacitor $C_s$ are charge-shared. Suppose the capacitance $C_{BL}$ of the bit line BL and the capacitance $C_{DL}$ of the first data line DATA are sufficiently larger than the capacitance $C_s$ of the capacitor $C_s$, so that a voltage substantially equal to the electric potential $V_{DP2}$ is applied to one of the electrodes of the capacitor $C_s$.

In the case where the data "1" is stored in the memory cell 6, as discussed above in the first example with reference to FIG. 9, a polarization charge $P_{DP2[1]}$ is accumulated in the ferroelectric film of the capacitor $C_s$. The potential variation $V_1$ of the bit line BL is given by Equation (17) below. The potential level of the bit line BL is lowered by a small amount.

$$V_1 = -\frac{P_{DP2[1]} - P_r}{C_{BL} + C_{DL}} \quad (17)$$

In the case where the data "0" is stored in the memory cell 6, as described above in the first example with reference to FIG. 11, a polarization charge $P_{DP2[0]}$ is accumulated in the ferroelectric film of the capacitor $C_s$. The potential variation $V_0$ of the bit line BL is given by Equation (18) below. The potential level of the bit line BL is lowered by a relatively large amount.

$$V_0 = -\frac{P_{DP2[0]} - P_r}{C_{BL} + C_{DL}} \quad (18)$$

In the read operation, the potential level of a dummy word line DWL which corresponds to the selected word line WL goes high. As discussed in the first example, a total amount of charge which is transferred from the bit line BL bar to the corresponding pair of the dummy cells is obtained by summing the above-mentioned values, resulting in $(P_{DP2[1]} + P_{DP2[0]})/2$. The potential variation $V_D$ of the bit line BL bar is a constant given by Equation (19) below.

$$V_D = -\frac{(P_{DP2[1]} + P_{DP2[0]})/2}{C_{BL} + C_{DL}} \quad (19)$$

Accordingly, the potential difference given by Equation (20) below is obtained in a short time after the time $t_{22}$ between the bit lines BL and BL bar to which the selected memory cell 6 and the corresponding pair of dummy cells are connected.

$$V_{dif1} = \frac{P_r - (P_{DP2[1]} - P_{DP2[0]})/2}{C_{BL} + C_{DL}} \quad (20)$$

Similarly, in the case where the data "0" is stored in the memory cell 6, the potential difference $V_{dif0}$ is obtained from the difference between the potential variations $V_0$ and $V_D$ expressed in Equations (18) and (19), and given by Equation (21) below.

$$V_{dif0} = \frac{P_r - (P_{DP2[1]} - P_{DP2[0]})/2}{C_{BL} + C_{DL}} \quad (21)$$

Accordingly, as seen from Equations (20) and (21), the potential differences between the bit lines BL and BL bar corresponding to the selected memory cell 6 have a same magnitude and the opposite polarity in accordance with the data stored in the memory cell 6.

The high potential levels of the word line WL and the dummy word line DWL are, as shown in FIG. 28, set at the potential level $V_{pp}$ which is higher than the power supply voltage level $V_{cc}$ by at least the threshold voltage $V_{th}$ of the transistors $Q_s$ and $Q_D$. This makes sure to apply the voltage $V_{DP2}$ ($\leq V_{cc}$) to one electrode of each of the capacitor $C_s$ and the dummy capacitor $C_D$ when the bit line BL (BL bar) and the common data line DATA (DATA bar) are electrically connected.

The high level of the first and second bit-line read signals RD and RD' are, as shown in FIG. 28, also set at the potential level $V_{pp}$ which is higher than the power supply voltage level $V_{cc}$ by at least the threshold voltage $V_{th}$ of the transistors $Q_1$–$Q_4$. This makes sure to electrically connect the bit line BL (BL bar) and the common data line DATA (DATA bar) so as to obtain the predetermined potential level $V_{DP2}$.

The order with respect to time when the potential level of the word line WL goes high and when the first and second bit-line read signals RD and RD' go high is arbitrary, and makes no difference in the potential difference which is read out from the memory cell 6 and the corresponding dummy cells onto the pair of bit lines BL and BL bar.

In the read operation, the selected bit lines BL and BL bar are electrically connected to the first data lines DATA and DATA bar, respectively, so that the potential difference between the pair of bit lines BL and BL bar is read out onto the pair of first data lines DATA and DATA bar.

At the time $t_{23}$, when the second bit line selection signal RD2 bar goes low, the sense amplifier driving signal S goes high and the restore signal R bar goes low so as to drive the sense amplifier/restore circuit 130. The sense amplifier/restore circuit 130 differentially amplifies the potential difference between the pair of first data lines DATA and DATA bar so as to set a lower potential level of the pair at the ground GND while a higher potential level of the pair at the source supply voltage $V_{cc}$, based on the polarity of the potential difference. Accordingly, the potential difference between the first data lines DATA and DATA bar is sufficiently amplified and the data stored in the memory cell 6 is output.

At this time, since the lines BL and BL bar are electrically connected to the first data lines DATA and DATA bar, respectively, so that a lower potential level of the pair of bit lines BL and BL bar is set at the ground GND, while a higher potential level of the pair of bit lines BL and BL bar is set at the source supply voltage $V_{cc}$.

Accordingly, when the data "1" has been stored in the memory cell 6 before the read operation, one electrode of the capacitor $C_s$ is supplied with the source supply voltage $V_{cc}$ after the read operation. On the other hand, when the data "0" has been stored in the memory cell 6 before the read operation, one electrode of the capacitor $C_s$ is supplied with the ground voltage GND after the read operation. Thus, in accordance with the previous data of the memory cell 6, either one of the voltages which have the same magnitude of $(\frac{1}{2})V_{cc}$ and the opposite polarity is applied across the electrodes of the capacitor $C_s$. Therefore, the polarization charge $P_r$ or $-P_r$ which is the same as that before the read operation is rewritten in the ferroelectric film of the capacitor $C_s$, in the same manner as the restore operation (as shown in FIGS. 36 and 38) of the conventional nonvolatile semiconductor memory device 500. As described above, the data which is identical with that stored in the memory cell 6 prior to the read operation is rewritten in the memory cell 6.

At the time $t_{24}$, when the third bit line selection signal RD3 bar goes low, the third bit line read signal RD" goes high, so that the transistors $Q_5$ and $Q_6$ are turned-ON and the potential difference between the first data lines DATA and DATA bar is transferred to the second data lines DATA' and DATA' bar. In a predetermined delay time after the third bit line selection signal RD3 bar goes low, the sense amplifier 3 is driven to differentially amplify the potential difference between the second data lines DATA' and DATA' bar. The predetermined delay time is given by the four-stage delay inverters of the sense amplifier 3. The data stored in the memory cell 6 is output by reading the amplified signal on the second data lines DATA' and DATA' bar.

The high potential level of the word line WL and the high level of the first, second and third bit-line read signals RD, RD', and RD" are, as shown in FIG. 28, set at the potential level $V_{pp}$ which is higher than the power supply voltage level $V_{cc}$ by at least the threshold voltage $V_{th}$ of the transistors $Q_s$, and $Q_1-Q_6$. This makes sure to apply the source supply voltage $V_{cc}$ to one electrode of the capacitor $C_s$.

Next, the read operation of the nonvolatile semiconductor memory device 400 for a non-selected pair of bit lines $BL_j$ and $BL_j$ bar will be described.

Figure 29:
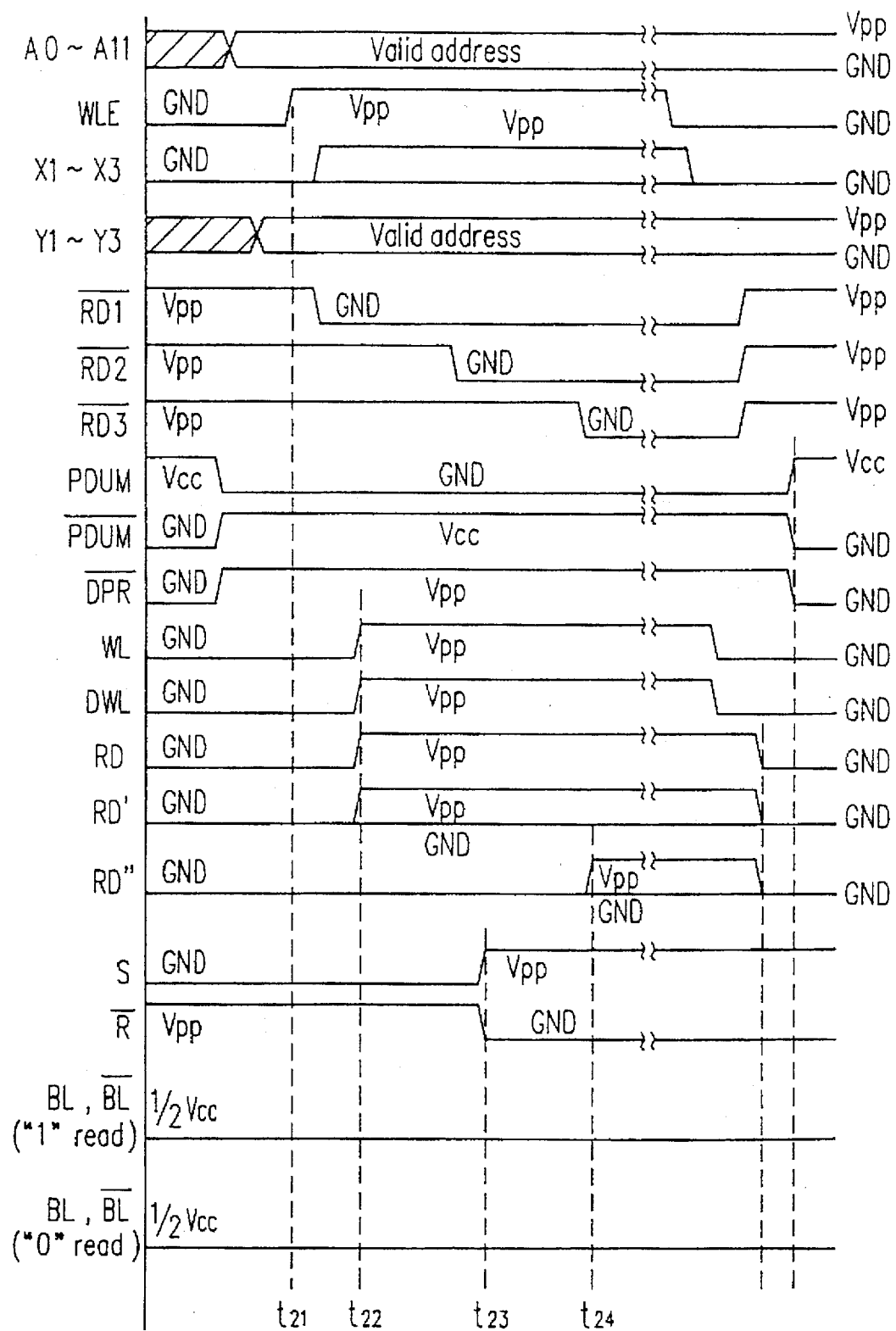
FIG. 29 is a timing diagram showing the read operation of non-selected bit lines in the nonvolatile semiconductor memory device in another embodiment of the present invention.

The non-selected pairs of bit lines $BL_i$ and $BL_i$ bar are also precharged to the voltage of $(½)V_{cc}$ by the bit-line precharge circuit 41, and remains at the same voltage $(½)V_{cc}$ during the read operation (see FIG. 29).

In the case where the data "1" is stored in the memory cell 6, a positive remanent polarization charge $P_r$ is held in the ferroelectric film of the capacitor $C_s$ as shown in FIG. 12. During the read operation, the potential level of the bit line $BL_i$ ($BL_i$ bar) and that of the other electrode of the capacitor $C_s$ remain the same potential level of $(½)V_{cc}$. Accordingly, when the potential level of the selected word line WL goes high so as to turn-ON the transistor $Q_s$, no voltage is applied across the electrodes of the capacitor $C_s$. Thus, as shown in FIG. 13, the remanent polarization charge $P_r$ remains unchanged, so that the data "1" is retained in the memory cell 6.

In the case where the data "0" is stored in the memory cell 6, a negative remanent polarization $-P_r$ (i.e., the opposite polarization with respect to that of the data "1") is held in the ferroelectric film of the capacitor $C_s$ as shown in FIG. 14. During the read operation, the potential level of the bit line $BL_i$ ($BL_i$bar) and that of the other electrode of the capacitor $C_s$ remain the same potential level of $(½)V_{cc}$. Accordingly, when the potential level of the selected word line WL goes high so as to turn-ON the transistor $Q_s$, no voltage is applied across the electrodes of the capacitor $C_s$. Thus, as shown in FIG. 15, the remanent polarization charge $-P_r$ remains unchanged, so that the data "0" is retained in the memory cell 6. In addition, in both cases of the data "1" and "0", the potential level of the bit line $BL_i$ ($BL_i$ bar) is unchanged.

Next, the read operation for the non-selected bit lines $BL_j$ and $BL_j$ bar will be described more in detail with reference to FIG. 29. Prior to the read operation, by allowing the first bit-line selection signal RD bar to go high, the first and second bit-line write signals RD and RD' go low, so that the bit-line precharge circuit 41 is driven to precharge the bit lines $BL_j$ and $BL_j$ bar to a half voltage of the supply voltage $V_{cc}$. By allowing the dummy cell precharge lines PDUM and PDUM bar to go high and low, respectively, a positive or negative remanent polarization charge is stored in a ferroelectric film of each of the dummy capacitors $C_D$ of the dummy cells 7–10. At the same time, by allowing the data line precharge signal DPR bar to go low, the first and second data line precharge circuits 60 and 61 are driven to precharge the first data lines DATA and DATA bar to the predetermined voltage $V_{DP}$, and the second data lines DATA' and DATA' bar to the source supply voltage $V_{cc}$.

At the start of the read operation, the word-line enable signal WLE goes high (at the time $t_{21}$), and the potential level of the word line WL goes high at the time $t_{22}$. Then, in the read operation, the first bit-line selection signal RD1 bar goes low. Nevertheless, since the bit lines $BL_j$ and $BL_j$ bar are not selected, at least one of the first and second bit-line read signals RD and RD' for the first and second column-decoders 21 and 23 remains low (at the time $t_{22}$). Accordingly, the non-selected bit lines $BL_j$ and $BL_j$ bar are not electrically connected to the first data lines DATA and DATA bar. Furthermore, since at least one of the first and second bit-line read signals RD and RD' remains low, the bit-line precharge circuit 41 is still driven, so that the bit lines $BL_i$ and $BL_i$ bar are kept at the precharged potential level of $(½)V_{cc}$.

Accordingly, even when the word line WL is selected and the potential level thereof goes high so as to turn-ON the transistor $Q_s$, at the time $t_{22}$, the potential level of the non-selected bit lines $BL_j$ and $BL_j$ bar are not changed. Thus, as shown in FIGS. 12–15, the data stored in the memory cell 6 is retained. At the time $t_{22}$, one of the dummy word lines DWL goes high so as to turn-ON the transistors $Q_D$ of the corresponding pair of the dummy cells 7 and 8 or 9 and 10. However, similar to the non-selected memory cell 6, the potential level of the bit line $BL_j$ or $BL_j$ bar to which the dummy cell-pair is connected is not changed.

At the time $t_{23}$, the sense amplifier driving signal S and the restore signal R bar go high and low, respectively, so as to drive the sense amplifier/restore circuit 130. The potential levels of the pair of first data lines DATA and DATA bar are changed by the sense amplifier/restore circuit 130. However, since the non-selected bit lines $BL_j$ and $BL_j$ bar are electrically disconnected from the first data lines DATA and DATA bar, the potential levels of the non-selected bit lines $BL_j$ and $BL_j$ bar remain unchanged.

As descried above, according to the nonvolatile semiconductor memory device 400 of the present invention, the electric potential level of the non-selected bit lines $BL_j$ and $BL_j$ bar is kept at $(½)V_{cc}$ which is the same as that of the common cell plate to which the other electrode of the capacitor $C_s$ of the memory cell 6. Thus, even when the word line WL is selected and the transistor $Q_s$ of the non-selected memory cell 6 is turned-ON so as to connect the one electrode of the capacitor $C_s$ to the bit line $BL_j$ or $BL_j$ bar, no voltage is applied across the electrodes of the capacitor $C_s$ but the remanent polarization charge of the ferroelectric film remains unchanged. This eliminates the rewrite operations of the non-selected memory cells 6 which are connected to the selected word line WL and the non-selected bit line $BL_j$ or $BL_j$ bar. Accordingly, the nonvolatile semiconductor memory device 400 reduces significantly the power consumption which has been required to perform the read and rewrite operations of a number of memory cells the data stored in which is not necessary to be read.

In addition, according to the nonvolatile semiconductor memory device 400 of the present invention, a sense amplifier is not required to be provided to every bit-line pair, as compared with the conventional nonvolatile semiconductor memory device 500 shown in FIG. 31. This makes it possible to reduce, for example, a chip area of the memory device.

Figure 30:
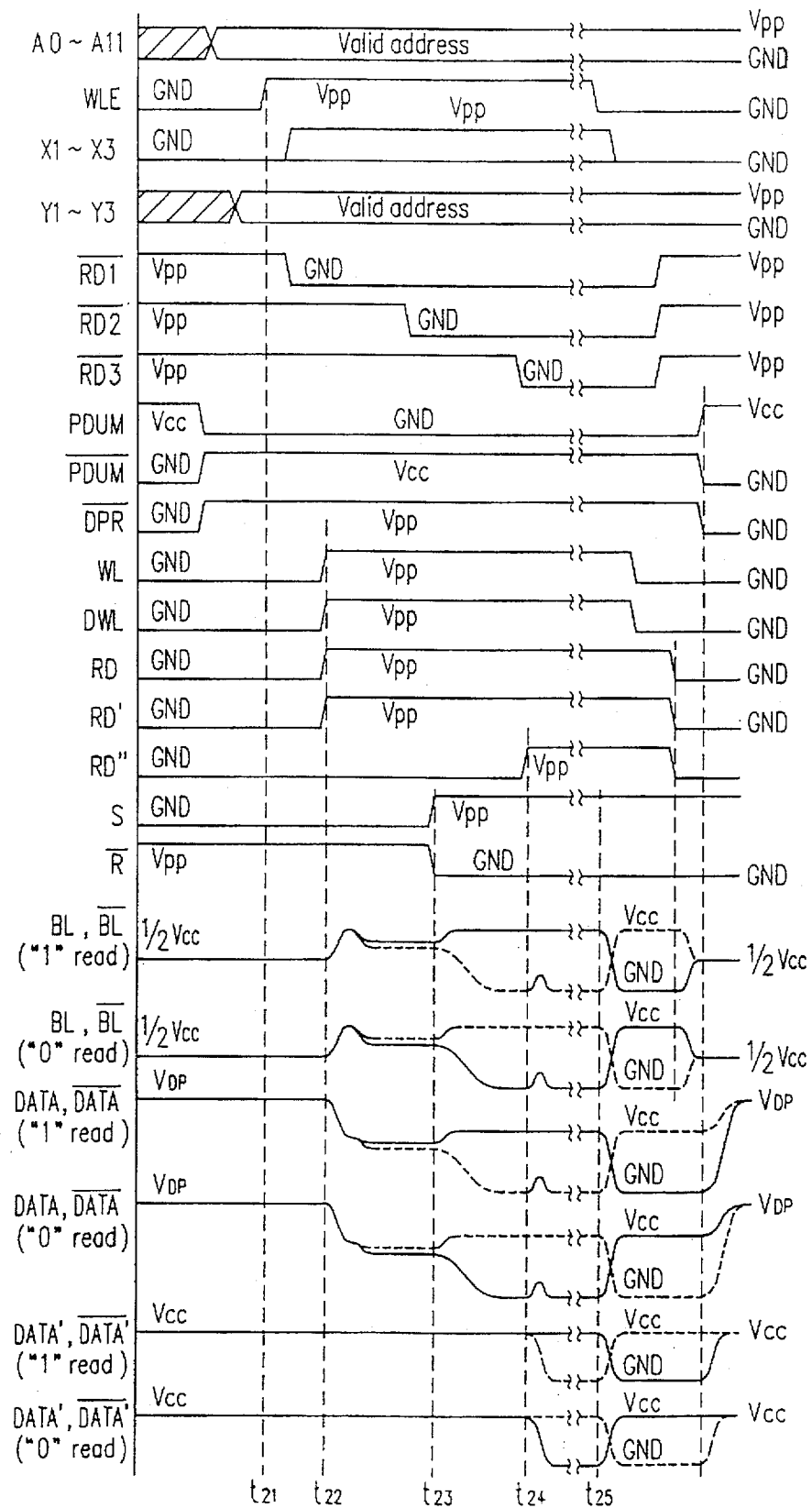
FIG. 30 is a timing diagram showing the write operation of a selected bit line in the nonvolatile semiconductor memory device in another embodiment of the present invention.

Next, the write operation of the memory cell 6 will be described with reference to a timing diagram of FIG. 30. The operation until the time $t_{24}$ (the restore operation) is the same as that of the read operation of the selected bit line BL as shown in FIG. 28. In the following explanation, the memory cell 6 is supposed to be connected to the bit line BL.

Then, when the write enable signal WEN goes high at the time $t_{25}$, the potential levels of the second data line DATA' (DATA' bar), the first data line DATA (DATA bar) which is electrically connected to the second data line DATA' (DATA' bar), and the bit line BL (BL bar) which is electrically connected to the first data line DATA (DATA bar) are shifted in accordance with the write data signal WDATA.

In the case where the write data signal WDATA is high corresponding to the data "1", the potential levels of the second data line DATA', the first data line DATA, and the corresponding bit line BL go high, while the potential levels of the second data line DATA' bar, the first data line DATA bar, and the corresponding bit line BL bar go low.

In the case where the write data signal WDATA is low corresponding to the data "0", the potential levels of the second data line DATA', the first data line DATA, and the corresponding bit line BL go low, while the potential levels of the second data line DATA' bar, the first data line DATA bar, and the corresponding bit line BL bar go high. The data corresponding to the write data signal WDATA is written into the memory cell 6 in a same manner as that of the conventional nonvolatile semiconductor memory device 500.

The advantage of the present invention which eliminates the problem of the conventional nonvolatile semiconductor memory device 600 that the time required for a read operation is longer than that of the conventional nonvolatile semiconductor memory device 500 will be explained below.

In general, in order to read the data from a ferroelectric capacitor of a memory cell, it is required to apply a voltage (potential difference) across the electrodes of the ferroelectric capacitor. When the voltage is applied, the data stored in the ferroelectric capacitor is destroyed (a so called a destructive read). Therefore, in order to prevent the read data from being lost by the read operation, the rewrite (restore) operation has to be performed for all memory cells in which the voltage has been applied to the ferroelectric capacitor thereof. Thus, by preventing the destruction of the data of non-selected memory cells (the memory cells which are connected to the selected word line but not connected to the selected bit line), rewrite operations for the non-selected memory cells are eliminated so that the power consumption of the memory device can be reduced.

In the present invention, this is realized by setting the electric potential of the selected bit line at a different level from that of the other electrode of the capacitor. The conventional nonvolatile semiconductor memory device 600 also sets the electric potential of the selected bit line at a different level from that of the other electrode of the capacitor. However, the present invention is different from the conventional nonvolatile semiconductor memory device 600 in the following points and has the significant advantage of not increasing the time for the read operation.

In the conventional nonvolatile semiconductor memory device 600, the selected bit line to which the selected memory cell is connected is precharged to a predetermined potential level different from that of the other electrode of the capacitor by precharge means. During the precharge operation, since the bit line is electrically connected to the precharge potential of a precharge source supply, the word line can not be activated. If the word line is activated during the precharge operation, the charge read from the capacitor onto the bit line is carried away to the precharge source supply, so that the data is lost. Accordingly, in the conventional nonvolatile semiconductor memory device 600, the selected bit line is precharged to the predetermined potential level, and then the word line is activated in each read operation.

In addition, since the conventional nonvolatile semiconductor memory device 600 precharges the selected bit line, the precharge operation can not be performed until a memory cell and the corresponding bit line are selected. Accordingly, in the conventional nonvolatile semiconductor memory device 600, after the read operation for the selected memory cell is started, the selected bit line is precharged to the predetermined potential level, and after the precharge operation is completed, the selected word line is activated so as to read the data of the memory cell. This procedure increases the time for each read operation.

On the other hand, the semiconductor memory device of the present invention precharges the data line (common data line or first and second data lines) to a predetermined potential level by using the data line precharge circuit, but not the selected bit line to which the memory cells are connected. The predetermined potential level has been described above in the examples. The selected bit line is set at the predetermined potential level by electrically connecting the bit line to the precharged data line. When the bit line is electrically connected to the data line, the bit line and the data line are in floating state. Therefore, even if the word line is activated at the same time as the electrically connecting, the electric charge read from the capacitor is not carried away to any node other than the bit line and data line. The data read from the memory cell is not lost by activating the word line during the precharge of the selected bit line.

In the semiconductor memory device of the present invention, the precharge operation is not performed directly for the selected bit line but performed for the data line. Thus, the precharge operation can be performed prior to the read operation. Accordingly, the activation of the word line and the precharge of the selected bit line (i.e., electrically connecting the selected bit line and the precharged data line) can be performed at the same time. This procedure requires on additional time for precharging after the start of the read operation, so that the time for the read operation is not increased.

As described above, according to the present invention, the data stored in a non-selected memory cell which is connected to a selected word line and to a non-selected bit line is not destroyed in the read operation. Therefore, the rewrite operation is not required for the non-selected bit lines which are the majority of all of the bit lines after the read operation. This makes it possible to reduce significantly the power consumption of the semiconductor memory device.

In addition, a sense amplifier is not necessary to be provided for each bit-line pair. Consequently, the chip area of the semiconductor memory device can be reduced.

By setting a voltage level for the write signal higher than and independent of the source supply voltage, the source supply voltage can be lowered when it is desired.

Furthermore, the above mentioned advantages are realized without increasing the time for the read operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including at least one memory block comprising:

a plurality of word lines;

a plurality of bit lines; and a plurality of memory cells which are disposed at crossings of the word lines and the bit lines, each memory cell including first switching means and a capacitor which is connected to the bit line via the first switching means, the first switching means being turned on and off in accordance with a signal level supplied from the corresponding word line, and data being written to and read from the capacitor by a voltage signal supplied from the bit line, wherein the semiconductor memory devices includes:

a node comprising capacitance means having a predetermined capacitance;

second switching means for connecting the bit line to the node;

means for precharging the plurality of bit lines to a first voltage potential;

means for precharging the capacitance means to a second voltage potential, wherein the first and second voltage potential are not equal to one another; and control means for controlling the first switching means so as to connect electrically the memory cell which is coupled to the word line selected in a read operation to the corresponding bit line, and for controlling the second switching means so as to connect electrically the bit line which is selected in the read operation to the node comprising the precharged capacitance means, wherein the electric potential of the selected bit line changes to a third voltage potential which is between the first and second voltage potentials so as to apply the voltage potential to the capacitor of the selected memory cell which is coupled to the selected word line and the selected bit line, thereby reading a data signal corresponding the data stored in the capacitor of the selected memory cell onto the selected bit line and the node.

2. A semiconductor memory device according to claim 1, wherein the node comprising the capacitance means is provided for each of the plurality of bit lines, and the second switching means connects the bit line which is selected from the plurality of bit lines to the corresponding node.

3. A semiconductor memory device according to claim 1, wherein the node comprising the capacitance means is provided commonly for the plurality of bit lines, and the second switching means connects the bit line which is selected from the plurality of bit lines to the node.

4. A semiconductor memory device including at least one memory block comprising:

a plurality of word lines;

a plurality of bit lines; and a plurality of memory cells which are disposed at crossings of the word lines and the bit lines, each memory cell including first switching means and a capacitor which is connected to the bit line via the first switching means, the first switching means being turned on and off in accordance with a signal level supplied from the corresponding word line, and data being written to and read from the capacitor by a voltage signal supplied from the bit line, wherein the semiconductor memory device includes;

a node comprising capacitance means having a predetermined capacitance;

second switching means for connecting the bit line to the node;

means for precharging the bit line;

means for precharging the capacitance means; and control means for controlling the first switching means so as to connect electrically the memory cell which is coupled to the word line selected in a read operation to the corresponding bit line, and for controlling the bit line which is selected in the read operation to the node comprising the precharged capacitance means, whereby changing the electric potential of the selected bit line so as to applying a predetermined voltage signal to the capacitor of the selected memory cell which is coupled to the selected word line and the selected bit line, whereby reading a data signal corresponding the data stored in the capacitor of the selected memory cell onto the selected bit line and the node, wherein the plurality of memory cells are arranged in a matrix, the capacitor in each memory cell includes a pair of electrodes and a ferroelectric film provided therebetween, and stores the data in a nonvolatile manner, one of the electrodes being connected to the corresponding bit line via the first switching means, the means for precharging the bit line precharges the plurality of bit lines to a first potential level which is the same as a potential level of the other electrode of the capacitor, the means for precharging the capacitance means precharges the capacitance means to a second potential level which is different from the first potential level, and the control means controls the first and second switching means so as to change the potential level of the one electrode of the capacitor of the selected memory cell to a third potential level between the first and second potential levels, whereby reading a data signal corresponding to the data stored in the ferroelectric film of the capacitor onto the selected bit line and the node.

5. A semiconductor memory device according to claim 4, wherein the means for precharging the capacitance means sets the second potential level so that a difference between the first and third potential levels is greater than a polarization inversion voltage of the ferroelectric film of the capacitor, the third potential level being obtained by charge-sharing between the one electrode of the capacitor of the selected memory cell, the selected bit line, and the capacitance means.

6. A semiconductor memory device including at least one memory block comprising:

a plurality of word lines;

a plurality of bit lines; and a plurality of memory cells which are disposed at crossings of the word lines and the bit lines, each memory cell including first switching means and a capacitor which is connected to the bit line via the first switching means, the first switching means being turned on and off in accordance with a signal level supplied from the corresponding word line, and data being written in and read from the capacitor by a voltage signal supplied from the bit line, wherein the memory block is divided into a plurality of sub-matrices each including a predetermined number of the bit lines, and wherein the semiconductor memory device includes:

a first node provided for at least one sub-matrix of the at least one memory block, comprising first capacitance means having a first predetermined capacitance;

second switching means for selectively connecting the predetermined number of the bit lines included in each sub-matrix to the corresponding the first node;

a second node provided for the whole of the at least one memory block, comprising second capacitance means having a second predetermined capacitance;

third switching means for selectively connecting the first node to the second node;

means for precharging the plurality of bit lines;

first precharge means for precharging the first capacitance means;

second precharge means for precharging the second capacitance means; and control means for controlling the first switching means so as to connect electrically the memory cell which is coupled to the word line selected in a read operation to the corresponding bit line, and for controlling the second switching means so as to connect electrically the bit line which is selected in the read operation to the first node comprising the precharged first capacitance means, whereby changing the electric potential of the selected bit line so as to apply a predetermined voltage signal to the capacitor of a selected memory cell which is coupled to the selected word line and the selected bit line, whereby reading a data signal corresponding the data stored in the capacitor of the selected memory cell onto the selected bit line and the first node, and for controlling the third switching means so as to transfer the data signal which is read on the first node onto the second node.

7. A method for driving a semiconductor memory device including:

at least one memory block comprising: a plurality of word lines; a plurality of bit lines; and a plurality of memory cells which are disposed at crossings of the word lines and the bit lines, each memory cell including first switching means and a capacitor which is connected to the bit line via the first switching means, the first switching means being turned on and off in accordance with a signal level supplied from the corresponding word line, and data being written in and read from the capacitor by a voltage signal supplied from the bit line;

a node comprising capacitance means having a predetermined capacitance; and second switching means for connecting the bit line to the node, the method including the steps of:

precharging the plurality of bit line to a first potential level;

precharging the capacitance means to a second potential level which is different from the first potential level;

turning on the first switching means coupled to the word line which is selected in a read operation whereby electrically connecting the capacitor of the corresponding memory cell to the corresponding bit line;

turning on the second switching means whereby electrically connecting the bit line which is selected in the read operation to the node comprising the precharged capacitance means;

changing the electric potential of the selected bit line whereby applying a predetermined voltage signal to the capacitor of the selected memory cell which is coupled to the selected word line and the selected bit line, as a result of turning on the first and second switching means; and reading a data signal corresponding the data stored in the capacitor of the selected memory cell onto the selected bit line and the node.

8. A method for driving a semiconductor memory device according to claim 7, wherein the node comprising the capacitance means is provided for each of the plurality of bit lines, and wherein in the step of turning on the second switching means, the bit line which is selected from the plurality of bit lines is connected to the corresponding node.

9. A method for driving a semiconductor memory device according to claim 7, wherein the node comprising the capacitance means is provided commonly for the plurality of bit lines, and wherein in the step of turning on the second switching means, the bit line which is selected from the plurality of bit lines is connected to the node.

10. A method for driving a semiconductor memory device according to claim 7, wherein the plurality of memory cells are arranged in a matrix, the capacitor in each memory cell includes a pair of electrodes and a ferroelectric film provided therebetween, and stores the data in a nonvolatile manner, one of the electrodes being connected to the corresponding bit line via the first switching means, and the node comprising the capacitance means is a common data line for carrying the data signal, and wherein in the step of precharging the bit line, the first potential level is the same as a potential level of the other electrode of the capacitor, in the step of changing the electric potential of the selected bit line, the potential level of the one electrode of the capacitor of the selected memory cell is changed to a third potential level between the first and second potential levels, and in the step of reading the data signal, the data signal corresponding to the data stored in the ferroelectric film of the capacitor is read onto the selected bit line and the common data line.

11. A method for driving a semiconductor memory device according to claim 10, comprising a step of allowing the common data line and the precharged bit lines to be in a floating state, prior to the read operation.

12. A method for driving a semiconductor memory device according to claim 10, wherein in the step of precharging the bit lines, all of the bit lines included in the memory block are precharged at the same time.

13. A method for driving a semiconductor memory device according to claim 10, wherein the step of turning on the second switching means is performed based on the column-address.

14. A method for driving a semiconductor memory device according to claim 10, wherein in the step of precharging the common data line, the second potential level is set so that a difference between the first and third potential levels is greater than a polarization inversion voltage of the ferroelectric film of the capacitor, the third potential level being obtained by charge-sharing between the one electrode of the capacitor of the selected memory cell, the selected bit line, and the common data line.

15. A method for driving a semiconductor memory device according to claim 10, further comprising a step of amplifying a signal level of the data which is read onto the common data line.

16. A method for driving a semiconductor memory device according to claim 15, further comprising the steps of supplying a write signal corresponding to the read data to the common data line at the same time as or after performing the step of amplifying the signal level, a high level of the write signal for a data "1" being a fourth potential level, and storing electric charge corresponding to the write signal in the capacitor of the selected memory cell.

17. A method for driving a semiconductor memory device according to claim 10, wherein in the step of turning on the first switching means, a signal of a predetermined potential level is applied to the first switching means via the selected word line, the predetermined potential level being higher than a fourth potential level by at least a threshold voltage of the first switching means, the fourth potential level being a high level of the write signal for a data "1".

18. A method for driving a semiconductor memory device according to claim 10, wherein in the step of turning on the second switching means, a signal of a predetermined potential level is applied to the second switching means via the selected bit line, the predetermined potential level being higher than a fourth potential level by at least a threshold voltage of the second switching means, the fourth potential level being a high level of the write signal for a data "1".

19. A method for driving a semiconductor memory device according to claim 16, wherein the fourth potential level is set at a source supply voltage level, and the first potential level is set at a half of the source supply voltage level.

20. A method for driving a semiconductor memory device according to claim 16, wherein the fourth potential level is set higher than a source supply voltage level, and the first potential level is set at a half of the fourth potential level.

21. A method for driving a semiconductor memory device including:

at least one memory block comprising: a plurality of word lines; a plurality of bit lines; and a plurality of memory cells which are disposed at crossings of the word lines and the bit lines, each memory cell including first switching means and a capacitor which is connected to the bit line via the first switching means, the first switching means being turned on and off in accordance with a signal level supplied from the corresponding word line, and data being written to and read from the capacitor by a voltage signal supplied from the bit line, the memory block being divided into a plurality of sub-matrices each including a predetermined number of the bit lines;

a first node provided for at least one sub-matrix of the at least one memory block, comprising first capacitance means having a first predetermined capacitance;

second switching means for selectively connecting the predetermined number of the bit lines included in each sub-matrix to the corresponding the first node;

a second node provided for the whole of the at least one memory block, comprising second capacitance means having a second predetermined capacitance; and third switching means for selectively connecting the first node to the second node, the method including the steps of:

precharging the bit lines to a first potential level;

precharging the first capacitance means to a second potential level which is different from the first potential level;

precharging the second capacitance means to a predetermined potential level;

turning on the first switching means connected to the word line which is selected in a read operation, whereby electrically connecting the capacitor of the corresponding memory cell to the corresponding bit line;

turning on the second switching means whereby electrically connecting the selected bit line to the first node comprising the precharged first capacitance means;

changing the electric potential of the selected bit line whereby applying a predetermined voltage signal to the capacitor of the selected memory cell which is coupled to the selected word line and the selected bit line, as a result of turning on the first and second switching means;

reading a data signal corresponding the data stored in the capacitor of the selected memory cell onto the selected bit line and the first node; and turning on the third switching means whereby transferring the data which is read onto the first node to the second node line.

* * * * *